US008575614B2

(12) United States Patent  (10) Patent No.: US 8,575,614 B2
Makita  (45) Date of Patent: Nov. 5, 2013

(54) DISPLAY DEVICE

(75) Inventor: Naoki Makita, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 780 days.

(21) Appl. No.: 12/530,612

(22) PCT Filed: Feb. 18, 2008

(86) PCT No.: PCT/JP2008/052671
§ 371 (c)(1),
(2), (4) Date: Sep. 9, 2009

(87) PCT Pub. No.: WO2008/132862
PCT Pub. Date: Nov. 6, 2008

(65) Prior Publication Data
US 2010/0065851 A1   Mar. 18, 2010

(30) Foreign Application Priority Data
Apr. 25, 2007  (JP) ................................. 2007-116098

(51) Int. Cl.
*H01L 33/00*  (2010.01)
*H01L 29/04*  (2006.01)
*H01L 21/336*  (2006.01)

(52) U.S. Cl.
USPC .... 257/72; 257/71; 257/E27.13; 257/E27.133

(58) Field of Classification Search
USPC ............ 257/71, 72, 435, 59; 349/44; 438/155
See application file for complete search history.

(56) References Cited

U.S. PATENT DOCUMENTS

| 4,543,133 A * | 9/1985 | Mukai .............................. 117/73 |
| 5,501,989 A | 3/1996 | Takayama et al. |
| 5,705,829 A * | 1/1998 | Miyanaga et al. .............. 257/66 |
| 6,025,217 A | 2/2000 | Kanaya et al. |
| 6,590,229 B1 * | 7/2003 | Yamazaki et al. .............. 257/71 |
| 2002/0115242 A1* | 8/2002 | Joo et al. ....................... 438/149 |
| 2002/0121665 A1* | 9/2002 | Kawasaki et al. ............. 257/347 |
| 2004/0135180 A1* | 7/2004 | Makita .......................... 257/285 |
| 2005/0019990 A1* | 1/2005 | Chang .......................... 438/149 |
| 2005/0023531 A1* | 2/2005 | Shoji et al. ...................... 257/70 |
| 2005/0045881 A1* | 3/2005 | Nakamura et al. .............. 257/59 |

(Continued)

FOREIGN PATENT DOCUMENTS

| JP | 2-224253 A | 9/1990 |
| JP | 6-268185 A | 9/1994 |

(Continued)

*Primary Examiner* — Matthew W Such
*Assistant Examiner* — William Harriston
(74) *Attorney, Agent, or Firm* — Birch, Stewart, Kolasch & Birch, LLP

(57) ABSTRACT

A semiconductor device 100 includes a thin-film transistor 123 and a thin-film diode 124. The thin-film transistor 123 includes a semiconductor layer S1 with a channel region 114, a source region and a drain region 112, a gate electrode 109 that controls the conductivity of the channel region 114, and a gate insulating film 108 arranged between the semiconductor layer and the gate electrode 109. The thin-film diode 124 includes a semiconductor layer S2 with at least an n-type region 113 and a p-type region 117. The respective semiconductor layers S1 and S2 of the thin-film transistor 123 and the thin-film diode 124 are portions of a single crystalline semiconductor layer, obtained by crystallizing the same crystalline semiconductor film, but have been crystallized to mutually different degrees.

4 Claims, 13 Drawing Sheets

(56) References Cited

U.S. PATENT DOCUMENTS

| | | |
|---|---|---|
| 2005/0277236 A1* | 12/2005 | Shimomura et al. .......... 438/166 |
| 2006/0030084 A1* | 2/2006 | Young ........................ 438/149 |
| 2006/0088986 A1* | 4/2006 | Lin et al. .................... 438/482 |
| 2006/0134929 A1* | 6/2006 | Yamazaki et al. ........... 438/795 |
| 2006/0276012 A1* | 12/2006 | Yamazaki et al. ........... 438/486 |
| 2007/0131933 A1* | 6/2007 | Yang et al. .................. 257/64 |
| 2007/0151963 A1* | 7/2007 | Tanaka et al. ............ 219/121.78 |
| 2008/0067519 A1* | 3/2008 | Sakurai et al. ................ 257/72 |
| 2008/0224143 A1* | 9/2008 | Kim et al. .................... 257/59 |
| 2010/0291740 A1* | 11/2010 | Makita ........................ 438/151 |
| 2010/0302223 A1* | 12/2010 | Sakamoto et al. ........... 345/207 |
| 2011/0267562 A1* | 11/2011 | Yashiro ........................ 349/62 |
| 2012/0034766 A1* | 2/2012 | Ohtani et al. ................ 438/486 |
| 2012/0068182 A1* | 3/2012 | Yamanaka et al. ............ 257/59 |
| 2012/0146028 A1* | 6/2012 | Oda et al. ..................... 257/53 |
| 2012/0147286 A1* | 6/2012 | Oda et al. ..................... 349/43 |

FOREIGN PATENT DOCUMENTS

| | | |
|---|---|---|
| JP | 6-275807 A | 9/1994 |
| JP | 6-275808 A | 9/1994 |
| JP | 7-183535 A | 7/1995 |
| JP | 8-64836 A | 3/1996 |
| JP | 8-148430 A | 6/1996 |
| JP | 2004-179330 A | 6/2004 |
| JP | 2005-217050 A | 8/2005 |
| JP | 2005-259780 A | 9/2005 |
| JP | 2006-3857 A | 1/2006 |

* cited by examiner

INPUT CONTROL SIGNAL TO BACKLIGHT CONTROLLER

DISPLAY DEVICE

TECHNICAL FIELD

The present invention relates to a semiconductor device including a thin-film transistor (TFT) and a thin-film diode (TFD) and a method for fabricating such a device.

BACKGROUND ART

Recently, a semiconductor device including a thin-film transistor (TFT) and a thin-film diode (TFD) on the same substrate and electronic devices with such a semiconductor device have been developed. Such a semiconductor device can be fabricated by making the respective semiconductor layers of the TFT and TFD of the same crystalline semiconductor film on the substrate.

The device characteristics of the TFT and TFD on the same substrate are affected most significantly by the degree of crystallinity of the semiconductor layer to be their active regions. To make a crystalline semiconductor layer of quality on a glass substrate, it is most common to crystalline an amorphous semiconductor film by irradiating it with a laser beam. According to another method, the amorphous semiconductor film may be heated and crystallized after a catalyst element that promotes its crystallization has been added thereto. A third method is to crystallize the amorphous semiconductor film by the latter method and then irradiate the resultant crystalline semiconductor film with a laser beam to further increase its degree of crystallinity. As a result, compared to a normal crystalline semiconductor film that has been crystallized just by being irradiated with a laser beam after having gone through a low-temperature heat treatment process for only a short time, a semiconductor film of better quality, of which the crystallographic plane orientations are aligned to a higher degree, can be obtained.

Patent Document No. 1 discloses an image sensor including, on the same substrate, a photosensor section that uses a TFD and a driver that uses a TFT. According to Patent Document No. 1, the respective semiconductor layers of the TFT and TFD are obtained by crystallizing an amorphous semiconductor film that has been deposited on a substrate.

If the TFT and TFD form integral parts of a single semiconductor device on the same substrate in this manner, not just the overall size of the semiconductor device but also the number of required parts can be reduced, thus cutting down the cost significantly. On top of that, products with new functions, which could not be achieved by conventional combinations of parts, can also be provided.

On the other hand, Patent Document No. 2 discloses a technique for using the same semiconductor film of silicon to form a TFT of crystalline silicon (which will be referred to herein as a "crystalline silicon TFT") and a TFD of amorphous silicon (which will be referred to herein as an "amorphous silicon TFD") on the same substrate. Specifically, a catalyst element that promotes the crystallization of amorphous silicon is added to only a portion of the amorphous silicon film on the substrate to be the active region of the TFT. After that, a heat treatment process is carried out, thereby obtaining a silicon film, of which only the portion to be the active region of the TFT has been crystallized but a portion to be the TFD remains amorphous. By using such a silicon film, the crystalline silicon TFT and the amorphous silicon TFD can be fabricated on the same substrate more easily.

Patent Document No. 1: Japanese Patent Application Laid-Open Publication No. 6-275808
Patent Document No. 2: Japanese Patent Application Laid-Open Publication No. 6-275807

DISCLOSURE OF INVENTION

Problems to be Solved by the Invention

If the respective semiconductor layers of the TFT and TFD are obtained by crystallizing the same amorphous semiconductor film as disclosed in Patent Document No. 1, it is difficult to realize the device characteristics required for the TFT and TFD at the same time. That is to say, the TFT and TFD are required to have different device characteristics according to their applications. That is why to realize their respective device characteristics, the degrees of crystallinity of the TFT and TFD need to be controlled independently of each other. According to Patent Document No. 1, the amorphous semiconductor film is crystallized by heating it after a catalyst element has been added thereto. However, if a crystalline semiconductor film obtained by such a method is used, the degrees of crystallinity of the respective semiconductor layers of the TFT and TFD cannot be controlled independently of each other, and therefore, it is difficult to optimize the characteristics of the respective elements.

On the other hand, if only a portion of the same amorphous semiconductor film (i.e., amorphous silicon film) is selectively crystallized as in Patent Document No. 2 to form a TFT of the crystallized portion (as a crystalline silicon TFT) and a TFD of the remaining amorphous portion of the film (as an amorphous silicon TFD), it is certainly possible to improve the characteristics of the crystalline silicon TFT by controlling the crystal growing conditions. But the characteristics of the amorphous silicon TFD cannot be improved sufficiently. This is because if an amorphous silicon TFD is fabricated by the method of Patent Document No. 2, some of the hydrogen atoms originally included in the amorphous silicon film will be lost during the process step of crystallizing the portion of the amorphous silicon film into crystalline silicon. As a result, an amorphous silicon TFD with good electrical characteristics cannot be obtained. Specifically, in an amorphous silicon film as deposited, silicon atoms are tightly bonded with hydrogen atoms, thus leaving no dangling bonds at all. However, during the annealing process to crystallize the amorphous silicon film, their bonds are broken, and some hydrogen atoms are lost, thus turning the amorphous silicon film into an amorphous silicon of poor quality with a lot of dangling bonds. Although some of those dangling bonds will be recombined with hydrogen atoms during the hydrogenation process to be carried out later, the good bonding state of the amorphous silicon film yet to be crystallized can no longer be recovered. Consequently, the device characteristics of the amorphous silicon TFD become inferior to those of the crystalline silicon TFD with the crystalline semiconductor layer. Also, even if an amorphous silicon TFD with good characteristics could be obtained by any chance, its photosensitivity would be certainly higher than that of a crystalline silicon TFD but the amount of forward current flowing through such a device would not be large enough to use it as a kind of photosensor. For instance, in real-time image sensing, while a single picture is being scanned, not only photosensing but also a reset of the TFD potential to get ready for the next scan need to be done. With an amorphous silicon TFD with a low field-effect mobility, however, that reset scanning could not be done in time. That is to say, considering their overall device performances, it must be said that a crystalline silicon TFD that uses a crystalline semiconductor layer is still superior to the amorphous silicon TFD.

It is therefore an object of the present invention to control independently, and optimize, the degrees of crystallinity of respective semiconductor layers of a TFT and TFD that have been formed by crystallizing the same amorphous semiconductor film.

Means for Solving the Problems

A semiconductor device according to the present invention includes a thin-film transistor and a thin-film diode. The thin-film transistor includes a semiconductor layer with a channel region, a source region and a drain region, a gate electrode that controls the conductivity of the channel region, and a gate insulating film arranged between the semiconductor layer and the gate electrode. The thin-film diode includes a semiconductor layer with at least an n-type region and a p-type region. The respective semiconductor layers of the thin-film transistor and the thin-film diode are portions of a single crystalline semiconductor layer, obtained by crystallizing the same amorphous semiconductor film, but have been crystallized to mutually different degrees.

In one preferred embodiment, the semiconductor layer of the thin-film transistor has a different average surface roughness Ra from the semiconductor layer of the thin-film diode.

In another preferred embodiment, the semiconductor layer of the thin-film transistor has a different average crystal defect density from the semiconductor layer of the thin-film diode.

In still another preferred embodiment, the semiconductor layer of the thin-film transistor has a different average crystal grain size from the semiconductor layer of the thin-film diode.

In yet another preferred embodiment, the crystals that form the semiconductor layer of the thin-film transistor have different major crystallographic plane orientations from the ones that form the semiconductor layer of the thin-film diode.

In yet another preferred embodiment, each of the respective semiconductor layers of the thin-film transistor and the thin-film diode includes a catalyst element, which promotes the crystallization of the amorphous semiconductor film, in at least a portion thereof. The semiconductor layer of the thin-film transistor includes the catalyst element at a different concentration from the semiconductor layer of the thin-film diode.

The degree of crystallinity of the semiconductor layer of the thin-film transistor is preferably higher than that of the semiconductor layer of the thin-film diode.

In yet another preferred embodiment, the semiconductor layer of the thin-film transistor has a larger average crystal grain size than the semiconductor layer of the thin-film diode.

In yet another preferred embodiment, the semiconductor layer of the thin-film transistor has a lower average crystal defect density than the semiconductor layer of the thin-film diode.

In yet another preferred embodiment, the semiconductor layer of the thin-film transistor has a greater average surface roughness Ra than the semiconductor layer of the thin-film diode.

In yet another preferred embodiment, the semiconductor layer of the thin-film transistor is comprised mostly of crystals with a <111> zone, while the semiconductor layer of the thin-film diode is comprised mostly of crystals with other crystallographic plane orientations.

In yet another preferred embodiment, the semiconductor layer of the thin-film transistor has a catalyst element, which promotes the crystallization of the amorphous semiconductor film, at a higher concentration than the semiconductor layer of the thin-film diode.

The semiconductor layer of the thin-film diode may include substantially no catalyst element.

In yet another preferred embodiment, the respective semiconductor layers of the thin-film transistor and the thin-film diode are made of Si. When subjected to a Raman microspectroscopy, the semiconductor layer of the thin-film transistor has a higher TO phonon peak intensity of crystalline Si than the semiconductor layer of the thin-film diode.

In yet another preferred embodiment, the respective semiconductor layers of the thin-film transistor and the thin-film diode are crystalline semiconductor layers that have been crystallized or re-crystallized while being irradiated with a laser beam, and an antireflective film against the laser beam is arranged over at least the semiconductor layer of the thin-film transistor.

The antireflective film that is arranged over the semiconductor layer of the thin-film transistor may function as a gate insulating film for the thin-film transistor.

The respective semiconductor layers of the thin-film transistor and the thin-film diode are crystalline semiconductor layers that have been crystallized or re-crystallized while being irradiated with a laser beam, and a heat sink layer is arranged under at least the semiconductor layer of the thin-film diode.

The thin-film diode and the thin-film transistor may have been formed on a light-transmitting substrate. The heat sink layer may be arranged between at least a portion of the semiconductor layer of the thin-film diode and the substrate and may be made of an opaque material.

Another semiconductor device according to the present invention includes a thin-film transistor and a thin-film diode. The thin-film transistor includes a semiconductor layer with a channel region, a source region and a drain region, a gate electrode that controls the conductivity of the channel region, and a gate insulating film arranged between the semiconductor layer and the gate electrode. The thin-film diode includes a semiconductor layer with at least an n-type region, a p-type region and an intrinsic region interposed between the n- and p-type regions. The channel region of the semiconductor layer of the thin-film transistor and the intrinsic region of the semiconductor layer of the thin-film diode are portions of a single crystalline semiconductor layer, obtained by crystallizing the same amorphous semiconductor film, but have been crystallized to mutually different degrees.

In one preferred embodiment, the channel region of the semiconductor layer of the thin-film transistor has a different average surface roughness Ra from the intrinsic region of the semiconductor layer of the thin-film diode.

In another preferred embodiment, the channel region of the semiconductor layer of the thin-film transistor has a different average crystal defect density from the intrinsic region of the semiconductor layer of the thin-film diode.

In still another preferred embodiment, the channel region of the semiconductor layer of the thin-film transistor has a different average crystal grain size from the intrinsic region of the semiconductor layer of the thin-film diode.

In yet another preferred embodiment, the crystals that form the channel region of the semiconductor layer of the thin-film transistor have different major crystallographic plane orientations from the ones that form the intrinsic region of the semiconductor layer of the thin-film diode.

In yet another preferred embodiment, the channel region of the semiconductor layer of the thin-film transistor and the intrinsic region of the semiconductor layer of the thin-film diode include a catalyst element, which promotes the crystallization of the amorphous semiconductor film, in at least a portion thereof at mutually different concentrations.

The channel region of the semiconductor layer of the thin-film transistor preferably has a higher degree of crystallinity than the intrinsic region of the semiconductor layer of the thin-film diode.

In this particular preferred embodiment, the channel region of the semiconductor layer of the thin-film transistor has a larger average crystal grain size than the intrinsic region of the semiconductor layer of the thin-film diode.

In another preferred embodiment, the channel region of the semiconductor layer of the thin-film transistor has a lower average crystal defect density than the intrinsic region of the semiconductor layer of the thin-film diode.

In still another preferred embodiment, the channel region of the semiconductor layer of the thin-film transistor has a greater average surface roughness Ra than the intrinsic region of the semiconductor layer of the thin-film diode.

In yet another preferred embodiment, the channel region of the semiconductor layer of the thin-film transistor is comprised mostly of crystals with a <111> zone, while the intrinsic region of the semiconductor layer of the thin-film diode is comprised mostly of crystals with other crystallographic plane orientations.

In yet another preferred embodiment, the semiconductor layer of the thin-film transistor has a catalyst element that promotes the crystallization of the amorphous semiconductor film, and the channel region of the semiconductor layer of the thin-film transistor includes the catalyst element at a higher concentration than the intrinsic region of the semiconductor layer of the thin-film diode.

The intrinsic region of the semiconductor layer of the thin-film diode may include substantially no catalyst element.

In yet another preferred embodiment, the channel region of the semiconductor layer of the thin-film transistor and the intrinsic region of the semiconductor layer of the thin-film diode include Si. When subjected to a Raman microspectroscopy, the channel region of the semiconductor layer of the thin-film transistor has a higher TO phonon peak intensity of crystalline Si than the intrinsic region of the semiconductor layer of the thin-film diode.

In yet another preferred embodiment, the channel region of the semiconductor layer of the thin-film transistor and the intrinsic region of the semiconductor layer of the thin-film diode are crystalline semiconductor layers that have been crystallized or re-crystallized while being irradiated with a laser beam, and an antireflective film against the laser beam is arranged over at least the channel region of the semiconductor layer of the thin-film transistor.

The antireflective film that is arranged over the channel region of the semiconductor layer of the thin-film transistor may function as a gate insulating film for the thin-film transistor.

In yet another preferred embodiment, the channel region of the semiconductor layer of the thin-film transistor and the intrinsic region of the semiconductor layer of the thin-film diode are crystalline semiconductor layers that have been crystallized or re-crystallized while being irradiated with a laser beam, and a heat sink layer is arranged under at least the intrinsic region of the semiconductor layer of the thin-film diode.

The thin-film diode and the thin-film transistor may have been formed on a light-transmitting substrate. The heat sink layer may be arranged between the intrinsic region of the semiconductor layer of the thin-film diode and the substrate and may be made of an opaque material.

The thin-film transistor may include multiple thin-film transistors including n-channel thin-film transistors and p-channel thin-film transistors.

A method for fabricating a semiconductor device according to the present invention includes the steps of: (a) making a heat sink layer, into which heat generated by irradiation with a laser beam is dissipated, in a portion of a substrate; (b) depositing an amorphous semiconductor film over the substrate and over the heat sink layer; (c) irradiating with a laser beam, and crystallizing, the amorphous semiconductor film, thereby obtaining a crystalline semiconductor film including a first region in which a portion of the amorphous semiconductor film, not located over the heat sink layer, has been crystallized and a second region in which another portion of the amorphous semiconductor film, located over the heat sink layer, has been crystallized; and (d) patterning the crystalline semiconductor film, thereby turning the first region of the crystalline semiconductor film into a first island of semiconductor layer to be the active region of a thin-film transistor and also turning the second region of the crystalline semiconductor film into a second island of semiconductor layer to be the active region of a thin-film diode.

Another method for fabricating a semiconductor device according to the present invention includes the steps of: (a) making a heat sink layer, into which heat generated by irradiation with a laser beam is dissipated, in a portion of a substrate; (b) depositing an amorphous semiconductor film over the substrate and over the heat sink layer; (c1) heating the amorphous semiconductor film after a catalyst element, which promotes its crystallization, has been added thereto, thereby obtaining a semiconductor film that has been crystallized at least partially; (c2) irradiating the at least partially crystallized semiconductor film with a laser beam and further crystallizing or re-crystallizing the semiconductor film, thereby obtaining a crystalline semiconductor film including a first region in which a portion of the at least partially crystallized semiconductor film, not located over the heat sink layer, has been crystallized or re-crystallized and a second region in which another portion of the amorphous semiconductor film, located over the heat sink layer, has been crystallized or re-crystallized; and (d) patterning the crystalline semiconductor film, thereby turning the first region of the crystalline semiconductor film into a first island of semiconductor layer to be the active region of a thin-film transistor and also turning the second region of the crystalline semiconductor film into a second island of semiconductor layer to be the active region of a thin-film diode.

The step (d) may include turning the first region of the crystalline semiconductor film into at least a part of the first island of semiconductor layer to be the channel region of the thin-film transistor and also turning the second region of the crystalline semiconductor film into at least a part of the second island of semiconductor layer to be the intrinsic region of the thin-film diode.

The step (c) or (c2) preferably includes irradiating either the amorphous semiconductor film or the at least partially crystallized semiconductor film with the laser beam at such an irradiation energy density falling within a range in which the first region has a higher degree of crystallinity than the second region.

Alternatively, the step (c) or (c2) may include irradiating either the amorphous semiconductor film or the at least partially crystallized semiconductor film with the laser beam at or less than an irradiation energy density that makes the first region have the highest degree of crystallinity.

The substrate may be a light-transmitting substrate, and the heat sink layer may be made of an opaque material.

The method may include the steps of: (e) providing a substrate on which an amorphous semiconductor film has been deposited; (f) forming an antireflective film against a laser beam on a portion of the amorphous semiconductor film; (g) irradiating with the laser beam, and crystallizing, the amorphous semiconductor film, thereby obtaining a crystalline semiconductor film including a first region, in which a portion of the amorphous semiconductor film covered with the antireflective film has been crystallized, and a second region, in which another portion of the amorphous semiconductor film not covered with the antireflective film has been crystallized; and (h) patterning the crystalline semiconductor film, thereby turning the first region of the crystalline semiconductor film into a first island of semiconductor layer to be the active region of a thin-film transistor and also turning the second region of the crystalline semiconductor film into a second island of semiconductor layer to be the active region of a thin-film diode.

Alternatively, the method may include the steps of: (e) providing a substrate on which an amorphous semiconductor film has been deposited; (f1) heating the amorphous semiconductor film after a catalyst element, which promotes its crystallization, has been added thereto, thereby obtaining a semiconductor film that has been crystallized at least partially; (f2) forming an antireflective film against a laser beam on a portion of the at least partially crystallized semiconductor film; (g1) irradiating the at least partially crystallized semiconductor film with the laser beam and further crystallizing or re-crystallizing the semiconductor film, thereby obtaining a crystalline semiconductor film including a first region in which a portion of the at least partially crystallized semiconductor film, covered with the antireflective film, has been crystallized or re-crystallized and a second region in which another portion of the amorphous semiconductor film, not covered with the antireflective film, has been crystallized or re-crystallized; and (h) patterning the crystalline semiconductor film, thereby turning the first region of the crystalline semiconductor film into a first island of semiconductor layer to be the active region of a thin-film transistor and also turning the second region of the crystalline semiconductor film into a second island of semiconductor layer to be the active region of a thin-film diode.

The step (h) may include turning the first region of the crystalline semiconductor film into at least a part of the first island of semiconductor layer to be the channel region of the thin-film transistor and also turning the second region of the crystalline semiconductor film into at least a part of the second island of semiconductor layer to be the intrinsic region of the thin-film diode.

The step (g) or (g1) preferably includes irradiating either the amorphous semiconductor film or the at least partially crystallized semiconductor film with the laser beam at such an irradiation energy density falling within a range in which the first region has a higher degree of crystallinity than the second region.

Alternatively, the step (g) or (g1) may include irradiating either the amorphous semiconductor film or the at least partially crystallized semiconductor film with the laser beam at or less than an irradiation energy density that makes the first region have the highest degree of crystallinity.

The method may further include the steps of: (i) providing a substrate on which an amorphous semiconductor film has been deposited; (j) patterning the amorphous semiconductor film, thereby forming a first island of semiconductor layer to be the active region of a thin-film transistor and a second island of semiconductor layer to be the active region of a thin-film diode; (k) forming an antireflective film against a laser beam on the first island of semiconductor layer; and (l) irradiating with the laser beam, and crystallizing, the first and second islands of semiconductor layers.

Alternatively, the method may further include the steps of: (i) providing a substrate on which an amorphous semiconductor film has been deposited; (j1) heating the amorphous semiconductor film after a catalyst element, which promotes its crystallization, has been added thereto, thereby obtaining a semiconductor film that has been crystallized at least partially; (j2) patterning the at least partially crystallized semiconductor film, thereby forming a first island of semiconductor layer to be the active region of a thin-film transistor and a second island of semiconductor layer to be the active region of a thin-film diode; (k) forming an antireflective film against a laser beam on the first island of semiconductor layer; and (l1) irradiating with the laser beam, and further crystallizing or re-crystallizing, the first and second islands of semiconductor layers.

The step (k) may include forming the antireflective film against the laser beam on at least a portion of the first island of semiconductor layer to be the channel region of the thin-film transistor.

The step (l) or (l1) may include irradiating the first and second islands of semiconductor layers with the laser beam at such an irradiation energy density falling within a range in which the first island of semiconductor layer covered with the antireflective film has a higher degree of crystallinity than the second island of semiconductor layer.

Alternatively, the step (l) or (l1) may include irradiating the first and second islands of semiconductor layers with the laser beam at or less than an irradiation energy density that makes the first island of semiconductor layer covered with the antireflective film have the highest degree of crystallinity.

The antireflective film may be used as a gate insulating film for the thin-film transistor.

The method may include the steps of: (m) providing a substrate on which an amorphous semiconductor film has been deposited; (n) selectively adding a catalyst element, which promotes crystallization, to a portion of the amorphous semiconductor film; (o) heating the amorphous semiconductor film, to which the catalyst element has been added selectively, thereby crystallizing that portion of the amorphous semiconductor film, to which the catalyst element has been added, to define a crystallized region, while leaving the rest of the amorphous semiconductor film, to which no catalyst element has been added, an amorphous region; (p) irradiating the crystallized region and the amorphous region with the laser beam, thereby obtaining a crystalline semiconductor film including a first region in which the crystallized region has been further crystallized or re-crystallized and a second region in which the amorphous region has been crystallized; and (q) turning the first region of the crystalline semiconductor film into a first island of semiconductor layer to be the active region of a thin-film transistor and also turning the second region of the crystalline semiconductor film into a second island of semiconductor layer to be the active region of a thin-film diode.

The step (e), (i) or (m) may include the steps of: making a heat sink layer, into which heat generated by irradiation with a laser beam is dissipated, in a portion of a substrate; and depositing an amorphous semiconductor film over the substrate and over the heat sink layer. The substrate may be a light-transmitting substrate, and the heat sink layer may be made of an opaque material.

The step (c1), (f1), (j1) or (n) may include the steps of: making a mask with an opening on the amorphous semiconductor film; and adding the catalyst element to a selected region of the amorphous semiconductor film through the opening.

The method may include the steps of: (r) depositing a gate insulating film over at least the first island of semiconductor layer; (s) forming a gate electrode on the gate insulating film on the first island of semiconductor layer; (t) doping portions of the first island of semiconductor layer to be source and drain regions with a dopant element; (u) doping a portion of the second island of semiconductor layer to be an n-type region with an n-type dopant element; and (v) doping another portion of the second island of semiconductor layer to be a p-type region with a p-type dopant element.

In this particular preferred embodiment, the step (t) preferably includes doping the portions of the first island of semiconductor layer to be the source and drain regions with an n-type dopant element, and the steps (t) and (u) are preferably performed simultaneously.

In an alternative preferred embodiment, the step (t) includes doping the portions of the first island of semiconductor layer to be the source and drain regions with a p-type dopant element, and the steps (t) and (v) are performed simultaneously.

In another preferred embodiment, the first island of semiconductor layer is islands of semiconductor regions including an island to be the active region of an n-channel thin-film transistor and an island to be the active region of a p-channel thin-film transistor. The step (t) includes the steps of: (t1) doping the island to be the n-channel thin-film transistor, which is one of the islands of semiconductor regions in the first island of semiconductor layer, with an n-type dopant element; and (t2) doping the island to be the p-channel thin-film transistor, which is another one of the islands of semiconductor regions in the first island of semiconductor layer, with a p-type dopant element. The steps (t1) and (u) are performed simultaneously, and the steps (t2) and (v) are performed simultaneously.

The steps (u) and (v) are preferably performed so that a region doped with no dopant elements is left between respective portions of the second island of semiconductor layer to be n- and p-type regions, and the region doped with no dopant elements preferably functions as an intrinsic region for a thin-film diode.

Another semiconductor device according to the present invention is fabricated by any of the methods of the present invention described above.

An electronic device according to the present invention is fabricated by one of the methods of the present invention described above, and includes one of the semiconductor devices of the present invention described above and a display section.

Another electronic device according to the present invention may include one of the semiconductor devices of the present invention described above and a photosensor section.

Still another electronic device according to the present invention may include one of the semiconductor devices of the present invention described above, a display section, and a photosensor section.

The display section may include the thin-film transistor and the photosensor section may include the thin-film diode.

The photosensor section may be an ambient sensor for adjusting the luminance of the display section. Alternatively, the photosensor section may also be a touchscreen panel sensor for the display section.

A display device according to the present invention includes: a display area with a number of display sections; and a frame area surrounding the display area. The display device further includes at least one photosensor section with a thin-film diode. Each said display section includes an electrode and a thin-film transistor connected to the electrode. The thin-film transistor and the thin-film diode are arranged on the same light-transmitting substrate. The thin-film transistor includes: a semiconductor layer with a channel region, a source region and a drain region; a gate electrode that controls the conductivity of the channel region; and a gate insulating film arranged between the semiconductor layer and the gate electrode. The thin-film diode includes a semiconductor layer with an n-type region, a p-type region and an intrinsic region interposed between the n- and p-type regions. The respective semiconductor layers of the thin-film transistor and the thin-film diode are portions of a single crystalline semiconductor layer that has been crystallized or re-crystallized by irradiating the same amorphous semiconductor film with a laser beam. The channel region of the semiconductor layer of the thin-film transistor and the intrinsic region of the semiconductor layer of the thin-film diode have been crystallized to mutually different degrees. The channel region of the semiconductor layer of the thin-film transistor has a greater average surface roughness Ra than the intrinsic region of the semiconductor layer of the thin-film diode. The thin-film diode further includes a heat sink layer that is located between the semiconductor layer of the thin-film diode and the substrate, made of an opaque material, and arranged so as to overlap with at least the intrinsic region of the semiconductor layer of the thin-film diode when viewed from under the back surface of the substrate.

In one preferred embodiment, the display device may further include a backlight.

In this particular preferred embodiment, the at least one photosensor section includes a number of photosensor sections, each of which is arranged in the display area with respect to either its associated display section or its associated set of at least two of the display sections.

In another preferred embodiment, the backlight includes a backlight controller that adjusts the intensity of the light emitted from the backlight, and the photosensor section is arranged in the frame area and generates an illumination signal representing the illumination of external light and outputs the signal to the backlight controller.

Effects of the Invention

According to the present invention, in a semiconductor device including a TFT and a TFD on the same substrate, the degrees of crystallinity of the respective semiconductor layers of the TFT and the TFD are controlled independently of each other and optimized such that their required device performances are satisfied. As a result, a semiconductor device including a TFT and a TFD with good performances can be provided.

The present invention is applicable effectively to a liquid crystal display device with a sensor function. For example, it will be beneficial if the present invention is used in a liquid crystal display device including a TFT for use in a driver, a TFT for switching a pixel electrode, and a TFD for use as a photosensor. This is because a TFT with a high field effect mobility and a high ON/OFF ratio and a TFD with a high sensitivity to external light and a high SNR to light (i.e., the ratio of current values in bright and dark states) can be made of the same amorphous semiconductor film. Among other things, by optimizing the degrees of crystallinity in the channel region that has a decisive influence on the field-effect mobility of a TFT and in the intrinsic region that has a major impact on the photosensitivity of the TFD, the respective semiconductor elements can have their characteristics optimized.

In addition, according to the present invention, a high-performance semiconductor device including a TFT and a TFD on the same substrate can be fabricated without increasing the number of process steps or the cost of the manufacturing process. As a result, the performance of the product can be improved with its size and cost cut down.

Figure 1:
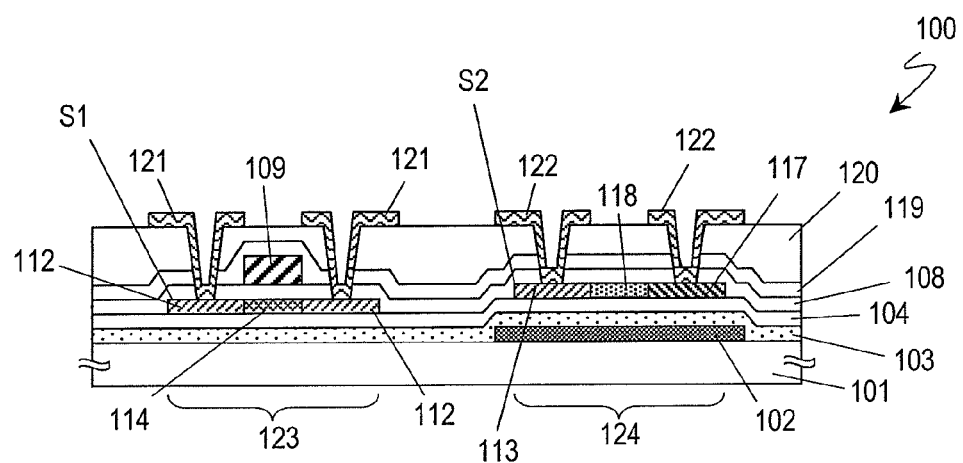
FIG. 1 is a schematic cross-sectional view illustrating a semiconductor device as a first preferred embodiment of the present invention.
Figure 2:
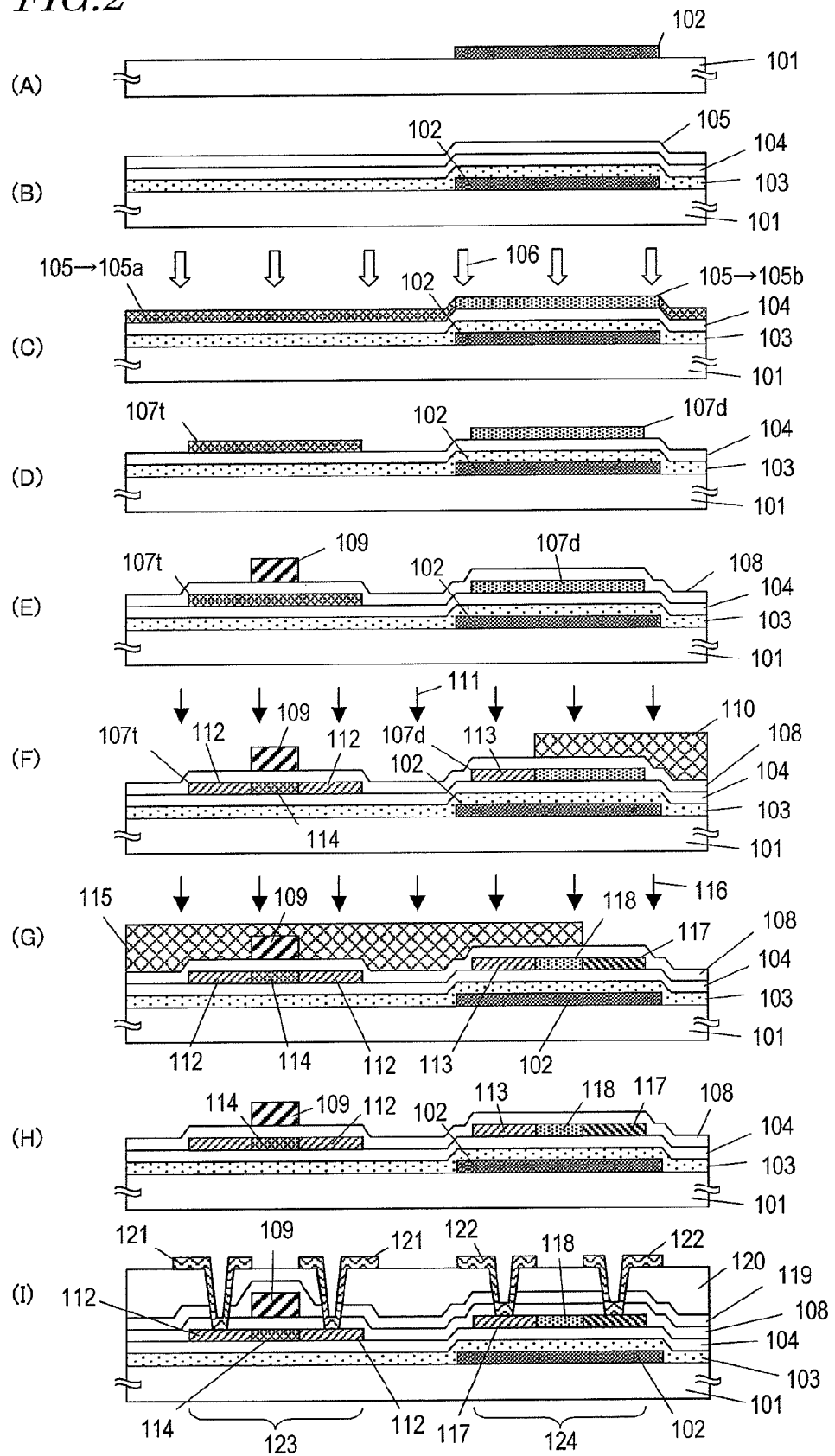
FIGS. 2(A) through 2(I) are schematic cross-sectional views illustrating respective manufacturing process steps to fabricate the semiconductor device as the first preferred embodiment of the present invention.

DESCRIPTION OF REFERENCE NUMERALS 100 semiconductor device
S1, S2 semiconductor layer
101 substrate
102 heat sink layer
103, 104 undercoat film
105 amorphous silicon film
105a, 105b crystalline silicon region
107t, 107d island of semiconductor layer
108 gate insulating film
109 gate electrode
110, 115 mask
111 phosphorus
112 source/drain regions
113 $n^+$ region
114 channel region
116 boron
117 $p^+$ region
118 intrinsic region
119 silicon nitride film
120 silicon dioxide film
121 electrode and interconnects of thin-film transistor
122 electrodes and interconnects of thin-film diode
123 thin-film transistor
124 thin-film diode

BEST MODE FOR CARRYING OUT THE INVENTION

Hereinafter, preferred embodiments of a semiconductor device and a method for fabricating the device according to the present invention will be described.

A semiconductor device as a preferred embodiment of the present invention includes a thin-film transistor and a thin-film diode. The thin-film transistor includes a semiconductor layer with a channel region, a source region and a drain region, a gate insulating film arranged on the semiconductor layer, and a gate electrode that controls the conductivity of the channel region. The thin-film diode includes a semiconductor layer with at least an n-type region and a p-type region. The respective semiconductor layers of the thin-film transistor and the thin-film diode are portions of a single crystalline semiconductor layer, obtained by crystallizing the same amorphous semiconductor film, but have been crystallized to mutually different degrees. The degree of crystallinity of the semiconductor layer of the thin-film transistor is preferably higher than that of the semiconductor layer of the thin-film diode.

A semiconductor device as another preferred embodiment of the present invention includes a thin-film transistor and a thin-film diode. The thin-film transistor includes a semiconductor layer with a channel region, a source region and a drain region, a gate insulating film arranged on semiconductor layer, and a gate electrode that controls the conductivity of the channel region. The thin-film diode includes a semiconductor layer with an n-type region, a p-type region and an intrinsic (i-type) region interposed between the n- and p-type regions. The channel region of the semiconductor layer of the thin-film transistor and the intrinsic region of the semiconductor layer of the thin-film diode are portions of a single crystalline semiconductor layer, obtained by crystallizing the same amorphous semiconductor film, but have been crystallized to mutually different degrees. The degree of crystallinity of the channel region of the semiconductor layer of the thin-film transistor is preferably higher than that of the intrinsic region of the semiconductor layer of the thin-film diode.

In the semiconductor device of these preferred embodiments, the TFT and TFD can have their best degrees of crystallinity, and therefore, exhibit good device characteristics. In addition, since a crystalline semiconductor layer, obtained by crystallizing the same amorphous semiconductor film, is used, such a semiconductor device including the TFT and TFD on the same substrate cab be obtained. Consequently, as a TFT for use in a driver and a TFT for switching a pixel electrode, TFTs with a high field effect mobility and a high ON/OFF ratio can be formed. At the same time, as a TFD for use as a photosensor, a TFD with a high sensitivity to external light and a high SNR to light (i.e., the ratio of current values in bright and dark states) can be formed. Although it is possible to control the degrees of crystallinity of the entire semiconductor layers of the TFT and TFD, the channel region of the semiconductor layer, which has a decisive influence on the field effect mobility of the TFT, and the intrinsic region of the semiconductor layer, which has a major impact on the photosensitivity of the TFD, preferably have their degrees of crystallinity controlled. Then, the device characteristics of these semiconductor elements can be optimized independently of each other.

As used herein, "to have different degrees of crystallinity" means that at least one of the parameters representing the degree of crystallinity, including average crystal grain size, average crystal defect density, and degree of surface unevenness (such as the average surface roughness Ra), is different. It should be noted that the average surface roughness Ra is defined herein as the arithmetic average roughness Ra compliant with the JIS B0601-1994 standard.

For example, the average crystal grain sizes may be different either between the respective semiconductor layers of the thin-film transistor and thin-film diode or between the channel region of the semiconductor layer of the thin-film transistor and the intrinsic region of the semiconductor layer of the thin-film diode. In other words, either the respective semiconductor layers of the TFT and TFD or the channel region of the TFT and intrinsic region of the TFD can have their degrees of crystallinity optimized independently of each other by adjusting their average crystal grain sizes. The average crystal grain size of the semiconductor layer of the thin-film transistor is preferably greater than that of the semiconductor layer of the thin-film diode. Or the average crystal grain size of the channel region of the semiconductor layer of the thin-film transistor is preferably greater than that of the intrinsic region of the semiconductor layer of the thin-film diode. Then, the TFT will achieve a high field-effect mobility and a good switching characteristic, while the TFD will achieve a high photosensitivity. As a result, the device characteristics of the TFT and TFD can be optimized at the same time by using the same amorphous semiconductor film.

Alternatively, the average crystal defect densities may also be different either between the respective semiconductor layers of the thin-film transistor and thin-film diode or between the channel region of the semiconductor layer of the thin-film transistor and the intrinsic region of the semiconductor layer of the thin-film diode. In other words, either the respective semiconductor layers of the TFT and TFD or the channel region of the TFT and intrinsic region of the TFD can have their degrees of crystallinity optimized independently of each other by adjusting their average crystal defect densities. The average crystal defect density of the semiconductor layer of the thin-film transistor is preferably lower than that of the semiconductor layer of the thin-film diode. Or the average crystal defect density of the channel region of the semiconductor layer of the thin-film transistor is preferably lower than that of the intrinsic region of the semiconductor layer of the thin-film diode. Then, the TFT will achieve a high field-effect mobility and a good switching characteristic, while the TFD will achieve a high photosensitivity. As a result, the device characteristics of the TFT and TFD can be optimized at the same time by using the same amorphous semiconductor film.

Still alternatively, the degrees of surface unevenness may also be different either between the respective semiconductor layers of the thin-film transistor and thin-film diode or between the channel region of the semiconductor layer of the thin-film transistor and the intrinsic region of the semiconductor layer of the thin-film diode.

In a semiconductor film that has been either crystallized or re-crystallized by being irradiated with a laser beam, crystal growing advances through a melting and solidification process. That is why as a result of the increase in volume while the semiconductor film is changing from the liquid phase into the solid phase, its grain boundary portions get raised to produce raised portions. And those raised portions eventually get linked together along the grain boundary just like a range of mountains. Such a raised portion will be referred to herein as a "ridge". The size of such a ridge can be a parameter representing the level of crystallization achieved by the melting and solidification process through the irradiation with the laser beam. More specifically, the greater the size of a ridge formed in a predetermined area of the semiconductor layer (or the greater the degree of surface unevenness on a macroscopic scale), the higher the degree of crystallinity of that area.

That is why either the respective semiconductor layers of the TFT and TFD or the channel region of the TFT and intrinsic region of the TFD can have their degrees of crystallinity optimized independently of each other by adjusting their degrees of surface unevenness. The degree of surface unevenness (e.g., the average surface roughness Ra) of the semiconductor layer of the thin-film transistor is preferably greater than that of the semiconductor layer of the thin-film diode. Or the degree of surface unevenness of the channel region of the semiconductor layer of the thin-film transistor is preferably greater than that of the intrinsic region of the semiconductor layer of the thin-film diode. Then, the TFT will achieve a high field-effect mobility and a good switching characteristic, while the TFD will achieve a high photosensitivity. As a result, the device characteristics of the TFT and TFD can be optimized at the same time by using the same amorphous semiconductor film.

Still alternatively, the major crystallographic plane orientations of crystals may also be different either between the respective semiconductor layers of the thin-film transistor and thin-film diode or between the channel region of the semiconductor layer of the thin-film transistor and the intrinsic region of the semiconductor layer of the thin-film diode. In other words, either the respective semiconductor layers of the TFT and TFD or the channel region of the TFT and intrinsic region of the TFD can have their degrees of crystallinity optimized independently of each other by adjusting their major crystallographic plane orientations. The semiconductor layer of the thin-film transistor is preferably comprised mostly of crystals with a <111> zone, while the semiconductor layer of the thin-film diode is preferably comprised mostly of crystals with other crystallographic plane orientations. Or the channel region of the semiconductor layer of the thin-film transistor is preferably comprised mostly of crystals with a <111> zone, while the intrinsic region of the semiconductor layer of the thin-film diode is preferably comprised mostly of crystals with other crystallographic plane orientations.

Still alternatively, the concentration of a catalyst element that promotes the crystallization of an amorphous semiconductor film (which will be simply referred to herein as a "catalyst element") may also be different either between the respective semiconductor layers of the thin-film transistor and thin-film diode or between the channel region of the semiconductor layer of the thin-film transistor and the intrinsic region of the semiconductor layer of the thin-film diode.

If an amorphous semiconductor film is heated and crystallized after a metallic element that promotes its crystallization has been added thereto, a crystalline semiconductor film of better quality, in which the orientations of crystals are aligned more perfectly than a normal crystalline semiconductor film that has been crystallized only by irradiation with a laser beam, can be obtained. In this case, by either adding a catalyst element to a portion of the amorphous semiconductor film or locally increasing the concentration of the catalyst element, the amorphous semiconductor film can be split into crystalline regions with highly aligned crystallographic plane orientations and other crystalline regions. Then, at least part of the catalyst element that has been used for crystallization remains in a portion of the crystalline semiconductor film, to which that catalyst element has been added. That is why the higher the concentration of the catalyst element, the higher the degree of alignment of the crystals.

By varying the concentration of the catalyst element added to the amorphous semiconductor film in this manner, either the respective semiconductor layers of the TFT and TFD or the channel region of the TFT and the intrinsic region of the TFD can have their degrees of crystallinity optimized.

The semiconductor layer of the thin-film transistor preferably has the catalyst element at a higher concentration than that of the thin-film diode. Or the channel region of the semiconductor layer of the thin-film transistor preferably has the catalyst element at a higher concentration than the intrinsic region of the semiconductor layer of the thin-film diode. Then the TFT will achieve a high field-effect mobility and a good switching characteristic, while the TFD will achieve a high photosensitivity. As a result, the device characteristics of the TFT and TFD can be optimized at the same time by using a semiconductor layer obtained by crystallizing the same amorphous semiconductor film. More preferably, the semiconductor layer of the thin-film transistor does include the catalyst element but that of the thin-film diode includes substantially no catalyst elements. Or the channel region of the semiconductor layer of the thin-film transistor does include the catalyst element but the intrinsic region of the semiconductor layer of the thin-film diode includes substantially no catalyst elements. Then, only the semiconductor layer of the TFT can be a semiconductor film that has been heated and crystallized with the catalyst element added, while the semiconductor layer of the TFD may be a semiconductor film that has been crystallized by a conventional crystal growing method with no catalyst elements added. Or at least the channel region of the semiconductor layer of the TFT can be a semiconductor film that has been heated and crystallized with the catalyst element added, while at least the intrinsic region of the semiconductor layer of the TFD may be a semiconductor film that has been crystallized by a conventional crystal growing method with no catalyst elements added. As a result, the device characteristics of the TFT and TFD can be optimized more perfectly.

The catalyst element(s) for use to produce the crystallization may be one or multiple elements that is/are selected from the group consisting of Ni, Co, Sn, Pb, Pd, Fe and Cu. Even by adding a very small amount of at least one of these elements, the crystallization of the amorphous semiconductor film is promoted effectively. Among other things, most significant effects will be achieved with the addition of Ni.

Also, the crystalline semiconductor film obtained by heating and crystallizing the amorphous semiconductor film after such a metallic element that promotes its crystallization has been added thereto is comprised mostly of crystals with a <111> zone. More specifically, among the <111> zone, (110) and (211) crystallographic planes account for 50% or more of all crystallographic planes of the crystals that form the crystalline semiconductor film. In general, if a crystal growing process is carried out without using a catalyst element, the resultant crystalline semiconductor film tends to have (111) crystallographic plane orientations due to the influence of an undercoat semiconductor film (especially when the undercoat semiconductor film is made of amorphous silicon dioxide). Among the <111> zone, the (110) and (211) crystal planes cause a much higher hole mobility than the other planes, and therefore, can improve the performance of a p-channel TFT, which is usually inferior to that of the n-channel TFT, and will contribute to striking an adequate balance in a semiconductor circuit that uses TFTs.

By changing the major crystallographic plane orientations of crystals in this manner, either the respective semiconductor layers of the TFT and TFD or the channel region of the TFT and the intrinsic region of the TFD can have their degrees of crystallinity optimized independently of each other. Specifically, if the semiconductor layer of the TFT is comprised mostly of crystals with a <111> zone while the semiconductor layer of the TFD is comprised mostly of crystals with other crystallographic plane orientations (or if the channel region of the semiconductor layer of the TFT is comprised mostly of crystals with a <111> zone while the intrinsic region of the semiconductor layer of the TFD is comprised mostly of crystals with other crystallographic plane orientations), the TFT will achieve a high field-effect mobility and a good switching characteristic, while the TFD will achieve a high photosensitivity. As a result, the device characteristics of the TFT and TFD can be optimized at the same time by using a semiconductor layer obtained by crystallizing the same amorphous semiconductor film.

Also, to achieve such degrees of crystallinity, the respective semiconductor layers of the thin-film transistor and the thin-film diode are preferably made of Si, and when subjected to a Raman microspectroscopy, the semiconductor layer of the thin-film transistor preferably has a higher TO phonon peak intensity of crystalline Si than the semiconductor layer of the thin-film diode. Or the channel region of the semiconductor layer of the thin-film transistor and the intrinsic region of the semiconductor layer of the thin-film diode are preferably made of Si, and when subjected to a Raman microspectroscopy, the channel region of the semiconductor layer of the thin-film transistor preferably has a higher TO phonon peak intensity of crystalline Si than the intrinsic region of the semiconductor layer of the thin-film diode.

That is to say, the degree of crystallinity may be evaluated by a laser Raman microspectroscopy using an Ar laser diode, for example, as a laser light source. In that case, the spatial resolution can be reduced to approximately 1 µm φ and the channel region of the TFT and the intrinsic region of the TFD that have been obtained actually can be compared and evaluated. As the index of evaluation, it is most preferred that the TO phonon peak intensity ratio of crystalline Si be used. However, its half width or Raman shift wave number may also be used. In this manner, if either the respective semiconductor layers of the TFT and TFD or the channel region of the TFT and the intrinsic region of the TFD have their degrees of crystallinity optimized independently of each other, the TFT will achieve a high field-effect mobility and a good switching characteristic, while the TFD will achieve a high photosensitivity. As a result, the device characteristics of the TFT and TFD can be optimized at the same time by using a semiconductor layer obtained by crystallizing the same amorphous semiconductor film.

Also, the respective semiconductor layers of the thin-film transistor and the thin-film diode are preferably crystalline semiconductor layers that have been either crystallized or re-crystallized by being irradiated with a laser beam, and an antireflective film against a laser beam is preferably arranged over at least the semiconductor layer of the thin-film transistor. In that case, the antireflective film arranged over the semiconductor layer of the thin-film transistor may function as a gate insulating film for the thin-film transistor. Alternatively, the channel region of the semiconductor layer of the thin-film transistor and the intrinsic region of the semiconductor layer of the thin-film diode are preferably crystalline semiconductor layers that have been either crystallized or re-crystallized by being irradiated with a laser beam, and an antireflective film against a laser beam is preferably arranged over at least the channel region of the semiconductor layer of the thin-film transistor. In that case, the antireflective film arranged over the channel region of the semiconductor layer of the thin-film transistor may function as a gate insulating film for the thin-film transistor.

In a situation where a semiconductor film is irradiated with a laser beam to get crystallized or re-crystallized, if a film that functions as an antireflective film against that laser beam is provided, the effective laser energy applied to the semiconductor film can be increased compared to a region with no antireflective films. That is to say, by selectively arranging such an antireflective film only in a region that should have its degree of crystallinity increased and by crystallizing or re-crystallizing that region by irradiating it with a laser beam, a region with a high degree of crystallinity and a region with a low degree of crystallinity can be defined separately within a single semiconductor film obtained by crystallizing the same amorphous semiconductor film. As such an antireflective film, either a silicon dioxide film or a silicon nitride film may be used. With the silicon dioxide film, if the film has a thickness of approximately 20-80 nm, that film will achieve significant effects as an antireflective film. Also, by using that antireflective film itself as a gate insulating film for the TFT, the manufacturing process can be simplified and the interface property between the channel and the gate insulating film can be improved. For that reason, if either the respective semiconductor layers of the TFT and TFD or the channel region of the TFT and the intrinsic region of the TFD have their degrees of crystallinity optimized independently of each other in this manner by adopting such a configuration, the TFT will achieve a high field-effect mobility and a good switching characteristic, while the TFD will achieve a high photosensitivity. As a result, the device characteristics of the TFT and TFD can be optimized at the same time by using a semiconductor layer obtained by crystallizing the same amorphous semiconductor film.

Also, the respective semiconductor layers of the thin-film transistor and the thin-film diode are preferably crystalline semiconductor layers that have been crystallized or re-crystallized while being irradiated with a laser beam, and a heat sink layer for use during the laser irradiation process is preferably arranged under at least the semiconductor layer of the thin-film diode. In this case, the heat sink layer arranged under the semiconductor layer of the thin-film diode is preferably made of an opaque material and preferably arranged so as to cover the semiconductor layer of the TFD at least partially as viewed from under the back surface of the substrate. More preferably, the heat sink layer is arranged so as to cover the semiconductor layer of the TFD entirely. Then, the heat sink layer can function as a shielding layer for cutting off the light coming from under the back surface of the substrate. Alternatively, the channel region of the semiconductor layer of the thin-film transistor and the intrinsic region of the semiconductor layer of the thin-film diode are preferably crystalline semiconductor layers that have been crystallized or re-crystallized while being irradiated with a laser beam, and a heat sink layer for use during the laser irradiation process is preferably arranged under at least the intrinsic region of the semiconductor layer of the thin-film diode. In this case, the heat sink layer arranged under the intrinsic region of the semiconductor layer of the thin-film diode is also preferably made of an opaque material and preferably arranged so as to cover at least the intrinsic region of the semiconductor layer of the TFD as viewed from under the back surface of the substrate. Then, the heat sink layer can function as a shielding layer for cutting off the light coming from under the back surface of the substrate.

While being crystallized or re-crystallized by being irradiated with a laser beam, a semiconductor film is melted either entirely or partially by the laser beam and its latent heat escapes toward the substrate. As a result, the semiconductor film begins to solidify and crystallize from the lower surface of crystals. In this case, the quantity of that latent heat escaping, and the degree of crystallinity achieved eventually, will vary significantly according to the structure of the lower portion of the semiconductor layer. Specifically, the smaller the quantity of latent heat escaping, the more slowly the solidification process, and the higher the degree of crystallinity, of the resultant crystalline semiconductor film will be. On the other hand, if a significant quantity of latent heat escapes, then the semiconductor film will solidify at a higher rate to be a crystalline semiconductor film with a low degree crystallinity, which has finer crystal grains and a lot of crystal defects. That is to say, by controlling the downward escape of that heat from the semiconductor film during the laser irradiation process, the degrees of crystallinity can be changed. Specifically, by irradiating a semiconductor film with a laser beam with a heat sink layer, having high heat capacity and high thermal conductivity, provided selectively under the semiconductor film, a region of the semiconductor film over the heat sink layer would have a lower degree of crystallinity than another region of the semiconductor film without the heat sink layer. That is why if either the respective semiconductor layers of the TFT and TFD or the channel region of the TFT and the intrinsic region of the TFD have their degrees of crystallinity optimized independently of each other by adopting such a configuration, the TFT will achieve a high field-effect mobility and a good switching characteristic, while the TFD will achieve a high photosensitivity. As a result, the device characteristics of the TFT and TFD can be optimized at the same time by using a semiconductor layer obtained by crystallizing the same amorphous semiconductor film.

Also, when the TFD is used as a photosensor, a semiconductor layer to be an active layer needs to be respond to only external light. For a transmission type liquid crystal display device, on the other hand, a backlight should be provided, and therefore, a shielding layer needs to be arranged so as to face the backlight and to avoid sensing the light coming from the backlight. A backlight is normally arranged under the back surface of an active-matrix substrate, and therefore, a shielding layer should be arranged under the semiconductor layer to be the active region of the TFD. According to the present invention, the heat sink layer may be used as it is as the shielding layer. As a result, while two different types of semiconductor elements are being fabricated, their manufacturing process can be simplified and the semiconductor device can be completed at a lower cost. The shielding layer needs to cut off light, and therefore, is preferably made of a metallic material. Among other things, it is particularly preferred that the shielding layer be made of a refractory metal so as to withstand the heat treatment to be carried out at a later stage of the manufacturing process.

Also, the thin-film transistor may be either an n-channel thin-film transistor or a p-channel thin-film transistor. Alternatively, the semiconductor device of this preferred embodiment may include a number of thin-film transistors including an n-channel thin-film transistor and a p-channel thin-film transistor. Furthermore, a difference can be made in the degree of crystallinity between the respective semiconductor layers of the TFT and TFD or between the channel region of the TFT and the intrinsic region of the TFD according to the present invention by combining not only a single pair of two different elements but also more than two elements with each other.

This preferred embodiment is effectively applicable for use in a liquid crystal display device with a sensor function or an organic EL display device. If this preferred embodiment is applied to a display device with a sensor function, then the following benefits will be produced.

In the fields of liquid crystal display devices and organic EL display devices, bigger display devices with higher resolutions have been developed lately by arranging a display area with a pixel section and a driver on the same substrate. Also, according to a configuration in which memory circuits and logic circuits such as a clock generator are also integrated on that substrate (which is a so-called "system on panel"), not just can the size and weight of the display device and the manufacturing cost be reduced but also can the reliability of the product be increased as well. In such a display device, TFTs are normally used as switching elements for its pixel section, as well as in its driver and logic circuits. To further improve the performance of such a display device by adding a different feature from the conventional one to it, a display device with a sensor function, in which photosensors are built inside and outside of the display area by arranging both TFTs and TFDs on the same substrate and using the unique device property of the TFDs, which is quite different from that of the TFTs, could be used.

To make such a display device with a sensor function, TFTs for use as switching elements in the pixel section, TFTs that form the driver, and TFDs for use as photosensors are preferably all arranged on the same substrate. If a crystalline semiconductor film is obtained by crystallizing an amorphous semiconductor film by a known crystal growing process and patterned into respective semiconductor layers to form parts of TFTs and TFDs, then those elements can be integrated together on the same substrate. According to the known crystal growing process, however, it is difficult to vary the degree of crystallinity of the crystalline semiconductor film locally, and therefore, the degrees of crystallinity of the respective semiconductor layers of the TFTs and TFDs cannot be optimized according to their required device characteristics.

More specifically, the TFTs for use as switching elements should have a high ON/OFF ratio, while the TFTs for use in the driver and logic circuits should operate at high speeds. This is because to present an image with a high resolution, the amount of information to be written on pixels should be increased and because unless that information is written in a short time, a number of images with a huge amount of information can never be presented one after another as a moving picture to realize a high definition display. To make a TFT with a field effect mobility that is high enough to operate at sufficiently high speeds and with a high ON/OFF ratio, the semiconductor layer that is used as the active region of such a TFT should be a crystalline semiconductor layer with a high degree of crystallinity. On the other hand, when a TFD is used as a photosensor, the semiconductor layer to be its active region should have high sensitivity to external light (i.e., a high SNR to light (or the ratio of current values in bright and dark states). In that case, a crystalline semiconductor layer, of which the degree of crystallinity is lower than that high degree of crystallinity required for the active region of the TFT, is preferably used. To satisfy the respective characteristics that are required for the TFT and TFD at the same time, the degree of crystallinity of the semiconductor layer of the TFT needs to be controlled to be higher than that of the semiconductor layer of the TFD. However, if those elements are fabricated on the same substrate using the same semiconductor film, then it is impossible to control the degrees of crystallinity of their semiconductor layers independently of each other.

On the other hand, according to this preferred embodiment, by crystallizing the same amorphous semiconductor film, an active region with a high degree of crystallinity for a TFT and an active region for a TFD, having a lower degree of crystallinity than the active region for a TFT, can be defined on the same substrate. Consequently, pixel switching TFTs and peripheral drivers' TFTs, each having a high field-effect mobility, and TFDs for use as photosensors, having high sensitivity to external light, can be integrated together. As a result, a display device of a reduced size is provided with its high display performance maintained and with a sophisticated sensor function added.

Patent Document No. 2 cited above discloses how to make a crystalline semiconductor layer and an amorphous semiconductor layer out of the same amorphous semiconductor film. According to that method, however, the process step of crystallizing the amorphous semiconductor film partially will increase the number of dangling bonds in the amorphous semiconductor layer, thus deteriorating the performance of the devices (such as TFDs), which is a problem. On the other hand, according to this preferred embodiment, the degrees of crystallinity of the semiconductor layer can be optimized independently of each other according to the applications of the devices, and therefore, TFTs and TFDs with excellent device performances can be obtained. Also, as described above, in real-time image sensing, while a single picture is being scanned, not only photosensing but also a reset of the TFD potential to get ready for the next scan need to be done. With a TFD that uses an amorphous semiconductor layer with a low field-effect mobility, however, that reset scanning could not be done in time. Meanwhile, according to this preferred embodiment, the TFDs are fabricated using a crystalline semiconductor layer with high mobility, thus realizing a higher device performance than TFDs that use the amorphous semiconductor layer.

A method for fabricating a semiconductor device according to the present invention includes the steps of: making a heat sink layer, into which heat generated by irradiation with a laser beam is dissipated, in a portion of a substrate; depositing an amorphous semiconductor film over the substrate and over the heat sink layer; crystallizing the amorphous semiconductor film by irradiating it with a laser beam; and patterning the crystalline semiconductor film obtained in the previous process step, thereby turning a region of the crystalline semiconductor film, under which there is no heat sink layer, into a first island of semiconductor layer to be the active region of a thin-film transistor and also turning another region of the crystalline semiconductor film, under which there is the heat sink layer, into a second island of semiconductor layer to be the active region of a thin-film diode. Another method for fabricating a semiconductor device according to the present invention includes the steps of: making a heat sink layer, into which heat generated by irradiation with a laser beam is dissipated, in a portion of a substrate; depositing an amorphous semiconductor film over the substrate and over the heat sink layer; heating the amorphous semiconductor film after a catalyst element, which promotes its crystallization, has been added thereto, thereby crystallizing the amorphous semiconductor film at least partially; irradiating the crystalline semiconductor film obtained in the previous process step with a laser beam and further crystallizing or re-crystallizing the semiconductor film; and patterning the crystalline semiconductor film obtained in the previous process step, thereby turning a region of the crystalline semiconductor film, under which there is no heat sink layer, into a first island of semiconductor layer to be the active region of a thin-film transistor and also turning another region of the crystalline semiconductor film, under which there is the heat sink layer, into a second island of semiconductor layer to be the active region of a thin-film diode.

Furthermore, in these methods, the region of the crystalline semiconductor film, under which there is no heat sink layer, is preferably turned into at least a part of the first island of semiconductor layer to be the channel region of the thin-film transistor and the region of the crystalline semiconductor film, under which there is the heat sink layer, is preferably turned into at least a part of the second island of semiconductor layer to be the intrinsic region of the thin-film diode. Also, the step of irradiating the crystalline semiconductor film with a laser beam and further crystallizing or re-crystallizing the semiconductor film preferably includes irradiating either the amorphous semiconductor film or the crystalline semiconductor film with the laser beam at such an irradiation energy density falling within a range in which the region under which there is no heat sink layer has a higher degree of crystallinity than the region under which there is the heat sink layer. In this case, the "higher degree of crystallinity" means having a greater average crystal grain size, a lower defect density, or a relatively high TO phonon peak intensity of crystalline Si in a Raman microspectroscopy. Furthermore, the heat sink layer is preferably used as an opaque layer for cutting off the light that has come from under the back surface of the substrate.

By adopting such a manufacturing process, either the respective semiconductor layers of the TFT and TFD or the channel region of the TFT and the intrinsic region of the TFD can have their degrees of crystallinity optimized independently of each other. As a result, the TFT will achieve a high field-effect mobility and a good switching characteristic, while the TFD will achieve a high photosensitivity. Consequently, the device characteristics of the TFT and TFD can be optimized at the same time by using a semiconductor layer obtained by crystallizing the same amorphous semiconductor film. Also, in a situation where the TFD is used as a photosensor, a transmission type liquid crystal display device needs a backlight but the heat sink layer can be used as it is as an opaque layer that does not sense the light coming from the backlight. Consequently, even though two different types of semiconductor elements are fabricated on the same substrate, the semiconductor device of the present invention can still be fabricated without increasing the number of manufacturing process steps and with the manufacturing cost cut down.

Another method for fabricating a semiconductor device according to the present invention includes the steps of: providing an amorphous semiconductor film; forming an antireflective film against a laser beam on a portion of the amorphous semiconductor film; irradiating with the laser beam, and crystallizing, the amorphous semiconductor film; and patterning the crystalline semiconductor film obtained in the previous process step, thereby turning a region of the crystalline semiconductor film with the antireflective film into a first island of semiconductor layer to be the active region of a thin-film transistor and also turning another region of the crystalline semiconductor film without the antireflective film into a second island of semiconductor layer to be the active region of a thin-film diode. Still another method for fabricating a semiconductor device according to the present invention includes the steps of: providing an amorphous semiconductor film; heating the amorphous semiconductor film after a catalyst element, which promotes its crystallization, has been added thereto, thereby crystallizing the amorphous semiconductor film at least partially; forming an antireflective film against a laser beam on a portion of the crystalline semiconductor film obtained in the previous process step; irradiating the crystalline semiconductor film with the laser beam, thereby further crystallizing or re-crystallizing the semiconductor film; and patterning the crystalline semiconductor film obtained in the previous process step, thereby turning a region of the crystalline semiconductor film with the antireflective film into a first island of semiconductor layer to be the active region of a thin-film transistor and also turning another region of the crystalline semiconductor film without the antireflective film into a second island of semiconductor layer to be the active region of a thin-film diode. Furthermore, the region of the crystalline semiconductor film with the antireflective film is preferably turned into at least a part of the first island of semiconductor layer to be the channel region of the thin-film transistor and the region of the crystalline semiconductor film without the antireflective film is preferably turned into at least a part of the second island of semiconductor layer to be the intrinsic region of the thin-film diode.

By adopting such a manufacturing process, either the respective semiconductor layers of the TFT and TFD or the channel region of the TFT and the intrinsic region of the TFD can have their degrees of crystallinity optimized independently of each other. As a result, the TFT will achieve a high field-effect mobility and a good switching characteristic, while the TFD will achieve a high photosensitivity. Consequently, the device characteristics of the TFT and TFD can be optimized at the same time by using a semiconductor layer obtained by crystallizing the same amorphous semiconductor film.

Still another method for fabricating a semiconductor device according to the present invention includes the steps of: providing an amorphous semiconductor film; patterning the amorphous semiconductor film, thereby forming a first island of semiconductor layer to be the active region of a thin-film transistor and a second island of semiconductor layer to be the active region of a thin-film diode; forming an antireflective film against a laser beam on at least the first island of semiconductor layer; and irradiating with the laser beam, and crystallizing, the first and second islands of semiconductor layers. Yet another method for fabricating a semiconductor device according to the present invention includes the steps of: providing an amorphous semiconductor film; heating the amorphous semiconductor film after a catalyst element, which promotes its crystallization, has been added thereto, thereby crystallizing the amorphous semiconductor film at least partially; patterning the crystalline semiconductor film obtained in the previous process step, thereby forming a first island of semiconductor layer to be the active region of a thin-film transistor and a second island of semiconductor layer to be the active region of a thin-film diode; forming an antireflective film against a laser beam on at least the first island of semiconductor layer; and irradiating with the laser beam, and crystallizing, the first and second islands of semiconductor layers. In these methods, the step of forming an antireflective film against a laser beam on the first island of semiconductor layer preferably includes forming the antireflective film against the laser beam on at least a portion of the first island of semiconductor layer to be the channel region of the thin-film transistor. In that case, the antireflective film is preferably used as a gate insulating film for the thin-film transistor.

By adopting such a manufacturing process, either the respective semiconductor layers of the TFT and TFD or the channel region of the TFT and the intrinsic region of the TFD can have their degrees of crystallinity optimized independently of each other. As a result, the TFT will achieve a high field-effect mobility and a good switching characteristic, while the TFD will achieve a high photosensitivity. Consequently, the device characteristics of the TFT and TFD can be optimized at the same time by using a semiconductor layer obtained by crystallizing the same amorphous semiconductor film. Also, since the antireflective film can be used as it is as a gate insulating film for the TFT, the manufacturing process can be simplified. Consequently, even though two different types of semiconductor elements are fabricated on the same substrate, the semiconductor device of the present invention can still be fabricated without increasing the number of manufacturing process steps and with the manufacturing cost cut down.

Yet another method for fabricating a semiconductor device according to the present invention includes the steps of: providing an amorphous semiconductor film; selectively adding a catalyst element, which promotes crystallization, to a portion of the amorphous semiconductor film and heating the amorphous semiconductor film, thereby defining a first crystallized region in which the portion of the amorphous semiconductor film has been crystallized selectively; irradiating the first crystallized region defined in the previous process step and the other non-crystallized, amorphous region with the laser beam, thereby further crystallizing or re-crystallizing the first crystallized region and also crystallizing the other amorphous region to define a second crystallized region; and patterning the first and second crystallized regions obtained in the previous process step, thereby turning the first crystallized region into a first island of semiconductor layer to be the active region of a thin-film transistor and also turning the second crystallized region into a second island of semiconductor layer to be the active region of a thin-film diode.

By adopting such a manufacturing process, either the respective semiconductor layers of the TFT and TFD or the channel region of the TFT and the intrinsic region of the TFD can have their degrees of crystallinity optimized independently of each other. As a result, the TFT will achieve a high field-effect mobility and a good switching characteristic, while the TFD will achieve a high photosensitivity. Consequently, the device characteristics of the TFT and TFD can be optimized at the same time by using a semiconductor layer obtained by crystallizing the same amorphous semiconductor film.

Each of these methods preferably includes, before the step of providing the amorphous semiconductor film, the step of providing a heat sink layer, into which heat generated by irradiation with the laser beam is dissipated and which will cut off light coming from under the back surface of the substrate in the thin-film diode, under the second island of semiconductor layer.

In that case, not just can significant effects be achieved by providing the antireflective film during the laser crystallization process and by selectively adding the catalyst element but also can the difference in the degree of crystallinity be further widened between either the respective semiconductor layers of the TFT and TFD or between the channel region of the TFT and the intrinsic region of the TFD. As a result, the TFT will achieve a high field-effect mobility and a good switching characteristic and the TFD will achieve a high photosensitivity. Consequently, the device characteristics of the TFT and TFD can be optimized at the same time by using a semiconductor layer obtained by crystallizing the same amorphous semiconductor film. Also, in a situation where the TFD is used as a photosensor, a transmission type liquid crystal display device needs a backlight but the heat sink layer can be used as it is as an opaque layer that does not sense the light coming from the backlight. Consequently, even though two different types of semiconductor elements are fabricated on the same substrate, the semiconductor device of the present invention can still be fabricated without increasing the number of manufacturing process steps and with the manufacturing cost cut down.

In each of these methods, the step of heating, and crystallizing at least partially, the amorphous semiconductor film with a catalyst element, which promotes its crystallization, added thereto includes the steps of: making a mask with an opening on the amorphous semiconductor film; and adding the catalyst element to a selected region of the amorphous semiconductor film through the opening.

In this manner, by selectively doping the amorphous semiconductor film with the catalyst element and by growing crystals laterally from the region to which the catalyst element has been added selectively toward the surrounding regions, a crystalline semiconductor film of quality, in which crystals have grown in almost the same direction, can be obtained, and eventually the current drivability of the TFT can be further increased. On top of that, in such a laterally crystal-grown region, the concentration of the catalyst element in the film after the crystal growth can be reduced by one digit or two compared to the region to which the catalyst element was added directly. As a result, the load on the rest of the manufacturing process and the influence of the device can be both reduced.

Furthermore, in one embodiment of the method of the present invention, after a first semiconductor layer to be the active region of a thin-film transistor and a second semiconductor layer to be the active region of a thin-film diode have been formed, the method includes the steps of depositing a gate insulating film over at least each said first island of semiconductor layer; forming a gate electrode on the gate insulating film on the first island of semiconductor layer; doping portions of the first island of semiconductor layer to be source and drain regions with a dopant element; doping a portion of the second island of semiconductor layer to be an n-type region with an n-type dopant element; and doping another portion of the second island of semiconductor layer to be a p-type region with a p-type dopant element.

According to such a method, n- or p-type doped regions to be source/drain regions are defined in the semiconductor layer of the TFT, and n- and p-type doped regions are defined in the semiconductor layer of the TFD, thereby completing the respective devices on the same substrate. In this case, in the process step of doping the regions of the first island of semiconductor layer to be source/drain regions with a dopant element, that dopant element to be introduced into those regions of the first island of semiconductor layer to be source/drain regions is preferably an n-type dopant element. And that process step is preferably performed simultaneously with the process step of doping the region of the second island of semiconductor layer to be an n-type region with an n-type dopant element. That is to say, the doping process step to define the source/drain regions of an n-channel TFT and the doping process step to define the n-type doped region of the TFD can be performed as a single process step, thus simplifying the manufacturing process.

Alternatively, in the process step of doping the regions of the first island of semiconductor layer to be source/drain regions with a dopant element, that dopant element to be introduced into those regions of the first island of semiconductor layer to be source/drain regions may also be a p-type dopant element. And that process step is preferably performed simultaneously with the process step of doping the region of the second island of semiconductor layer to be a p-type region with a p-type dopant element. That is to say, the doping process step to define the source/drain regions of a p-channel TFT and the doping process step to define the p-type doped region of the TFD can be performed as a single process step, thus simplifying the manufacturing process.

Furthermore, the first island of semiconductor layer is preferably islands of semiconductor regions including an island to be the active region of an n-channel thin-film transistor and an island to be the active region of a p-channel thin-film transistor. The step of doping the islands of semiconductor regions in the first island of semiconductor layer to be source/drain regions with a dopant element includes the steps of: doping the island to be the n-channel thin-film transistor, which is one of the islands of semiconductor regions in the first island of semiconductor layer, with an n-type dopant element; and doping the island to be the p-channel thin-film transistor, which is another one of the islands of semiconductor regions in the first island of semiconductor layer, with a p-type dopant element. Among these process steps, the step of doping the islands of semiconductor regions in the first island of semiconductor layer to be source/drain regions of an n-channel thin-film transistor with an n-type dopant element and the step of doping the island of semiconductor region in the second island of semiconductor layer to be an n-type region with an n-type dopant element are preferably performed simultaneously. And among those process steps, the step of doping the islands of semiconductor regions in the first island of semiconductor layer to be source/drain regions of a p-channel thin-film transistor with a p-type dopant element and the step of doping the island of semiconductor region in the second island of semiconductor layer to be an n-type region with a p-type dopant element are preferably performed simultaneously.

In that case, when a TFT circuit with a CMOS configuration is fabricated, a doping process step to define the source/drain regions of its n-channel TFT and a doping process step to define the n-type doped region of a TFD can be performed as a single process step. Added to that, a doping process step to define the source/drain regions of a p-channel TFT and a doping process step to define the p-type doped region of a TFD can also be performed as a single process step. As a result, the manufacturing process can be simplified significantly. And eventually, a semiconductor device including a TFT and a TFD with good characteristics, both having a crystalline semiconductor film of which the degrees of crystallinity have been optimized to these two different types of semiconductor elements, on the same substrate can be provided without increasing the number of manufacturing process steps and with the manufacturing cost rather cut down, thereby accomplishing the object of the present invention.

In one embodiment Of these methods, the step of doping the island of semiconductor region in the second island of semiconductor layer to be an n-type region with an n-type dopant element and the step of doping the island of semiconductor region in the second island of semiconductor layer to be a p-type region with a p-type dopant element are preferably performed so that a region doped with no dopant elements is left (as an intrinsic region) between respective portions of the second island of semiconductor layer to be n- and p-type regions.

Embodiment 1

Hereinafter, a semiconductor device as a first preferred embodiment of the present invention will be described. The semiconductor device of this preferred embodiment includes an n-channel TFT and a TFD on the same substrate and may be used as an active-matrix-addressed display device with a sensor section, for example.

FIG. 1 is a schematic cross-sectional view illustrating an exemplary semiconductor device according to this preferred embodiment. The semiconductor device of this preferred embodiment typically includes a number of TFTs and a number of TFDs on the same substrate. In FIG. 1, however, the configurations of just one of those TFTs and only one of those TFDs are illustrated.

The semiconductor device 100 of this preferred embodiment includes a thin-film transistor 123 and a thin-film diode 124, which are arranged on a substrate 101 with undercoat films 103 and 104 interposed between them. The thin-film transistor 123 includes a semiconductor layer S1 with a channel region 114 and source/drain regions 112, a gate insulating film 108 on the semiconductor layer S1, a gate electrode 109 that controls the conductivity of the channel region 114, and electrodes and interconnects 121 that are connected to the source/drain regions 112. On the other hand, the thin-film diode 124 includes a semiconductor layer S2 with at least an n-type region 113 and a p-type region 117 and electrodes and interconnects 122 that are connected to the n- and p-type regions 113 and 117. In the example illustrated in FIG. 1, an intrinsic region 118 is arranged between the n- and p-type regions 113 and 117 of the semiconductor layer S2.

The thin-film transistor 123 and the thin-film diode 124 are coated with a silicon nitride film 119 and a silicon dioxide film 120 as interlevel dielectric films. Also arranged between the semiconductor layer S2 of the thin-film diode 124 and the substrate 101 is a heat sink layer 102 to function as a heat sink in the laser irradiation process step during the manufacturing process to be described later.

The respective semiconductor layers S1 and S2 of the thin-film transistor 123 and the thin-film diode 124 are portions of a crystalline semiconductor layer obtained by crystallizing the same amorphous semiconductor film, and have mutually different degrees of crystallinity. Specifically, the semiconductor layer S1 of the thin-film transistor 123 preferably has a higher degree of crystallinity than the semiconductor layer S2 of the thin-film diode 124.

For example, the n-channel thin-film transistor 123 and the thin-film diode 124 shown in FIG. 1 may be fabricated in the following procedure.

FIGS. 2(A) through 2(I) are cross-sectional views illustrating the respective process steps to fabricate the thin-film transistor 123 and the thin-film diode 124 of this preferred embodiment. These process steps are carried out in the same order that these portions (A) through (I) of FIG. 2 are arranged.

In the process step shown in FIG. 2(A), a low alkali glass substrate or a quartz substrate may be used as the substrate 101. In this preferred embodiment, a low alkali glass substrate is used. In that case, the glass substrate may be heat-treated in advance to a temperature that is lower than the glass stain point by about 10-20° C. On the surface of that substrate 101 on which a TFT and a TFD will be fabricated, a heat sink layer 102 that will serve as a heat sink later during the laser irradiation process is formed. In this process step, if a film that cuts off incoming light is used as the heat sink layer 102, then the heat sink layer 102 can function, in the final product, as a shielding layer for cutting off the light that has come from under the back surface of the substrate. The heat sink layer 102 may be made of a metal film or a silicon film, for example. If a metal film is used, a refractory metal such as tantalum (Ta), tungsten (W) or molybdenum (Mo) is preferably used considering the heat treatment to be carried out at a later stage of the manufacturing process.

In this preferred embodiment, a Mo film is deposited by a sputtering process and then patterned, thereby forming the heat sink layer 102 shown in FIG. 2(A). In this case, to make the layer thus obtained perform the function as a heat sink layer fully, its thickness is one of the parameters. Specifically, the layer needs to have a thickness of 20 nm to 200 nm and preferably has a thickness of 30 nm to 150 nm (e.g., 100 nm in this preferred embodiment).

Next, as shown in FIG. 2(B), an undercoat film of silicon dioxide, silicon nitride or silicon oxynitride, for example, is deposited to prevent impurities from diffusing from the substrate 101. In this preferred embodiment, a silicon oxynitride film is deposited as the lower, first undercoat film 103 by performing a plasma CVD process with source gases of $SiH_4$, $NH_3$ and $N_2O$ supplied, and then a second undercoat film 104 is deposited thereon by performing a plasma CVD process again with source gases of $SiH_4$ and $N_2O$ supplied. In this case, the thicknesses of the first and second undercoat films 103 and 104 are also among the parameters to make the underlying heat sink layer 102 function fully. The combined thickness of the two undercoat films needs to be in the range of 100 nm to 600 nm and preferably falls within the range of 150 nm to 450 nm. More specifically, in this preferred embodiment, the silicon oxynitride film as the first undercoat film 103 has a thickness of 50 nm to 400 nm (e.g., 200 nm) and the silicon oxynitride film as the second undercoat film 104 has a thickness of 30 nm to 300 nm (e.g., 150 nm). Although a two-layered undercoat film is used in this preferred embodiment, a single layer of silicon dioxide may also be used.

Next, a silicon film 105 with an amorphous structure (i.e., an a-Si film) is deposited to a thickness of 20 nm to 150 nm (preferably in the range of 30 nm to 80 nm) by a known process such as a plasma CVD process or a sputtering process. In this preferred embodiment, an amorphous silicon film is deposited to a thickness of 50 nm by a plasma CVD process. Optionally, the undercoat films 103 and 104 and the amorphous silicon film 105 may be deposited continuously because these films can be formed by the same deposition process. If the substrate on which the undercoat films have been deposited is not exposed to the air, contamination on its surface can be avoided and variations in characteristic or the threshold voltage between the TFTs to be fabricated can be minimized.

Subsequently, as shown in FIG. 2(C), the amorphous silicon film 105 is irradiated with a laser beam 106 and crystallized. In this process step, an XeCl excimer laser beam (with a wavelength of 308 nm and a pulse width of 40 nsec) or a KrF excimer laser beam (with a wavelength of 248 nm) may be used as the laser beam. Also, in this process step, the sizes of the laser beam spot are determined so that an elongated beam spot is formed on the surface of the substrate 101. And by sequentially scanning the surface of the substrate 101 perpendicularly to the direction in which the beam spot is elongated, the amorphous silicon film gets crystallized over the entire surface of the substrate. In this case, if the surface is scanned so that the beam spots partially overlap with each other, an arbitrary point on the amorphous silicon film 105 will be irradiated with the laser beam multiple times, thus contributing to increasing the uniformity. As a result, the amorphous silicon film 105 gets crystallized by going through an instantaneous melting and solidification process. During this solidification process, the heat will escape more quickly, and the solidification rate will get higher, in a portion of the amorphous silicon film 105 over the heat sink layer 102 than the rest of the amorphous silicon film 105 with no underlying heat sink layer. Consequently, a crystalline silicon region 105b crystallized over the heat sink layer 102 and a crystalline silicon region 105a crystallized elsewhere with no underlying heat sink layer come to have mutually different degrees of crystallinity.

Figure 11:
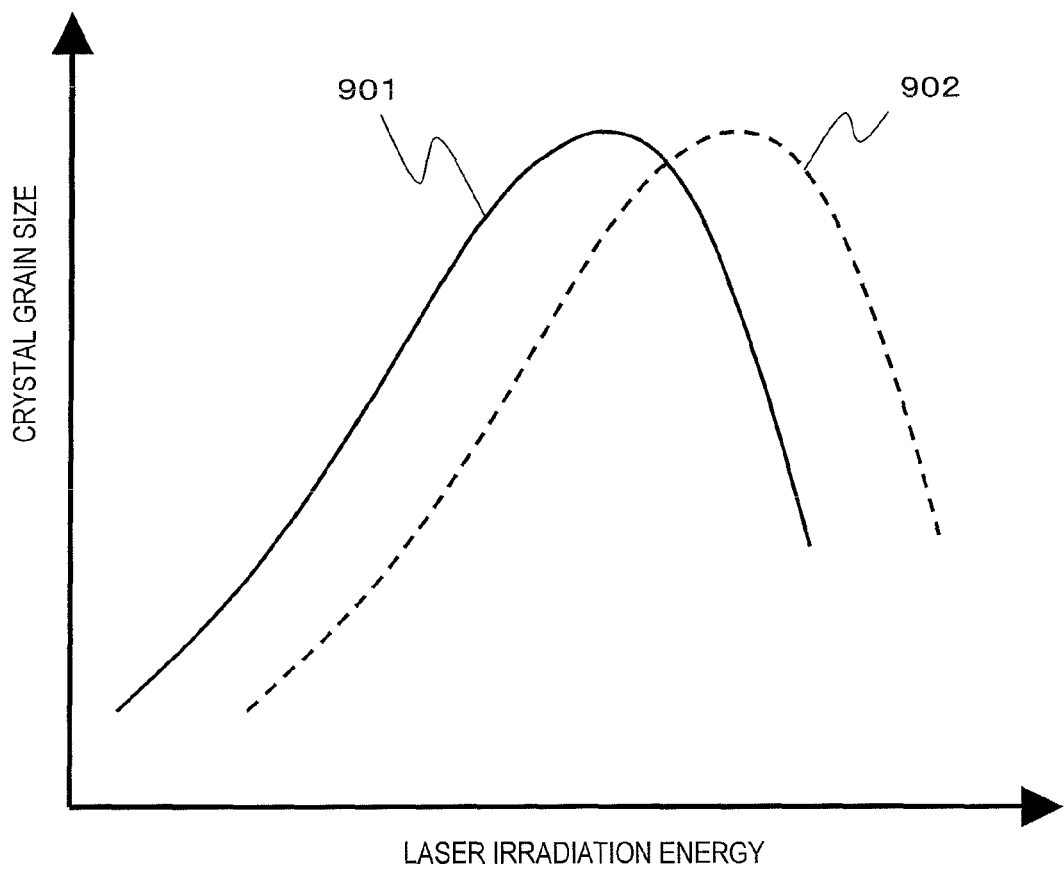
FIG. 11 shows how the degree of crystallinity changes with the energy density during a crystallization process that uses irradiation with a laser beam.

In this process step, the degree of crystallinity is controlled by adjusting the irradiation energy of the laser beam. FIG. 11 shows the dependence of the average crystal grain size on the irradiation energy of a laser beam. In FIG. 11, the average crystal grain size is used as an index representing the degree of crystallinity. But similar results will be obtained even if the TO phonon intensity of a Raman microspectroscopy or the defect density is used as an alternative index. As for the defect density, however, the lower the defect density, the higher the degree of crystallinity, and therefore, the resultant curves will be vertically inverted ones. As can be seen from FIG. 11, the average crystal grain size initially goes on increasing as the irradiation energy density of the laser beam is increased, but reaches a local maximum at a certain point and then starts to decrease. The heat sink layer for use in this preferred embodiment would shift the entire curve to the right on the paper so that their abscissas (irradiation energy densities) increase with respect to the same average crystal grain sizes. That is to say, the variation in energy in the regions with no underlying heat sink layer is represented by the curve 901 shown in FIG. 11, while the variation in energy in the region over the heat sink layer is represented by the curve 902. That is why if an irradiation energy density, at which the average crystal grain size (representing the degree of crystallinity) almost reaches a local maximum, or an even lower energy density, is set with respect to a region of the silicon film with no underlying heat sink layer, the crystalline silicon region 105b over the heat sink layer 102 will have a smaller average crystal grain size than the crystalline silicon region 105a with no underlying heat sink layer 102 and will have a lower degree of crystallinity in terms of any other crystal parameter, too. In this preferred embodiment, the irradiation energy density of the laser beam is defined based on the data about the silicon region with no underlying heat sink layer 102. That is to say, the irradiation energy density is preferably smaller by 0 to 50 $mJ/cm^2$ than the energy density at which the curve 901 shown in FIG. 11 (associated with the region with no underlying heat sink layer in this preferred embodiment) reaches the local maximum. For example, when the energy density at which the crystal grain size reached a local maximum was 380 $mJ/cm^2$, the amorphous silicon film was irradiated at an energy density of 370 $mJ/cm^2$, which is lower than the former value by 10 $mJ/cm^2$.

In the crystalline silicon film thus obtained, the crystalline silicon region 105a had an average crystal grain size of 200 nm to 300 nm and the crystalline silicon region 105b had an average crystal grain size of 50 nm to 150 nm. Also, ridges were produced on the surface of the crystalline silicon film and had an average surface roughness Ra of 4 nm to 9 nm in the crystalline silicon region 105a and an Ra of 2 nm to 4 nm in the crystalline silicon region 105b. As for the TO phonon peak intensity of crystalline Si to be observed in the vicinity of 520 cm$^{-1}$ in a Raman microspectroscopy, the intensity in the crystalline silicon region 105a was approximately two to three times as high as the intensity in the crystalline silicon region 105b.

Thereafter, excessive portions of the crystallized silicon film between the crystalline silicon regions 105a and 105b are removed, thereby electrically isolating these two element regions from each other. In this process step, the crystalline silicon region 105a is patterned into an island of semiconductor region 107t to be the active region (including source/drain regions and a channel region) of a TFT, while the crystalline silicon region 105b is patterned into an island of semiconductor region 107d to be the active region (including n$^+$ and p$^+$ regions and an intrinsic region) of a TFD as shown in FIG. 2(D).

Subsequently, as shown in FIG. 2(E), a gate insulating film 108 is deposited over these islands of semiconductor regions 107t and 107d. The gate insulating film 108 is preferably a silicon dioxide film with a thickness of 20 nm to 150 nm. In this preferred embodiment, a silicon dioxide film with a thickness of 100 nm was used.

Next, a conductive film is deposited on the gate insulating film 108 by a sputtering process or a CVD process, for example, and then patterned into the shape of a gate electrode 109 for a TFT. In this process step, the conductive film is not deposited on the island of semiconductor region 107d to form part of a TFD. The conductive film to deposit in this process step is preferably a refractory metal such as W, Ta, Ti or Mo or an alloy thereof, and preferably has a thickness of 300 nm to 600 nm. In this preferred embodiment, tantalum (Ta) with a very small amount of additive nitrogen was deposited to a thickness of 450 nm.

Thereafter, as shown in FIG. 2(F), a photoresist mask 110 is formed on the gate insulating film 108 so as to partially cover the island of semiconductor region 107d to be the active region of a TFD, and ions 111 of an n-type dopant (such as phosphorus) are implanted into the entire surface of the substrate 101 from over it. The conditions of this ion implantation process step are determined so that the phosphorus ions 111 pass through the gate insulating film 108 and are implanted into the semiconductor regions 107t and 107d. As a result of this process step, the phosphorus ions 111 are implanted into a portion of the island of semiconductor region 107d to form part of a TFD, which is not covered with the photoresist mask 110, and into portions of the semiconductor region 107t to form part of a TFT, which are not covered with the gate electrode-to-be 109. That is to say, no phosphorus ions 111 are introduced into the regions covered with the photoresist mask 110 and the gate electrode-to-be 109. Consequently, those portions of the semiconductor region 107t to form part of a TFT, implanted with the phosphorus ions 111, will be the source/drain regions 112 of the TFT, while the portion masked with the gate electrode-to-be 109 and implanted with no phosphorus ions 111 will be the channel region 114 of the TFT. On the other hand, the portion of the island of semiconductor region 107d to form part of a TFD, implanted with the phosphorus ions 111, will be the n$^+$ region 113 of the TFD.

Next, the photoresist mask 110 used in the previous process step is stripped and then another photoresist mask 115 is formed on the gate insulating film 108 so as to cover a part of the island of semiconductor region 107d to be the active region of a TFD and entire island of semiconductor region 107t to be the active region of a TFT, and ions 116 of a p-type dopant (such as boron) are implanted into the entire surface of the substrate 101 from over it as shown in FIG. 2(G). The conditions of this ion implantation process step are determined so that the boron ions 116 are passed through the gate insulating film 108 and implanted into the island of semiconductor region 107d. As a result of this process step, the boron ions 116 are implanted into a portion of the island of semiconductor region 107d to form part of a TFD, which is not covered with the photoresist mask 115. That is to say, no boron ions 116 are introduced into the regions covered with the photoresist mask 116. Consequently, that portion of the island of semiconductor region 107d to form part of a TFD, implanted with the boron ions 116, will be the p$^+$ region 117 of the TFD, while the portion implanted with no phosphorus ions in the previous process step, either, will be the intrinsic region 118 thereof.

Subsequently, the photoresist mask 115 used in the previous process step is stripped and then the substrate is thermally treated within an inert atmosphere (e.g., a nitrogen gas ambient). This is a state as shown in FIG. 2(H). As a result of this heat treatment process, various doping damages such as crystal defects that have been caused during the ion implantation process steps in the portions to be the source/drain regions 112 of a TFT and in the portions to be the n$^+$ and p$^+$ regions 113 and 117 of a TFD are repaired and the phosphorus and boron dopant atoms introduced there are activated. As a result, the source/drain regions 112 of the TFT and the n$^+$ and p$^+$ regions 113 and 117 of the TFD can have their resistance reduced. The heat treatment process of this process step may be carried out with a normal heating furnace but is preferably performed as a rapid thermal annealing (RTA). Among other things, it is particularly preferred that the temperature of the substrate be raised or lowered instantaneously by spraying a high-temperature inert gas against the surface of the substrate.

Thereafter, as shown in FIG. 2(I), a silicon dioxide film and/or a silicon nitride film is/are deposited as an interlevel dielectric film. In this preferred embodiment, the interlevel dielectric film has a dual layer structure consisting of a silicon nitride film 119 and a silicon dioxide film 120. After that, contact holes are cut through the interlevel dielectric film and a metallic material is deposited thereon and patterned into electrodes and interconnects 121 and 122 to form parts of a TFT and a TFD.

Finally, this structure is annealed at a temperature of 350° C. to 450° C. within either a nitrogen gas ambient or a hydrogen gas mixed ambient at the atmospheric pressure, thereby completing a thin-film transistor 123 and a thin-film diode 124 as shown in FIG. 2(I). Optionally, to protect these devices, a passivation film of silicon nitride, for example, may be deposited over the thin-film transistor 123 and the thin-film diode 124.

Embodiment 2

Figure 3:
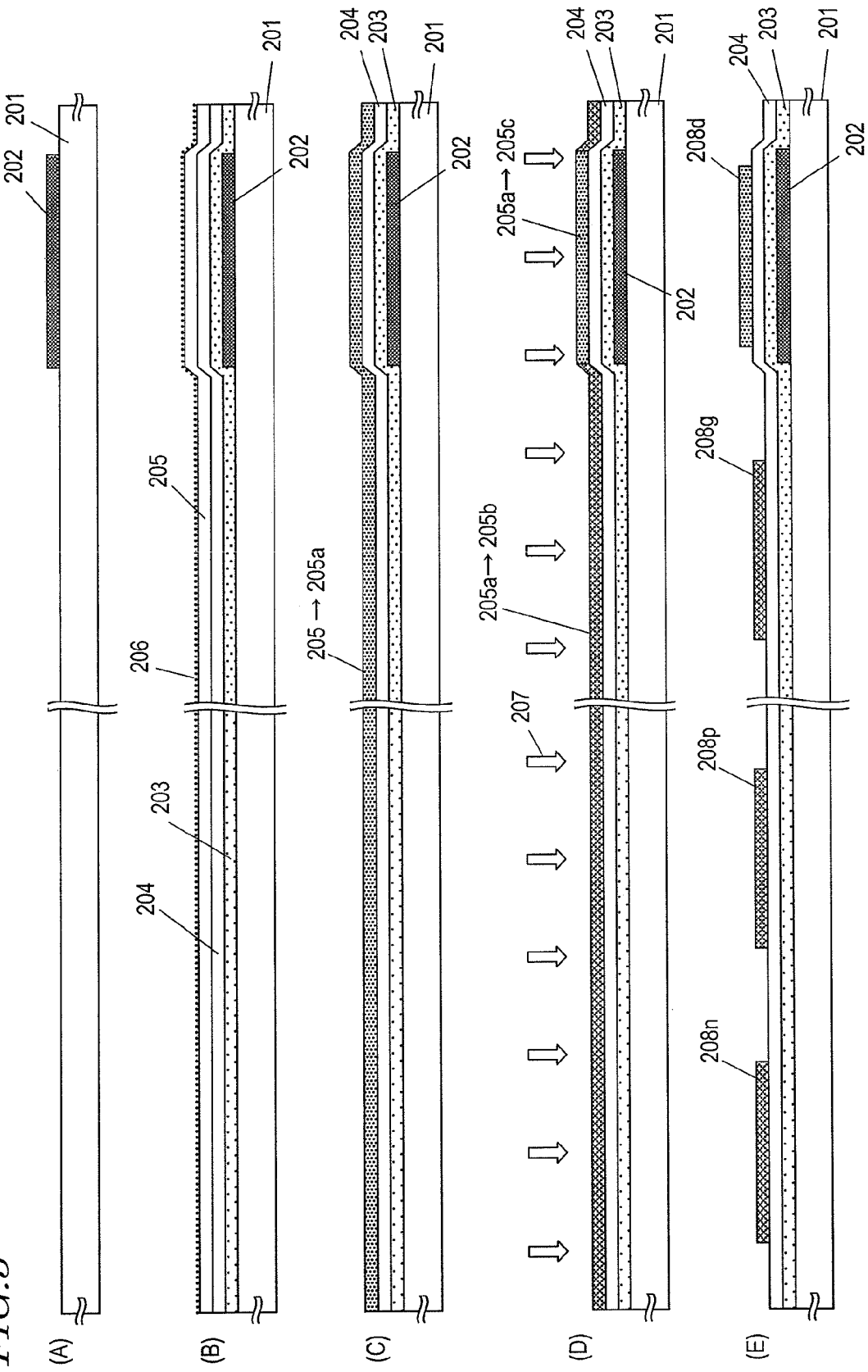
FIGS. 3(A) through 3(E) are schematic cross-sectional views illustrating respective manufacturing process steps to fabricate a semiconductor device as a second preferred embodiment of the present invention.
Figure 4:
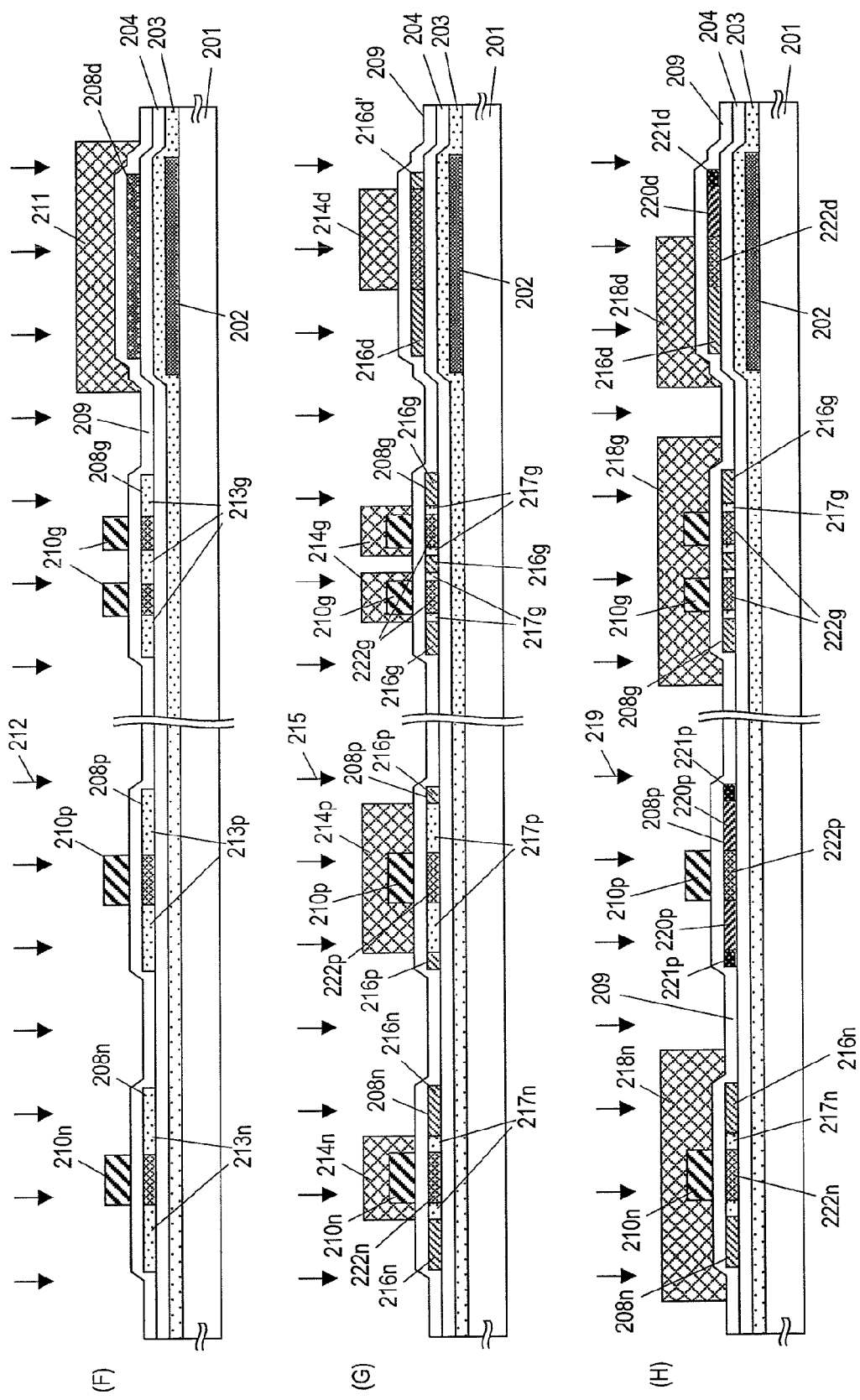
FIGS. 4(F) through 4(H) are schematic cross-sectional views illustrating respective manufacturing process steps to fabricate the semiconductor device as the second preferred embodiment of the present invention.
Figure 5:
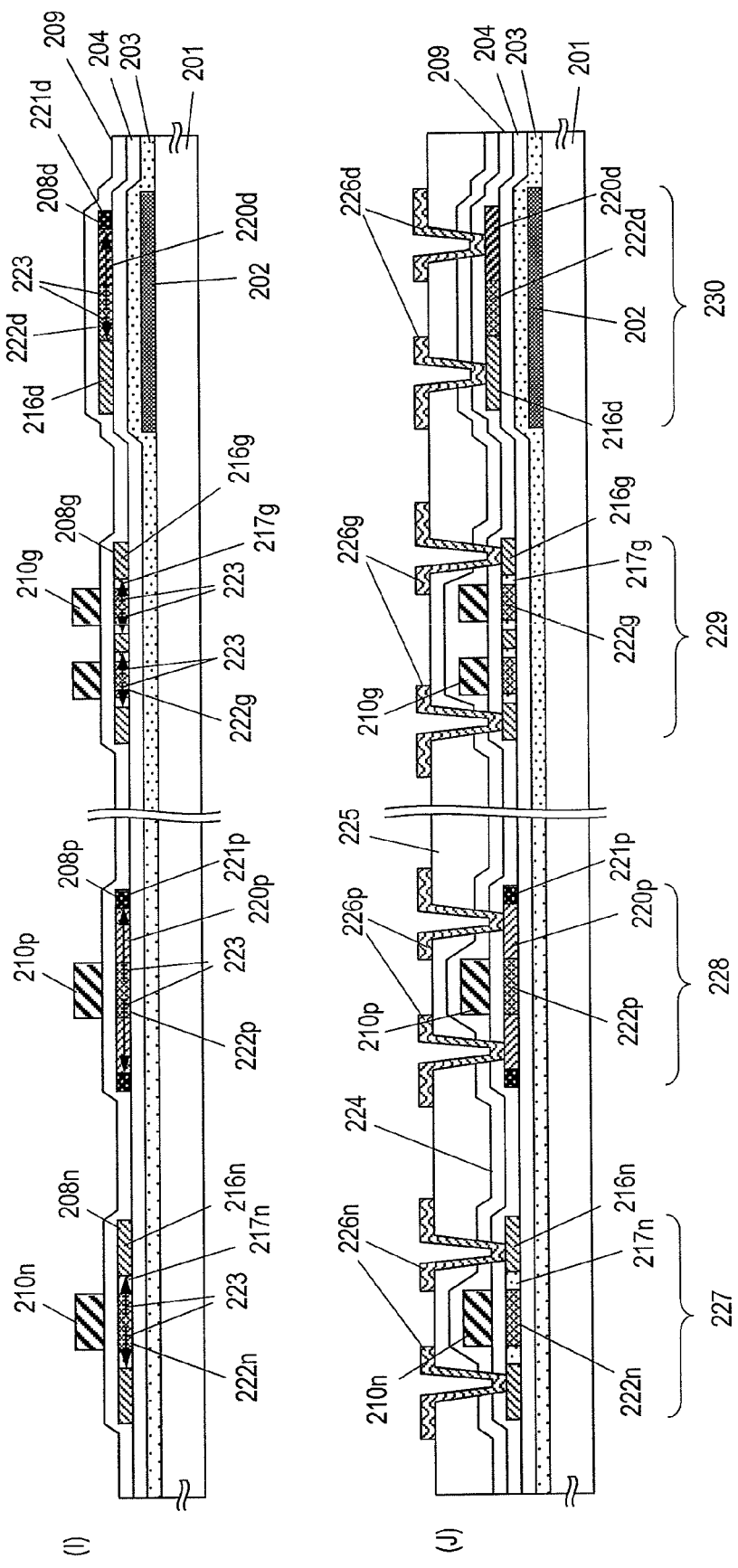
FIGS. 5(I) through 5(J) are schematic cross-sectional views illustrating respective manufacturing process steps to fabricate the semiconductor device as the second preferred embodiment of the present invention.

Hereinafter, a second preferred embodiment of the present invention will be described with reference to FIG. 3. Specifically, it will be described how to fabricate a pixel TFT for use as a unit of display, a TFT circuit with a CMOS configuration for use as a driver, and a photosensor TFD at the same time on a glass substrate by a different method from the one adopted in the first preferred embodiment. The semiconductor device of this preferred embodiment can be used as an active-matrix-addressed liquid crystal display device including a built-in photosensor or an organic EL display device, for example. FIGS. 3 to 5 are cross-sectional views illustrating the respective process steps to fabricate an n-channel thin-film transistor 227 and a p-channel thin-film transistor 228 to form a driver circuit, an n-channel thin-film transistor 229 to drive a pixel electrode, and a thin-film diode 430 as a photosensor. These process steps are carried out in the same order that these drawings (i.e., from FIG. 3(A) through 5(J) are arranged.

First, as shown in FIG. 3(A), a metal film or a silicon film that will function not only as a heat sink during the laser irradiation process but also as a shielding layer that shields the TFD from light coming from under the back surface of the substrate is formed on the surface of a glass substrate 201 on which a TFT and a TFD will be fabricated. In this preferred embodiment, a molybdenum (Mo) film is deposited by a sputtering process and then patterned, thereby forming the heat sink layer 202 shown in FIG. 3(A). In this process step, the heat sink layer 202 may have a thickness of 20 nm to 200 nm (preferably in the range of 30 nm to 150 nm) and has a thickness of 100 nm in this preferred embodiment.

Next, as shown in FIG. 3(B), an undercoat film of silicon dioxide, silicon nitride or silicon oxynitride, for example, is deposited over the glass substrate 201 and the heat sink layer 202 by a plasma CVD process, for example, to prevent impurities from diffusing from the glass substrate. In this preferred embodiment, a silicon nitride film is deposited to a thickness of approximately 250 nm as the lower, first undercoat film 203, and then a second undercoat film 204 of silicon dioxide is deposited thereon to a thickness of approximately 100 nm. Next, an intrinsic (i-type) amorphous silicon film (i.e., an a-Si film) 205 is deposited to a thickness of approximately 20-80 nm (e.g., 40 nm) by a plasma CVD process or any other suitable process.

Thereafter, a catalyst element is added to the surface of the a-Si film 205. Specifically, the surface of the a-Si film is coated with an aqueous solution including 5 ppm by weight of catalyst element (e.g., nickel in this preferred embodiment) such as an aqueous solution of nickel acetate by a spin coating process, thereby forming a layer including a catalyst element 206. In this case, the concentration of the catalyst element has been converted into weight. The catalyst element(s) that can be used in this process step is/are one or multiple elements selected from the group consisting of iron (Fe), cobalt (Co), tin (Sn), lead (Pb), palladium (Pd) and copper (Cu) as well as nickel (Ni). Although their catalyst effects are lower than those of the former elements, ruthenium (Ru), rhodium (Rh), osmium (Os), iridium (Ir), platinum (Pt) or gold (Au) may also serve as a catalyst element. The dose of the catalyst element to be added in this process step is very small. And the concentration of the catalyst element at the surface of the a-Si film 205 is controlled by a total reflection X-ray fluorescence (TRXRF) analysis. In this preferred embodiment, the catalyst element has a concentration of approximately $5 \times 10^{12}$ atoms/cm$^2$. Optionally, before this process step is performed, the surface of the a-Si film 205 may be slightly oxidized with ozone water, for example, to increase the wettability at the surface of the a-Si film 205 during the spin-coating process.

In this preferred embodiment, nickel is supposed to be introduced by a spin coating process. However, a thin film of a catalyst element (e.g., a nickel film in this preferred embodiment) may be formed on the a-Si film 205 by an evaporation process or a sputtering process, for example.

Subsequently, the substrate is thermally treated within an inert atmosphere (e.g., a nitrogen gas ambient). As this heat treatment process, annealing is preferably carried out at a temperature of 550° C. to 620° C. for any required length of time between 30 minutes and 4 hours. In this preferred embodiment, the heat treatment is conducted at 590° C. for an hour. As a result of this heat treatment, the nickel atoms that have been added to the surface of the a-Si film diffuse through the a-Si film 205 and also produce silicides, thereby crystallizing the a-Si film 205 using those silicides as nuclei of crystal growth. Consequently, the a-Si film 205 gets crystallized to be a crystalline silicon film 205a. Although the crystallization process is produced in this preferred embodiment by a heat treatment process using a furnace, the crystallization may also be produced with a rapid thermal annealing (RTA) system that uses a lamp as a heat source. This is the state as shown in FIG. 3(C).

Subsequently, as shown in FIG. 3(D), the crystalline silicon film 205a obtained by the heat treatment process is irradiated with a laser beam 207 and further re-crystallized, thereby obtaining a crystalline silicon film with an even higher degree of crystallinity. In this process step, an XeCl excimer laser beam (with a wavelength of 308 nm) or a KrF excimer laser beam (with a wavelength of 248 nm) may be used as the laser beam. Also, in this process step, the sizes of the laser beam spot are determined so that an elongated beam spot is formed on the surface of the substrate 201. And by sequentially scanning the surface of the substrate 201 perpendicularly to the direction in which the beam spot is elongated, the crystalline silicon film gets re-crystallized over the entire surface of the substrate. In this case, if the surface is scanned so that the beam spots partially overlap with each other, an arbitrary point on the crystalline silicon film 205a will be irradiated with the laser beam multiple times, thus contributing to increasing the uniformity. In this preferred embodiment, the sizes of the beam spot are determined so that the beam spot has an elongated shape of 300 mm×0.4 mm on the surface of the substrate 201 and the substrate is sequentially scanned at a step of 0.02 mm perpendicularly to the direction in which the beam spot is elongated. That is to say, any arbitrary point on the crystalline silicon film 205a gets irradiated with the laser beam 20 times in total. Examples of laser beams that can be used in this process step include KrF and XeCl excimer laser beams of pulsed or continuous wave type but also a YAG laser beam or a YVO4 laser beam as well.

As a result, the crystalline silicon film 205a gets re-crystallized by going through an instantaneous melting and solidification process. During this solidification process, the heat will escape more quickly, and the solidification rate will get higher, in a portion of the crystalline silicon film 205a over the heat sink layer 202 than the rest of the crystalline silicon film 205a with no underlying heat sink layer. Consequently, a crystalline silicon region 205c re-crystallized over the heat sink layer 202 and a crystalline silicon region 205b re-crystallized elsewhere with no underlying heat sink layer come to have mutually different degrees of crystallinity.

In this process step, the degree of crystallinity is controlled by adjusting the irradiation energy of the laser beam. If an irradiation energy density, at which the degree of crystallinity almost reaches a local maximum, or an even lower energy density, is set with respect to a region of the crystalline silicon film with no underlying heat sink layer, the crystalline silicon region 205c over the heat sink layer 202 will have a lower degree of crystallinity than the crystalline silicon region 205b with no underlying heat sink layer 202 as in the first preferred embodiment described above. In this preferred embodiment, the irradiation energy density of the laser beam is defined based on the data about the portion of the crystalline silicon film with no underlying heat sink layer 202. However, since the crystalline silicon film 205a that has been crystallized by going through the heat treatment process with the catalyst element added is irradiated with the laser beam in this preferred embodiment, evaluation parameters are slightly different from the first preferred embodiment in which the amorphous silicon film is directly irradiated with a laser beam and crystallized. In this preferred embodiment, the average crystal grain size (i.e., domain size) has already been determined in the previous process step. Thus, in FIG. 11, the magnitudes of the surface unevenness (or ridges) are plotted as ordinates, thereby determining the irradiation energy density.

That is to say, the ordinates of FIG. 11 were replaced with the average surface roughness of the crystalline silicon film, and the crystalline silicon film was irradiated with the laser beam at such an energy density that was smaller by 0 to 50 mJ/cm$^2$ than the energy density at which the curve 901 (associated with the region with no underlying heat sink layer in this preferred embodiment) reached a local maximum. For example, if that energy density that resulted in the local maximum was 400 mJ/cm$^2$, the crystalline silicon film was irradiated at an energy density of 380 mJ/cm$^2$, which is smaller by 20 mJ/cm$^2$ than the former value. Also, in this process step, if the energy density of the laser beam were too high, the degree of crystallinity of the crystalline silicon film 205a obtained in the previous process step would be reset, which is a constraint that is not imposed on the first preferred embodiment.

The crystalline silicon film 205a that has been obtained in this manner by the solid-phase crystallization as described above has had its crystal defects reduced by going through a melting and solidification process caused by the irradiation with the laser beam to be crystalline silicon regions 205b and 205c with an even higher degree of crystallinity. In this case, the region 205b had an average surface roughness Ra of 4 nm to 7 nm and the crystalline silicon region 205c had an Ra of 2 nm to 3 nm. As for the TO phonon peak intensity of crystalline Si to be observed in the vicinity of 520 cm$^{-1}$ in a Raman microspectroscopy, the intensity in the crystalline silicon region 205b was approximately twice to thrice as high as the intensity in the region 205c. The average crystal grain size had already been determined during the crystallization process by the initial heat treatment and both of the crystalline silicon regions 205b and 205c had an average crystal grain size of 2 to 5 μm.

Thereafter, excessive portions of the crystalline silicon regions 205b and 205c are removed, thereby electrically isolating two element regions from each other. In this process step, the crystalline silicon region 205b is patterned as shown in FIG. 3(E) into an island of semiconductor region 208n to be the active region (including source/drain regions and a channel region) of an n-channel TFT that will form part of a driver circuit, an island of semiconductor region 208p to be the active region (including source/drain regions and a channel region) of a p-channel TFT, and an island of semiconductor region 208g to be the active region (including source/drain regions and a channel region) of an n-channel TFT to drive a pixel electrode. Meanwhile, the crystalline silicon region 205c is patterned into an island of semiconductor region 208d to be the active region (including n$^+$ and p$^+$ region and an intrinsic region) of a photosensor TFD.

Optionally, in this process step, all or some of these semiconductor layers may be doped with boron (B), as a dopant that will make the doped region p-type, at a dose of $1\times10^{16}$/cm$^3$ to $5\times10^{17}$/cm$^3$ in order to control the threshold voltage. In that case, boron (B) may be added either by performing an ion implantation process or by depositing an amorphous silicon film that already includes boron.

Next, a silicon dioxide film is deposited to a thickness of 20 nm to 150 nm (e.g., 100 nm in this preferred embodiment) as a gate insulating film 209 over those semiconductor regions 208n, 208p, 208g and 208d to be respective active regions. To make the silicon dioxide film, in this preferred embodiment, TEOS (tetraethoxy orthosilicate) is used as a source material and decomposed and deposited with oxygen by performing an RF plasma CVD process with the substrate heated to a temperature of 150° C. to 600° C. (preferably at a temperature of 300° C. to 450° C.). Alternatively, also using TEOS as a source material and ozone gas, the silicon dioxide film may also be deposited by performing either a low pressure CVD process or a normal pressure CVD process with the substrate heated to a temperature of 350° C. to 600° C. (preferably a temperature of 400° C. to 550° C.). Optionally, after the silicon dioxide film has been deposited, the substrate may also be annealed for one to four hours at a temperature of 500° C. to 600° C. within an inert gas atmosphere in order to improve the bulk property of the gate insulating film itself or the property of the interface between the crystalline silicon film and the gate insulating film. Still alternatively, any other insulating film with silicon, having either a single layer structure or a multilayer structure, may also be used as the gate insulating film 209.

Subsequently, as shown in FIG. 4(F), a refractory metal is deposited by a sputtering process and then patterned into the shapes of gate electrodes 210n, 210p and 210g. In this process step, the gate electrode 210g that will form part of a pixel TFT is split into two portions in order to reduce the amount of leakage current to flow through the pixel TFT during the OFF state. That is to say, this gate electrode 210g has a so-called "dual gate structure". The refractory metal to deposit in this process step may be selected from the group consisting of elements tantalum (Ta), tungsten (W), molybdenum (Mo) and titanium (Ti), alloys including any of these elements as main ingredients, and alloy films including a combination of these elements (such as an Mo—W alloy film and an Mo—Ta alloy film). Alternatively, tungsten silicide, titanium silicide or molybdenum silicide may also be used. In this preferred embodiment, tungsten (W) was deposited to a thickness of 300 nm to 600 nm (e.g., 450 nm). In this process step, the concentrations of impurities are preferably as low as possible to reduce the resistivity. For example, by decreasing the oxygen concentration to 30 ppm or less, a resistivity of 20 μΩcm or less is realized.

Next, a doping mask 211 of photoresist is formed in a size that is big enough to easily cover the semiconductor layer 208d, which will form part of a photosensor TFD, with some margin left, and the semiconductor regions to be respective TFT active regions are implanted with dopant (phosphorus) ions 212 lightly by performing an ion doping process using the gate electrodes 210n, 210p and 210g as a mask. In this process step, phosphine (PH$_3$) is used as a doping gas, the accelerating voltage is defined within the range of 60 kV to 90 kV (e.g., 70 kV), and the dose is defined within the range of $1\times10^{12}$ cm$^{-2}$ to $1\times10^{14}$ cm$^{-2}$ (e.g., $2\times10^{13}$ cm$^{-2}$). As a result of this process step, those portions of the islands of semiconductor regions 208n, 208p and 208g that are not covered with the gate electrodes 210n, 210p and 210g are lightly implanted with phosphorus ions 212 and turn into n-type light doped regions 213n, 213p and 213g, respectively. On the other hand, the dopant ions 212 are not implanted into the regions covered with the gate electrodes 210n, 210p and 210g and the photoresist mask 211. This is the state shown in FIG. 4(F).

Next, after the photoresist mask 211 has been stripped, a doping mask 214n of photoresist is formed in a size that is big enough to easily cover the gate electrode 210n, which will form part of an n-channel TFT, with some margin left as shown in FIG. 4(G). In addition, another doping mask 214p of photoresist is also formed in a size that is big enough to easily cover the gate electrode 210p, which will form part of a p-channel TFT, with some margin left so as to expose the outer periphery of the semiconductor layer 208p. Furthermore, still another doping mask 214g of photoresist is formed in a size that is big enough to easily cover the gate electrode 210g, which will form part of a pixel TFT, with some margin left. And yet another doping mask 214d of photoresist is formed so as to expose a portion of the semiconductor layer 208d as for a photosensor TFT-to-be. Thereafter, the respective semiconductor regions are implanted with dopant (phosphorus) ions 215 heavily by performing an ion doping process using the photoresist masks 214n, 214p, 214g and 214d as masks. In this process step, phosphine ($PH_3$) is used as a doping gas, the accelerating voltage is defined within the range of 60 kV to 90 kV (e.g., 70 kV), and the dose is defined to fall within the range of $1 \times 10^{15}$ cm$^{-2}$ to $1 \times 10^{16}$ cm$^{-2}$ (e.g., $5 \times 10^{15}$ c$^{-2}$).

As a result of this process step, in the semiconductor layer 208n to form part of an n-channel TFT, regions that are not covered with the photoresist mask 214n are heavily doped with dopant (phosphorus) atoms 215, thereby defining source/drain regions 216n to form parts of the n-channel TFT. On the other hand, other regions of the same semiconductor layer 208n, which have been covered with the photoresist mask 214n and have not been heavily doped with phosphorus atoms 215 but which were lightly doped with phosphorus atoms in the previous process step, will be lightly doped drain (LDD) regions 217n. Meanwhile, still another region of the semiconductor layer 208n that is located under the gate electrode 210n and that has not been lightly doped with phosphorus atoms, either, will be a channel region 222n. The same can be said about the pixel TFT. That is to say, in the semiconductor layer 208g, regions that are not covered with the photoresist mask 214g are heavily doped with dopant (phosphorus) atoms 215, thereby defining source/drain regions 216g to form parts of the (n-channel) pixel TFT. On the other hand, other regions of the same semiconductor layer 208g, which have been covered with the photoresist mask 214g and have not been heavily doped with phosphorus atoms 215 but which were lightly doped with phosphorus atoms in the previous process step, will be LDD regions 217g. Meanwhile, still another region of the semiconductor layer 208g that is located under the gate electrode 210g and that has not been lightly doped with phosphorus atoms, either, will be a channel region 222g. In the semiconductor layer 208p to form part of a p-channel TFT, regions that are not covered with the photoresist mask 214p are heavily doped with dopant (phosphorus) atoms 215, thereby defining n-type heavily doped regions 216p. On the other hand, another region of the semiconductor layer 208p that is located under the gate electrode 210p will be a channel region 222p. Likewise, in the semiconductor layer 208d to form part of a photosensor TFD, regions that are not covered with the photoresist mask 214d are heavily doped with dopant (phosphorus) atoms 215, thereby defining n-type heavily doped regions 216d and 216d'. Among these regions, the region 216d will be the n-type region of the TFD. In this process step, the in-film concentrations of the n-type dopant element (phosphorus) 215 in these regions 216n, 216p, 216g and 216d are in the range of $1 \times 10^{19}$/cm$^3$ to $1 \times 10^{21}$/cm$^3$. Meanwhile, in the LDD regions 217n and 217g of the n-channel TFT and pixel TFT, the in-film concentrations of the n-type dopant element (phosphorus) 215 are in the range of $1 \times 10^{17}$/cm$^3$ to $1 \times 10^{19}$/cm$^3$. In other words, if the dopant concentrations fall within this range, those regions function as LDD regions. The LDD regions can reduce not only the overconcentration of an electric field in the junctions between the channel region and the source/drain regions but also the amount of leakage current to flow while the TFT is in OFF state and can minimize deterioration to be caused by hot carriers.

Next, after the photoresist masks 214n, 214p, 214g and 214d have been removed, doping masks 218n, 218g and 218d of photoresist are formed again to cover entirely the semiconductor layer 208n to form part of the n-channel TFT and the semiconductor layer 208g to form part of the pixel TFT and to cover partially the semiconductor layer 208d to form part of the TFD as shown in FIG. 4(H). And the semiconductor layers 208p and 208d to form respective parts of the p-channel TFT and the TFD are implanted with dopant (boron) ions 219 to make them p-type by performing an ion doping process using the photoresist masks 218n, 218g and 218d and the gate electrode-to-be 210p of the p-channel TFT as masks. In this process step, diborane ($B_2H_6$) is used as a doping gas, the accelerating voltage is defined within the range of 40 kV to 90 kV (e.g., 75 kV), and the dose is defined to fall within the range of $1 \times 10^{15}$ cm$^{-2}$ to $1 \times 10^{16}$ cm$^{-2}$ (e.g., $3 \times 10^{15}$ cm$^{-2}$). As a result of this process step, the semiconductor layer 208p to form part of the p-channel TFT is heavily doped with boron atoms 219 except the channel region 222p under the gate electrode-to-be 210p. Also, as a result of this process step, the n-type dopant (phosphorus) 212 that has been introduced lightly in the previous process step into the region 217p has its conductivity type inverted into p-type, thereby turning the region 217p into source/drain regions 220p to form parts of the TFT. Meanwhile, the region 216p is doped heavily with not just phosphorus 215 in the previous process step but also boron 219 in this process step and will eventually function as a gettering region 221p. Furthermore, as for the semiconductor layer 208d to form part of a photosensor TFD, the region not covered with the photoresist mask 218d is heavily doped with boron 219 to turn into a p-type region 220d to form part of the TFD. Also, the region 216d' is doped heavily with not just phosphorus 215 in the previous process step but also boron 219 in this process step and will eventually function as a gettering region 221d. And the region that has been doped heavily with neither phosphorus nor boron (in the previous process step) as having been covered with the photoresist masks 218d and 214d will turn into an intrinsic region 222d to form part of a TFD. In this process step, the in-film concentrations of the p-type dopant element (boron) 219 in the regions 220p, 220d, 221p and 221d are within the range of $1.5 \times 10^{19}$/cm$^3$ to $3 \times 10^{21}$/cm$^3$. In this process step, the respective active regions 208n and 208g of the n-channel TFT and pixel TFT are entirely covered with the masks 218n and 218g and are not doped with boron 219 at all.

Thereafter, the photoresist masks 218n, 218g and 218d are removed and then the substrate is thermally treated within an inert atmosphere (e.g., a nitrogen gas ambient). In this preferred embodiment, an RTA process is carried out so that the temperature of the substrate is raised or lowered instantaneously by loading substrates one after another into a high-temperature atmosphere and spraying a high-temperature nitrogen gas against the surface of the substrate. The heat treatment process was carried out at a temperature rise/fall rate exceeding 200° C. per minute (e.g., at 650° C. for 10 minutes). In this process step, any other type of heat treatment may also be carried out and its conditions may also be defined appropriately by the person who carries out the process. It is naturally possible to carry out a normal heat treatment process using a diffusion furnace or an RTA process that uses a lamp. As a result of this heat treatment process, the phosphorus atoms that have been introduced into the portions of the semiconductor layers 208n and 208g to be the source/drain regions 216n and 216g of an n-channel TFT and a pixel switching thin-film transistor will increase the concentration of nickel solid solution in those regions, thereby moving the nickel atoms from the channel regions 222n and 222g to the source/drain regions by way of the LDD regions 217n and 217g in the directions indicated by the arrows 223 as shown in FIG. 5(I). Meanwhile, in the semiconductor layer 208p to form part of the p-channel TFT, the phosphorus and boron atoms that have been heavily introduced into the gettering regions 221p outside of the source/drain regions and the lattice defects caused while boron was introduced also move the nickel atoms from the channel regions 222p to the source/drain regions 220p and then to the gettering regions in the directions indicated by the arrows 223. Likewise, in the semiconductor layer 208d to form part of the photosensor TFD, the phosphorus atoms that have been introduced into the n-type region 216d and the phosphorus and boron atoms that have been introduced into the gettering regions 221d outside of the p-type region 220d also move the nickel atoms in the intrinsic region 222d and the p-type region 220d in the directions indicated by the arrows 223. Since the nickel atoms have come into the source/drain regions 216n and 216g to form parts of the n-channel TFT and pixel TFT and into the gettering regions 221p and 221d of the p-channel TFT and TFD as a result of the heat treatment process, the concentrations of nickel in those regions become equal to or higher than $1 \times 10^{18}/cm^3$.

On top of that, as a result of this heat treatment process, also activated are the n-type dopant (phosphorus) atoms that have been introduced into the source/drain regions 216n and 216g and LDD regions 217n and 217g to form parts of the n-channel TFT and pixel TFT and into the n-type region 216d to form part of the TFD and the p-type dopant (boron) atoms that have been introduced into the source/drain regions 220p to form part of the p-channel TFT and into the p-type region 220d to form part of the TFD. Consequently, the source/drain regions of the n-channel TFT and the pixel TFT and the n-type region of the TFD had a sheet resistance of approximately 0.5 to 1 kΩ/□ and the LDD regions thereof had a sheet resistance of approximately 30 to 60 kΩ/□. On the other hand, the source/drain regions of the p-channel TFT and the p-type region of the TFD had a sheet resistance of approximately 1 to 1.5 kΩ/□. In the gettering regions, the n-type dopant (phosphorus) atoms and p-type dopant (boron) atoms introduced cancel the carriers (including electrons and holes) and come to have a sheet resistance of several tens of kΩ/□, which is not enough to make them function as source/drain regions. However, these gettering regions are arranged so as not to interfere with the drift of the carriers in the semiconductor layers to form parts of the p-channel TFT and TFD and will cause no problem at all.

Subsequently, as shown in FIG. 5(J), silicon nitride, silicon dioxide or silicon oxynitride is deposited as an interlevel dielectric film to a thickness of 400 nm to 1,500 nm (typically in the range of 600 nm to 1,000 nm). In this preferred embodiment, the interlevel dielectric film has a dual layer structure consisting of a silicon nitride film 224 with a thickness of 200 nm and a silicon dioxide film 225 with a thickness of 700 nm. In this process step, the interlevel dielectric film is deposited continuously by a plasma CVD process using $SiH_4$ and $N_2O$ as source gases to make the silicon nitride film and TEOS and $O_2$ to make the silicon dioxide film, respectively. Naturally, the interlevel dielectric film does not have to have this structure but may also be either a single- or multilayer structure including any other insulating film with silicon. And if necessary, an organic insulating film such as an acrylic film may be deposited as the top layer.

Furthermore, a heat treatment process is carried out at a temperature of 300° C. to 500° C. for 30 minutes to 4 hours to hydrogenate the semiconductor layers. This is a process step for terminating and inactivating dangling bonds, which would deteriorate the characteristics of a TFT, by supplying hydrogen atoms to the interface between the active regions and the gate insulating film. In this preferred embodiment, the heat treatment was conducted at 410° C. for an hour within a nitrogen gas ambient including approximately 3% of hydrogen. If the interlevel dielectric film (e.g., the silicon nitride film 224, in particular) includes sufficient hydrogen, then even a heat treatment within the nitrogen gas ambient will be effective enough. Alternatively, the semiconductor layers may also be hydrogenated by a plasma hydrogenation process (that uses hydrogen excited by plasma).

Next, contact holes are cut through the interlevel dielectric film and metallic materials (such as a stack of titanium nitride and aluminum) are deposited and patterned into electrodes and interconnects 226n, 226p, 226g and 226d for TFTs. The titanium nitride film is provided as a barrier film that prevents aluminum from diffusing into the semiconductor layers. Finally, the structure thus obtained is annealed at 350° C. for an hour, thereby completing an n-channel thin-film transistor 227 and a p-channel thin-film transistor 228 to make a driver, a pixel switching thin-film transistor 229 and a photosensor thin-film diode 230 as shown in FIG. 5(J). In the pixel TFT, a transparent conductor film of ITO, for example, is connected to one of the two pairs of electrodes and interconnects 226g to form a pixel electrode. If necessary, contact holes may also be cut over the gate electrodes 210n and 210p and the electrodes may be connected together with the interconnects 226 as needed. Optionally, to protect the TFTs, a passivation film of silicon nitride may also be deposited over those TFTs.

The TFTs fabricated by the process of the preferred embodiment described above had very good characteristics. Specifically, the n-channel TFT had as high a field effect mobility as 250 $cm^2$/Vs to 300 $cm^2$/Vs with a threshold voltage of approximately 1 V, while the p-channel TFT had as high a field effect mobility as 120 $cm^2$/Vs to 150 $cm^2$/Vs with a threshold voltage of approximately −1.5 V. Also, when a circuit such as an inverter chain or a ring oscillator was formed of CMOS circuit elements in which the n- and p-channel TFTs of the preferred embodiment described above were arranged complementarily, the circuit achieved a higher degree of reliability and more stabilized circuit characteristics. Likewise, the pixel TFT also exhibited excellent switching characteristics because the amount of leakage current flowing through the TFT in the OFF state was 0.3 pA or less per unit W. Furthermore, the photosensitivity of the TFD could also be increased approximately 1.2 times compared to a situation where the TFD and a TFT were fabricated on the same substrate by a conventional process. And by controlling the degrees of crystallinity of these elements independently of each other, the respective device characteristics could be optimized.

Embodiment 3

Figure 6:
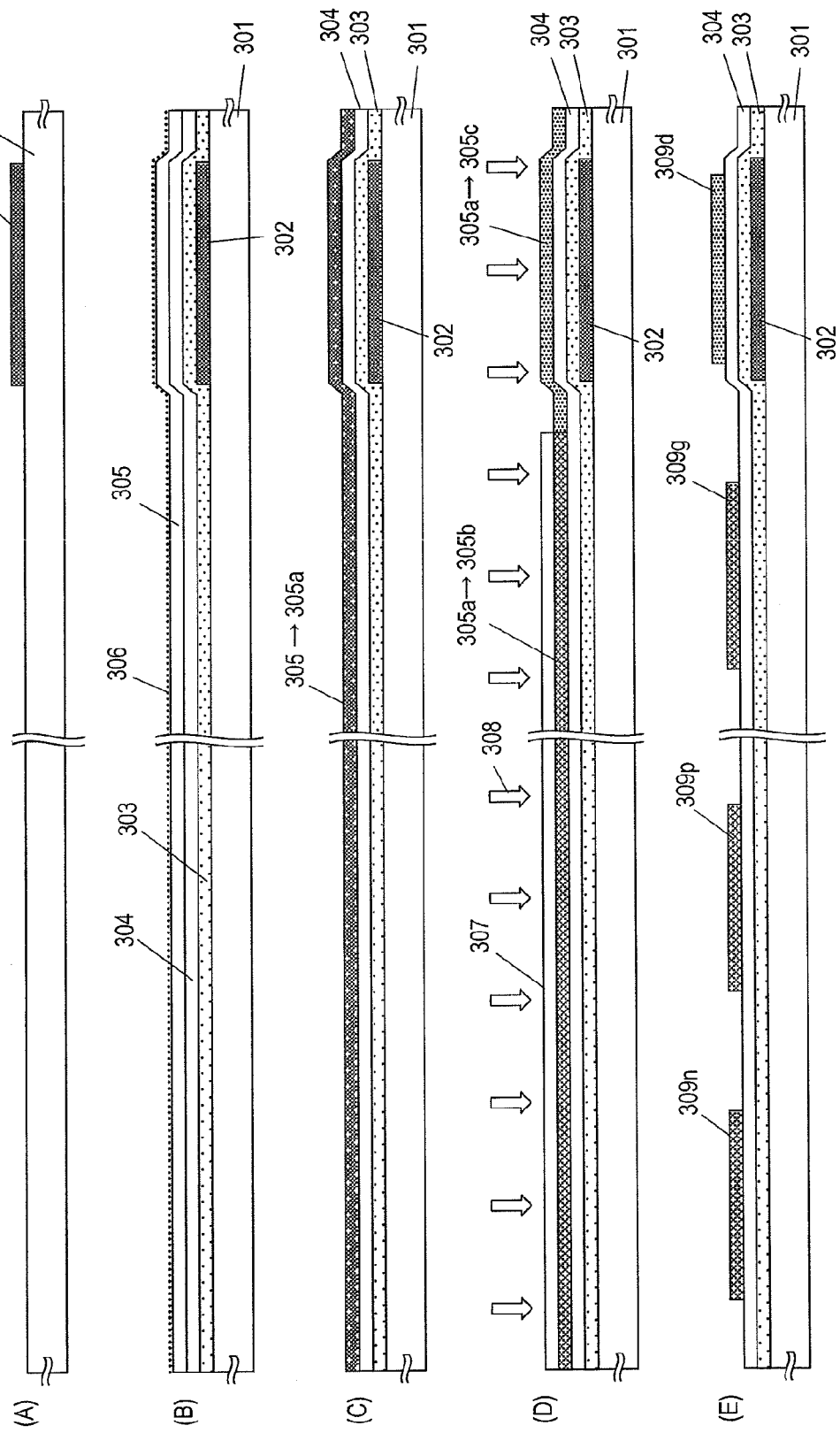
FIGS. 6(A) through 6(E) are schematic cross-sectional views illustrating respective manufacturing process steps to fabricate a semiconductor device as a third preferred embodiment of the present invention.

Hereinafter, a third preferred embodiment of the present invention will be described. Specifically, it will be described how to fabricate a pixel TFT for use as a unit of display, a TFT circuit with a CMOS configuration for use as a driver, and a photosensor TFD at the same time on a glass substrate by a different method from the one adopted in the second preferred embodiment. FIG. 6 shows cross-sectional views illustrating the respective process steps to fabricate the TFTs and TFD of this preferred embodiment. These process steps are carried out in the same order that these portions (A) through (E) of FIG. 6 are arranged.

First, as shown in FIG. 6(A), a shielding layer 302 that shields the TFD from light coming from under the back surface of the substrate is formed on the surface of a glass substrate 301 on which a TFT and a TFD will be fabricated. In this preferred embodiment, a Mo film is deposited to a thickness of 50 nm.

Next, as shown in FIG. 6(B), a silicon nitride film is deposited as the lower, first undercoat film 303 over the glass substrate 301 and the shielding layer 302, and then a second undercoat film 304 of silicon dioxide is deposited thereon as in the second preferred embodiment described above. Next, an intrinsic (i-type) amorphous silicon film 305 is deposited to a thickness of 50 nm by a plasma CVD process or any other suitable process.

Thereafter, a catalyst element is added to the surface of the a-Si film 305 by the same method as the one adopted in the second preferred embodiment. Specifically, using nickel as the catalyst element, a layer including a catalyst element 306 is formed.

Subsequently, the substrate is thermally treated within an inert atmosphere (e.g., a nitrogen gas ambient). As a result of this heat treatment, the nickel atoms that have been added to the surface of the a-Si film diffuse through the a-Si film 305 and also produce silicides, thereby crystallizing the a-Si film 305 using those silicides as nuclei of crystal growth. Consequently, the a-Si film 305 gets crystallized to be a crystalline silicon film 305a. This is the state as shown in FIG. 6(C).

Next, as shown in FIG. 6(D), an antireflective film 307 against a laser beam is deposited over the crystalline silicon film 305a. Then the antireflective film is patterned and left only in a selected area. In this process step, the antireflective film may be made of silicon dioxide or silicon nitride. However, the best thickness thereof changes according to the refractive index of each of those films with respect to the wavelength of the laser beam used. For example, if an XeCl excimer laser beam with a wavelength of 308 nm is used as the laser beam and if the antireflective film of silicon dioxide is used, the antireflective film preferably has a thickness of 20 nm to 80 nm, more preferably 30 nm to 70 nm, to achieve significant effects as the antireflective film. On the other hand, an antireflective film of silicon nitride preferably has a thickness of approximately 20-50 nm. In this preferred embodiment, a silicon dioxide film with a thickness of 45 nm is used. The silicon dioxide film may be deposited by a plasma CVD process using either TEOS and oxygen or $SiH_4$ and $N_2O$ as source gases.

Subsequently, as shown in FIG. 6(D), the crystalline silicon film 305a obtained by the heat treatment process is irradiated with a laser beam 308 and further re-crystallized, thereby obtaining a crystalline silicon film with an even higher degree of crystallinity. In this process step, an XeCl excimer laser beam (with a wavelength of 308 nm) was used as the laser beam. Also, in this process step, the sizes of the laser beam spot are determined so that an elongated beam spot is formed on the surface of the substrate 301. And by sequentially scanning the surface of the substrate 301 perpendicularly to the direction in which the beam spot is elongated, the crystalline silicon film gets re-crystallized over the entire surface of the substrate. In this case, if the surface is scanned so that the beam spots partially overlap with each other, an arbitrary point on the crystalline silicon film 305a will be irradiated with the laser beam multiple times, thus contributing to increasing the uniformity.

In this process step, the effective laser energy applied to the portion of the crystalline silicon film under the antireflective film 307 increases compared to the other regions where there is no underlying gate insulating film. Consequently, a crystalline silicon region 305b re-crystallized under the antireflective film 307 and a crystalline silicon region 305c re-crystallized under no antireflective film 307 will have mutually different degrees of crystallinity.

Also, in this process step, the degree of crystallinity is controlled by adjusting the irradiation energy of the laser beam. If an irradiation energy density, at which the degree of crystallinity almost reaches a local maximum, or an even lower energy density, is set with respect to a region of the crystalline silicon film under the antireflective film 307, the crystalline silicon region 305c under no antireflective film 307 will have a lower degree of crystallinity than the crystalline silicon region 305b under the antireflective film 307. In this preferred embodiment, the irradiation energy density of the laser beam is defined based on the data about the portion of the crystalline silicon film under the antireflective film 307. However, since the crystalline silicon film 305a that has already been crystallized by going through a heat treatment process with a catalyst element added is also irradiated in this preferred embodiment with the laser beam as in the second preferred embodiment, the average crystal grain size (i.e., domain size) has already been determined in the previous process step. Thus, in FIG. 11, the magnitudes of the surface unevenness (or ridges) are plotted as ordinates, thereby determining the irradiation energy density. Even if the magnitudes of the surface unevenness are plotted as ordinates in FIG. 11, a similar energy density dependence curve can be obtained to a situation where the average crystal grain sizes are plotted as ordinates.

That is to say, if the ordinates shown in FIG. 11 are replaced with the average surface roughness Ra of the crystalline silicon film, then the variation in energy in the regions of the crystalline silicon film under the antireflective film 307 is represented by the curve 901, while the variation in energy in the regions under no antireflective film 307 is represented by the curve 902. In this preferred embodiment, the irradiation energy density of the laser beam is set to be smaller than the energy density at which the average crystal grain size represented by the curve 901 (associated with the regions of the crystalline silicon film under the antireflective film 307 in this preferred embodiment) reaches the local maximum by 0 to 50 $mJ/cm^2$. For example, when the energy density at which the crystal grain size reached a local maximum was 300 $mJ/cm^2$, the crystalline silicon film was irradiated at an energy density of 290 $mJ/cm^2$, which is lower than the former value by 10 $mJ/cm^2$. In this case, the energy density of the laser beam should not be too high to avoid resetting the degree of crystallinity of the crystalline silicon region 305a obtained in the previous process step.

The crystalline silicon film 305a that has been obtained in this manner by the solid-phase crystallization as described above has had its crystal defects reduced by going through a melting and solidification process caused by the irradiation with the laser beam to be crystalline silicon regions 305b and 305c with an even higher degree of crystallinity. In this case, the crystalline silicon region 305b had an average surface roughness Ra of 7 nm to 10 nm and the crystalline silicon region 305c had an Ra of 1 nm to 3 nm. As for the TO phonon peak intensity of crystalline Si to be observed in the vicinity of 520 $cm^{-1}$ in a Raman microspectroscopy, the intensity in the crystalline silicon region 205b was approximately five to ten times as high as the intensity in the crystalline silicon region 205c. The average crystal grain size had already been determined during the crystallization process by the initial heat treatment and both of the crystalline silicon regions 305b and 305c had an average crystal grain size of 2 to 5 μm.

Thereafter, excessive portions of the crystalline silicon regions 305b and 305c are removed, thereby electrically isolating two element regions from each other. In this process step, the crystalline silicon region 305b is patterned as shown in FIG. 6(E) into an island of semiconductor region 309n to be the active region (including source/drain regions and a channel region) of an n-channel TFT that will form part of a driver circuit, an island of semiconductor region 309p to be the active region (including source/drain regions and a channel region) of a p-channel TFT, and an island of semiconductor region 309g to be the active region (including source/drain regions and a channel region) of an n-channel TFT to drive a pixel electrode. Meanwhile, the crystalline silicon region 305c is patterned into an island of semiconductor region 309d to be the active region (including $n^+$ and $p^+$ region and an intrinsic region) of a photosensor TFD.

After that, a TFT and a TFD are completed by the same process as the one that has already been described for the second preferred embodiment using these islands of semiconductor regions as the active regions of the TFT and TFD. According to this preferred embodiment, by using an antireflective film, the difference in the degree of crystallinity can be made even clearer compared to the second preferred embodiment. Also, based on the thickness of the antireflective film during that process step, the difference in the degree of crystallinity between the respective semiconductor layers to form parts of the TFT and TFD can be controlled more easily. Consequently, the respective semiconductor layers of the TFT and TFD and the channel region of the TFT and the intrinsic region of the TED can have their degrees of crystallinity optimized independently of each other. Then, the TFT will achieve a high field-effect mobility and a good switching characteristic, while the TFD will achieve a high photosensitivity. As a result, the device characteristics of the TFT and TFD can be optimized at the same time by using a single semiconductor layer obtained by crystallizing the same amorphous semiconductor film.

Embodiment 4

Figure 7:
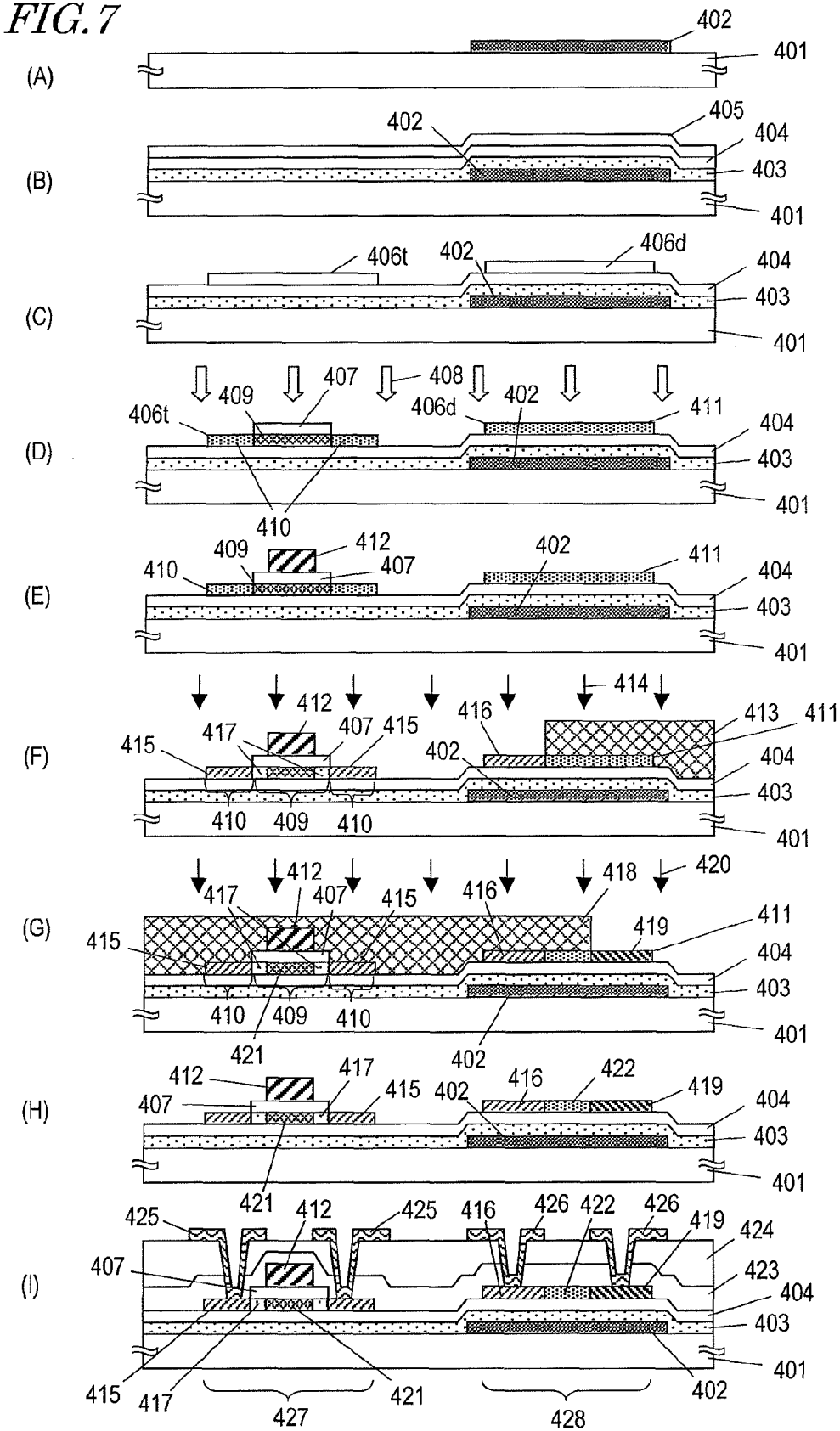
FIGS. 7(A) through 7(I) are schematic cross-sectional views illustrating respective manufacturing process steps to fabricate a semiconductor device as a fourth preferred embodiment of the present invention.

Hereinafter, a fourth preferred embodiment of the present invention will be described with reference to FIG. 7. Specifically, it will be described how to fabricate an n-channel TFT and a TFD on a glass substrate. FIGS. 7(A) through 7(I) are cross-sectional views illustrating the respective process steps to fabricate an n-channel thin-film transistor 427 and a thin-film diode 428 of this preferred embodiment. These process steps are carried out in the same order that these portions (A) through (I) of FIG. 7 are arranged.

First, in the process step shown in FIG. 7(A), a shielding layer 402 is formed on a substrate 401 by the same method as the one adopted in the other preferred embodiments of the present invention described above. This shielding layer 402 will work in the final product to shield the TFD from light coming from under the back surface of the substrate. In this preferred embodiment, a Mo film is deposited by a sputtering process and then patterned, thereby forming the shielding layer 402 shown in FIG. 7(A).

Next, as shown in FIG. 7(B), an undercoat film of silicon dioxide, silicon nitride or silicon oxynitride, for example, is deposited to prevent impurities from diffusing from the substrate 401. In this preferred embodiment, a silicon nitride film is deposited as the lower, first undercoat film 403, and then a second undercoat film 404 of silicon dioxide is deposited thereon. Next, an amorphous silicon film 405 (i.e., an a-Si film) is deposited to a thickness of 50 nm by a known process such as a plasma CVD process or a sputtering process.

Thereafter, excessive portions of the amorphous silicon film 405 are removed, thereby electrically isolating two element regions from each other. In this process step, the amorphous silicon film 405 is patterned into an island of semiconductor region 406t to be the active region (including source/drain regions and a channel region) of a TFT and an island of semiconductor region 406d to be the active region (including $n^+$ and $p^+$ regions and an intrinsic region) of a TFD as shown in FIG. 7(C).

Next, a gate insulating film 407 is formed so as to cover the center portion of the island of semiconductor region 406t to be the active region of a TFT. This gate insulating film 407 will serve as an antireflective film against the laser beam during the laser irradiation process. In this preferred embodiment, silicon dioxide was deposited over the entire surface of the substrate and then patterned into the shape of the gate insulating film 407 shown in FIG. 7(D). To make the gate insulating film 407 work as an antireflective film, its thickness counts as already described for the third preferred embodiment. In this preferred embodiment, the gate insulating film 407 has a thickness of 70 nm on the supposition that an XeCl excimer laser beam with a wavelength of 308 nm is used as the laser beam. The silicon dioxide film may be deposited by a plasma CVD process using either TEOS and oxygen or $SiH_4$ and $N_2O$ as source gases. In this preferred embodiment, a silicon dioxide film is deposited to a thickness of 70 nm by a plasma CVD process using TEOS and oxygen as source gases.

Subsequently, as shown in FIG. 7(D), the islands of semiconductor regions 406t and 406d, which are still amorphous silicon, are irradiated with a laser beam 408 and crystallized. In this process step, an XeCl excimer laser beam (with a wavelength of 308 nm) may be used as the laser beam. Also, in this process step, the sizes of the laser beam spot are determined so that an elongated beam spot is formed on the surface of the substrate 401. And by sequentially scanning the surface of the substrate 401 perpendicularly to the direction in which the beam spot is elongated, the amorphous silicon film gets crystallized over the entire surface of the substrate. In this case, if the surface is scanned so that the beam spots partially overlap with each other, an arbitrary point on the amorphous silicon film will be irradiated with the laser beam multiple times, thus contributing to increasing the uniformity.

In this process step, in the portion of the islands of semiconductor regions 406t and 406d covered with the gate insulating film 407, the gate insulating film serves as an antireflective film. As a result, the effective laser energy applied increases compared to the other regions where there is no gate insulating film. Consequently, a crystalline silicon region 409 crystallized under the gate insulating film 407 and crystalline silicon regions 410 and 411 crystallized without being covered with the gate insulating film 407 will have mutually different degrees of crystallinity.

In this process step, the degree of crystallinity is controlled by adjusting the irradiation energy of the laser beam. If an irradiation energy density, at which the degree of crystallinity almost reaches a local maximum, or an even lower energy density, is set with respect to a region of the crystalline silicon film covered with the gate insulating film 407, the crystalline silicon regions 410 and 411 not covered with the gate insulating film 407 will have a lower degree of crystallinity than the crystalline silicon region 409 covered with the gate insulating film 407. In this preferred embodiment, the irradiation energy density of the laser beam is defined based on the data about the portion of the crystalline silicon film covered with the gate insulating film 407.

In this preferred embodiment, the average crystal grain size shown in FIG. 11 is used in this process step as a parameter representing the degree of crystallinity. The average crystal grain size initially goes on increasing as the irradiation energy density of the laser beam is increased, but reaches a local maximum at a certain point and then starts to decrease. The gate insulating film for use as an antireflective film in this preferred embodiment would shift the entire curve to the left on the paper so that their abscissas (irradiation energy densities) decrease with respect to the same average crystal grain sizes. That is to say, the variation in energy in the regions covered with no antireflective film (gate insulating film) is represented by the curve 902 shown in FIG. 11, while the variation in energy in the region covered with the antireflective film (gate insulating film) is represented by the curve 901. That is why if an irradiation energy density, at which the average crystal grain size (representing the degree of crystallinity) almost reaches a local maximum, or an even lower energy density, is set with respect to a region of the silicon film covered with the antireflective film (gate insulating film), the crystalline silicon regions 410 and 411 not covered with the antireflective film (gate insulating film) 407 will have a smaller average crystal grain size than the crystalline silicon region 409 covered with the antireflective film (gate insulating film) 407 and will have a lower degree of crystallinity in terms of any other crystal parameter, too. In this preferred embodiment, the irradiation energy density of the laser beam is set to be smaller than the energy density at which the average crystal grain size represented by the curve 901 shown in FIG. 11 (associated with the region covered with the antireflective film (gate insulating film) 407 in this preferred embodiment) reaches the local maximum by 0 to 50 mJ/cm$^2$. For example, when the energy density at which the crystal grain size reached a local maximum was 340 mJ/cm$^2$, the amorphous silicon film was irradiated at an energy density of 330 mJ/cm$^2$, which is lower than the former value by 10 mJ/cm$^2$.

In the crystalline silicon film thus obtained, the crystalline silicon region 409 had an average crystal grain size of 200 nm to 300 nm and the crystalline silicon regions 410 and 411 had an average crystal grain size of 20 nm to 100 nm. Also, ridges were produced on the surface of the crystalline silicon film and had an average surface roughness Ra of 6 nm to 10 nm in the crystalline silicon region 409 and an Ra of 1 nm to 3 nm in the crystalline silicon regions 410 and 411. As for the TO phonon peak intensity of crystalline Si to be observed in the vicinity of 520 cm$^{-1}$ in a Raman microspectroscopy, the intensity in the crystalline silicon region 409 was approximately four to eight times as high as the intensity in the crystalline silicon regions 410 and 411.

Next, as shown in FIG. 7(E), a conductive film is deposited on the gate insulating film 407 by a sputtering process or a CVD process, for example, and then patterned into the shape of the gate electrode 412 of a TFT. In this process step, the conductive film is not deposited on the semiconductor region 411 to form part of a TFD. The conductive film to deposit in this process step may be a refractory metal such as tungsten (W) and may have a thickness of 450 nm, for example.

Thereafter, as shown in FIG. 7(F), a photoresist mask 413 is formed so as to partially cover the island of semiconductor region 411 to be the active region of a TFD, and ions 414 of an n-type dopant (such as phosphorus) are implanted into the entire surface of the substrate 401 from over it. As a result of this process step, the phosphorus ions 414 are implanted into a portion of the semiconductor layer 411 to form part of a TFD, which is not covered with the photoresist mask 413, and that portion will be the n$^+$ region 416 of the TFD. As for the crystalline silicon regions 409 and 410 to be the semiconductor layer of a TFT, on the other hand, the phosphorus ions 414 are implanted at a high dose into their portions that are not covered with the gate insulating film 407 and that will be the source/drain regions 415 of the TFT. In this case, as for the regions that are not covered with the gate electrode-to-be 412 but are covered with only the gate insulating film 407, the phosphorus ions 414 pass through the gate insulating film 407 and only some of those ions 414 are implanted lightly into those regions. Such regions will function as lightly doped drain (LDD) regions 417, which reduce not only the overconcentration of an electric field in the junctions between the channel region and the source/drain regions but also the amount of leakage current to flow while the TFT is in OFF state and can minimize deterioration to be caused by hot carriers. In this preferred embodiment, the heavily doped regions 415 and the lightly doped regions 417 are defined at the same time by performing a single doping process using the gate insulating film 407 as a sort of filter. However, the doping process may also be performed twice with the accelerating voltage and the dose optimized each time. Also, in this process step, the region covered with the gate electrode-to-be 412 and implanted with no phosphorus ions 414 will be the channel region of the TFT.

That is to say, the crystalline silicon region 409 with a relatively high degree of crystallinity will turn into the channel region 421 and LDD regions 417 as parts of the active region of a TFT, while the crystalline silicon region 410 with a relatively low degree of crystallinity will turn into the source/drain regions 415 as the other parts of the active region of the TFT. The ON-state characteristic of a TFT such as the field effect mobility thereof and the OFF-state characteristic thereof such as the OFF-state leakage current are both determined by the properties of the channel region and the LDD regions. That is why if these regions are made of a crystalline silicon film with a high degree of crystallinity, a TFT with good electrical characteristics can be obtained even when the source/drain regions thereof have a low degree of crystallinity.

Next, the photoresist 413 used as a mask in the previous process step is stripped and then another photoresist mask 418 is formed so as to cover a part of the island of semiconductor region 411 to be the active region of a TFD and entire island of semiconductor region to be the active region of a TFT (i.e., the crystalline silicon regions 409 and 410), and ions 420 of a p-type dopant (such as boron) are implanted into the entire surface of the substrate 401 from over it as shown in FIG. 7(G). As a result of this process step, the boron ions 420 are implanted into a portion of the semiconductor layer 411 to form part of a TFD, which is not covered with the photoresist mask 418. That is to say, no boron ions 420 are introduced into the regions covered with the mask 418. Consequently, that portion of the semiconductor layer 411 to form part of a TFD, implanted with the boron ions 420, will be the p$^+$ region 419 of the TFD, while the portion implanted with no phosphorus ions in the previous process step, either, will be the intrinsic region 422 thereof.

Subsequently, the photoresist mask 418 is stripped. This is a state as shown in FIG. 7(H). And then the substrate is thermally treated within an inert atmosphere (e.g., a nitrogen gas ambient). As a result of this heat treatment process, various doping damages such as crystal defects that have been caused during the ion implantation process steps in the portions to be the source/drain regions 415 and LDD regions 417 of a TFT and in the portions to be the n+ and p+ regions 416 and 419 of a TFD are repaired and the phosphorus and boron dopant atoms introduced there are activated.

Thereafter, as shown in FIG. 7(I), a silicon dioxide film and/or a silicon nitride film is/are deposited as an interlevel dielectric film. In this preferred embodiment, the interlevel dielectric film has a dual layer structure consisting of a silicon nitride film 423 and a silicon dioxide film 424. After that, contact holes are cut through the interlevel dielectric film and a metallic material is deposited thereon and patterned into electrodes and interconnects 425 and 426 to form parts of a TFT and a TFD.

Finally, this structure is annealed at a temperature of 350° C. to 450° C. within either a nitrogen gas ambient or a hydrogen gas mixed ambient at the atmospheric pressure, thereby completing a thin-film transistor 427 and a thin-film diode 428 as shown in FIG. 7(I). Optionally, to protect these devices, a passivation film of silicon nitride, for example, may be deposited over the thin-film transistor 427 and the thin-film diode 428.

According to the preferred embodiment described above, the channel region of the TFT and the intrinsic region of the TFD can have their degrees of crystallinity optimized independently of each other. Then, the TFT will achieve a high field-effect mobility and a good switching characteristic, while the TFD will achieve a high photosensitivity. As a result, the device characteristics of the TFT and TFD can be optimized at the same time by using a single semiconductor layer obtained by crystallizing the same amorphous semiconductor film.

Also, according to this preferred embodiment, the antireflective film deposited over the portion to be the channel region of a TFT is used as it is as a gate insulating film to form part of a semiconductor element. That is why there is no need to perform an additional process step of forming the antireflective film unlike the third preferred embodiment. As a result, the manufacturing process can be simplified and the manufacturing cost of the semiconductor device can be cut down.

Embodiment 5

Figure 8:
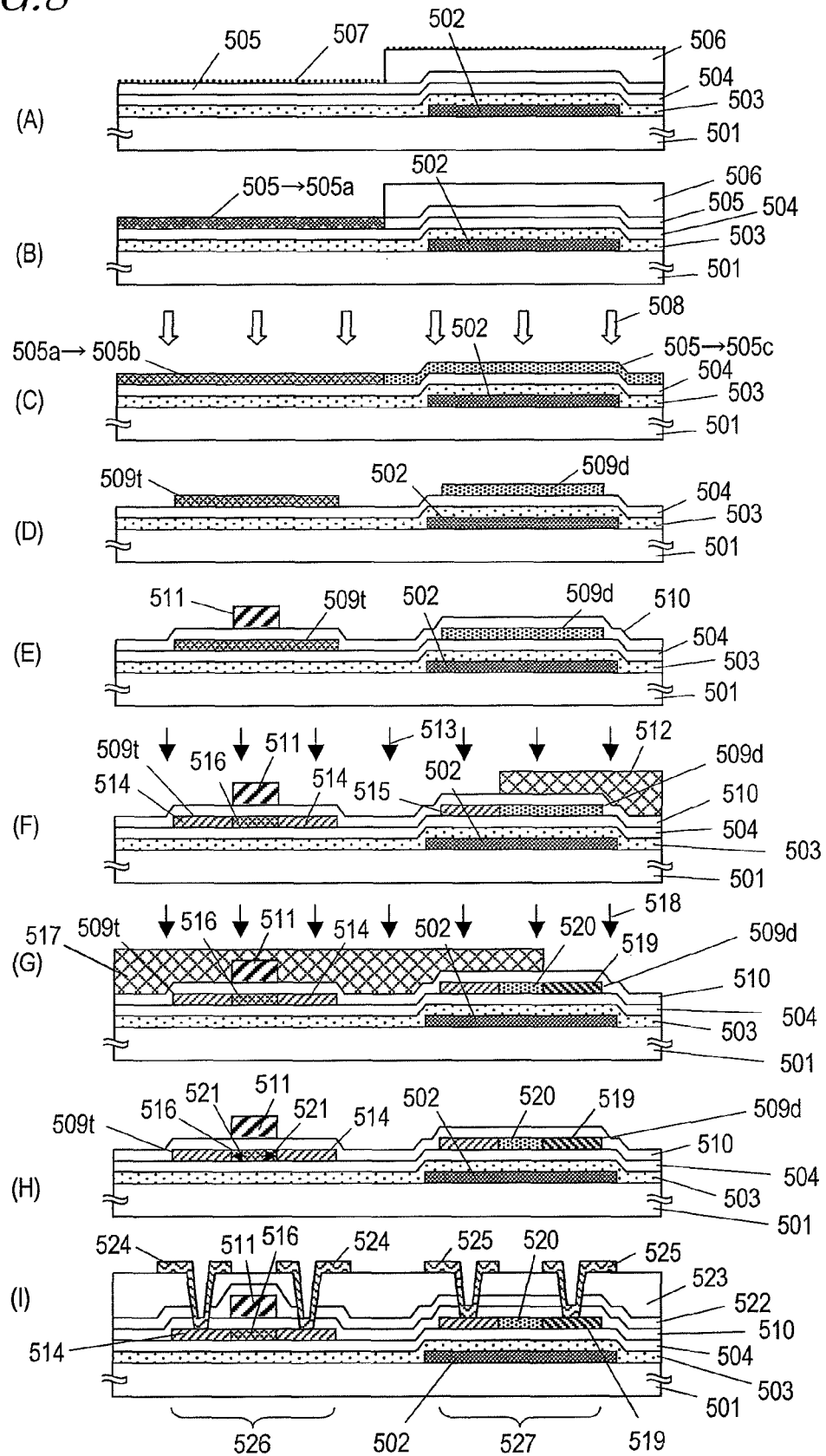
FIGS. 8(A) through 8(I) are schematic cross-sectional views illustrating respective manufacturing process steps to fabricate a semiconductor device as a fifth preferred embodiment of the present invention.

Hereinafter, a fifth preferred embodiment of the present invention will be described with reference to FIG. 8. Specifically, it will be described how to fabricate an n-channel TFT and a TFD on a glass substrate by a different process from those of the first through fourth preferred embodiments described above. FIGS. 8(A) through 8(I) are cross-sectional views illustrating the respective process steps to fabricate an n-channel thin-film transistor 526 and a thin-film diode 527 of this preferred embodiment. These process steps are carried out in the same order that these portions (A) through (I) of FIG. 8 are arranged.

First, in the process step shown in FIG. 8(A), a shielding layer 502 is formed on a substrate 501 by the same method as the one adopted in the other preferred embodiments of the present invention described above. This shielding layer 502 will work in the final product to shield the TFD from light coming from under the back surface of the substrate. In this preferred embodiment, a Mo film is deposited by a sputtering process and then patterned, thereby forming the shielding layer 502. Subsequently, a silicon oxynitride film is deposited as the lower, first undercoat film 503, and then a second undercoat film 504 of silicon dioxide is deposited thereon by the same method as the one adopted in the first through fourth preferred embodiments described above so as to cover the glass substrate 501 and the shielding layer 502. Next, an amorphous silicon film 505 is deposited to a thickness of 40 nm, for example. In this process step, the undercoat insulating films and the amorphous silicon film may be deposited continuously without exposing them to the air.

Next, a masking insulating film 506 of silicon dioxide is deposited to a thickness of approximately 200 nm and then patterned to have an opening. As a result, the amorphous silicon film 505 is exposed through the opening as shown in FIG. 8(A).

Thereafter, the surface of the substrate is coated with an aqueous solution including approximately 1 to 10 ppm (e.g., 6 ppm) by weight of catalyst element (e.g., nickel in this preferred embodiment) such as an aqueous solution of nickel acetate by a spin coating process, thereby forming a catalyst element layer 507. In this case, the concentration of the catalyst element has been converted into weight. Then, the catalyst element added locally contacts with the amorphous silicon film 505 inside the opening of the masking insulating film 506, thereby defining a catalyst element added region there. This is the state illustrated in FIG. 8(A).

Subsequently, the substrate is thermally treated at a temperature of 500° C. to 650° C. (preferably in the range of 550° C. to 600° C.) for any required length of time between 30 minutes and 10 hours. In this preferred embodiment, the substrate is heat-treated at 590° C. for an hour. As a result, as shown in FIG. 8(B), crystal nuclei are generated in the catalyst element added region, thereby crystallizing that portion of the amorphous silicon film into a crystalline silicon region 505a. Meanwhile, the nickel atoms 507 on the masking insulating film 506 are prevented by the masking insulating film 506 from reaching the underlying amorphous silicon film, thus leaving the rest of the amorphous silicon film still amorphous.

Next, after the masking insulating film 506 of silicon dioxide has been removed, the silicon film, including both the crystalline silicon region 505a and the amorphous silicon regions, is irradiated with a laser beam 508 as shown in FIG. 8(C). In this process step, an XeCl excimer laser beam (with a wavelength of 308 nm) may be used as the laser beam as in the first through fourth preferred embodiments described above. And the surface is scanned so that the beam spots partially overlap with each other and that an arbitrary point on the silicon film will be irradiated with the laser beam multiple times, thus contributing to increasing the uniformity.

The crystalline silicon region 505a that has been selectively crystallized with the addition of the catalyst element has had its crystal defects reduced by going through a melting and solidification process caused by the irradiation with the laser beam 508 and also re-crystallizes using some of them as nuclei of crystal growth. As a result, the crystalline silicon region 505a turns into a crystalline silicon region 505b with an even higher degree of crystallinity. Meanwhile, the amorphous regions are crystallized by going through the melting and solidification process caused by the irradiation with the laser beam 508 to turn into a crystalline silicon region 505c. In this process step, the laser beam was radiated at an energy density of 250 mJ/cm$^2$ to 450 mJ/cm$^2$ (e.g., 350 mJ/cm$^2$). In this case, the energy density of the laser beam should not be too high to avoid resetting the degree of crystallinity of the crystalline silicon region 505a in the previous process step.

In this case, the crystallographic plane orientations of the crystalline silicon region 505b thus obtained have already been almost determined in the solid-phase crystallization process step using the catalyst element. Specifically, the majority of the crystalline silicon region 505b is comprised of a <111> zone. Among other things, (110) and (211) planes account for 50% or more of all crystal planes. And the crystalline silicon region 505b has an average crystal grain size (corresponding to the domain size of a crystal domain (i.e., a region with substantially the same plane orientation)) of 2 μm to 5 μm. On the other hand, the crystalline silicon region 505c that has been crystallized from the amorphous state by being irradiated with the laser beam has random crystallographic plane orientations, which include a lot of (100) planes and (111) planes, in particular. Those (100) and (111) planes do not fall into the <111> zone. And the crystalline silicon region 505c has an average crystal grain size of 100 nm to 300 nm, which is smaller than that of the crystalline silicon region 505b by more than one digit.

Thereafter, excessive portions of the crystalline silicon regions 505b and 505c are removed, thereby electrically isolating two element regions from each other. In this process step, the finely crystallized region 505b of the crystalline silicon film is patterned into an island of semiconductor region 509t to be the active region (including source/drain regions and a channel region) of a TFT and the crystalline silicon region 505c is patterned into an island of semiconductor region 509d to be the active region (including n⁺ and p⁺ regions and an intrinsic region) of a TFD as shown in FIG. 8(D).

Next, as shown in FIG. 8(E), a gate insulating film 510 is deposited over these islands of semiconductor regions 509t and 509d. As the gate insulating film 510, silicon dioxide is preferably deposited to a thickness of 20 nm to 150 nm. In this preferred embodiment, a silicon dioxide film is deposited to a thickness of 100 nm.

Subsequently, a conductive film is deposited on the gate insulating film 510 by a sputtering process or a CVD process, for example, and then patterned into the shape of the gate electrode 511 of a TFT. In this process step, the conductive film is not deposited on the semiconductor layer 509d to form part of a TFD. The conductive film to deposit in this process step is preferably a refractory metal (e.g., W in this preferred embodiment).

Thereafter, as shown in FIG. 8(F), a photoresist mask 512 is formed on the gate insulating film 510 so as to partially cover the island of semiconductor region 509d to be the active region of a TFD, and ions 513 of an n-type dopant (such as phosphorus) are implanted into the entire surface of the substrate 501 from over it. In this process step, the phosphorus ions 513 pass through the gate insulating film 510 and are implanted into the semiconductor layers 509t and 509d. As a result of this process step, the phosphorus ions 513 are implanted into a portion of the semiconductor layer 509d to form part of a TFD, which is not covered with the photoresist mask 512, and into portions of the semiconductor layer 509t to form part of a TFT, which are not covered with the gate electrode-to-be 511. That is to say, no phosphorus ions 513 are introduced into the regions covered with the photoresist mask 512 and the gate electrode-to-be 511. Consequently, those portions of the semiconductor layer 509t to form part of a TFT, implanted with the phosphorus ions 513, will be the source/drain regions 514 of the TFT, while the portion masked with the gate electrode-to-be 511 and implanted with no phosphorus ions 513 will be the channel region 516 of the TFT. On the other hand, the portion of the semiconductor layer 509d to form part of a TFD, implanted with the phosphorus ions 513, will be the n⁺ region 515 of the TFD.

Next, the photoresist mask 512 used in the previous process step is stripped and then another photoresist mask 517 is formed as shown in FIG. 8(G) on the gate insulating film 510 so as to cover a part of the island of semiconductor region 509d to be the active region of a TFD and entire island of semiconductor region 509t to be the active region of a TFT, and ions 518 of a p-type dopant (such as boron) are implanted into the entire surface of the substrate from over it. As a result of this process step, the boron ions 518 are implanted into a portion of the semiconductor layer 509d to form part of a TFD, which is not covered with the photoresist mask 517. That is to say, no boron ions 518 are introduced into the regions covered with the photoresist mask 517. Consequently, that portion of the semiconductor layer 509d to form part of a TFD, implanted with the boron ions 518, will be the p⁺ region 519 of the TFD, while the portion implanted with no phosphorus ions in the previous process step, either, will be the intrinsic region 520 thereof.

Subsequently, the photoresist 517 used as a mask in the previous process step is stripped and then the substrate is thermally treated within an inert atmosphere (e.g., a nitrogen gas ambient). As a result of this heat treatment process, the phosphorus atoms that have been introduced into the portions of the semiconductor layer 509t to be the source/drain regions of a TFT will increase the concentration of nickel solid solution in those regions, thereby moving the nickel atoms from the channel region 516 to the source/drain regions in the directions indicated by the arrows 521 as shown in FIG. 8(H). Since the nickel atoms have come into the source/drain regions 514 of the TFT as a result of the heat treatment process, the concentration of nickel in those regions becomes higher than other regions. Also as a result of this process step, various doping damages such as crystal defects that have been caused during the ion implantation process steps in the portions to be the source/drain regions 514 of the TFT and in the portions to be the n⁺ and p⁺ regions 515 and 519 of a TFD are repaired and the phosphorus and boron dopant atoms introduced there are activated. As a result, the source/drain regions 514 of the TFT and the n⁺ and p⁺ regions 515 and 519 of the TFD can have their resistance reduced. The heat treatment process of this process step may be carried out with a normal heating furnace but is preferably performed as a rapid thermal annealing (RTA). In this preferred embodiment, the RTA process is carried out by loading a number of substrates one by one into a high-temperature atmosphere and raising or lowering the temperature of each substrate rapidly by spraying a high-temperature nitrogen gas against the surface of the substrate. This process is preferably carried out at a temperature rise/fall rate of more than 200° C./min. For example, the substrate was heated to 680° C. for seven minutes. However, this heat treatment may also be carried out by any other method and its conditions may also be arbitrarily determined by the person who performs the treatment.

Thereafter, as shown in FIG. 8(I), a silicon dioxide film and/or a silicon nitride film is/are deposited as an interlevel dielectric film. In this preferred embodiment, the interlevel dielectric film has a dual layer structure consisting of a silicon nitride film 522 and a silicon dioxide film 523. After that, contact holes are cut through the interlevel dielectric film and a metallic material is deposited thereon and patterned into electrodes and interconnects 524 and 525 to form parts of a TFT and a TFD.

Finally, this structure is annealed at a temperature of 350° C. to 450° C. within either a nitrogen gas ambient or a hydrogen gas mixed ambient at the atmospheric pressure, thereby completing a thin-film transistor 526 and a thin-film diode 527 as shown in FIG. 8(I). Optionally, to protect these devices, a passivation film of silicon nitride, for example, may be deposited over the thin-film transistor 526 and the thin-film diode 527.

According to the preferred embodiment described above, the channel region of the TFT and the intrinsic region of the TFD can have their degrees of crystallinity optimized independently of each other. Then, the TFT will achieve a high field-effect mobility and a good switching characteristic, while the TFD will achieve a high photosensitivity. Specifically, according to this preferred embodiment, the semiconductor layer to form part of the TFT is obtained as a crystalline silicon film that has been crystallized in solid phase with a catalyst element added and has its degree of crystallinity increased with the irradiation with the laser beam. On the other hand, the semiconductor layer to form part of the TFD is obtained as a crystalline silicon film that has been crystallized from an amorphous state by being irradiated with the laser beam. By making the degrees of crystallinity of the respective semiconductor layers of the TFT and TFD more clearly different by adopting intentionally different crystallization methods as described above, a TFT that should have high current drivability and a TFD used as a photosensor can have their device characteristics optimized at the same time by using a single semiconductor layer obtained by crystallizing the same amorphous semiconductor film.

Embodiment 6

Figure 9:
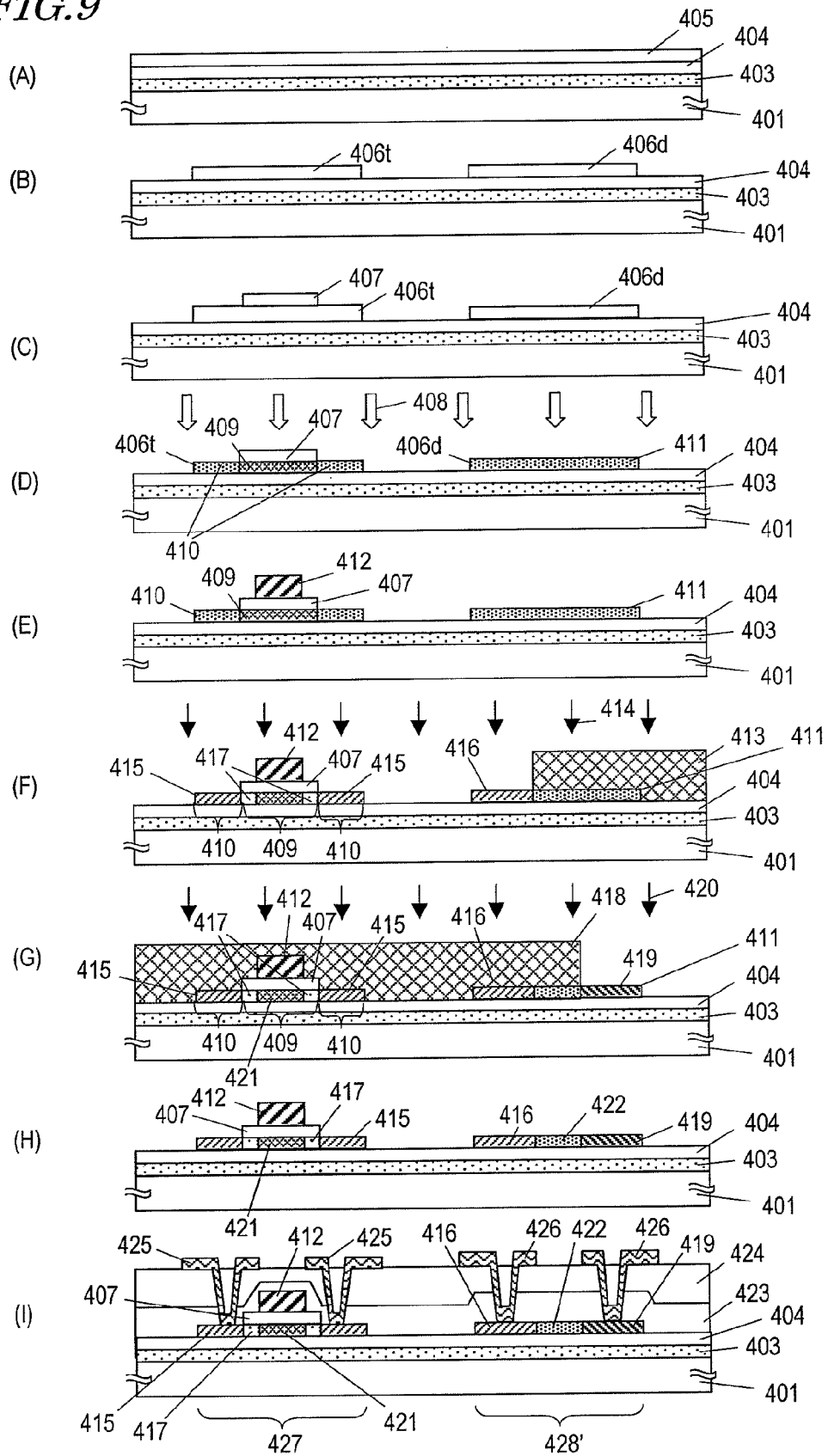
FIGS. 9(A) through 9(I) are schematic cross-sectional views illustrating respective manufacturing process steps to fabricate a semiconductor device as a sixth preferred embodiment of the present invention.

Hereinafter, a sixth preferred embodiment of the present invention will be described with reference to FIG. 9. In this preferred embodiment, an n-channel TFT and a TFD are fabricated on a glass substrate by a similar method to what has already been described for the fifth preferred embodiment. However, unlike the fifth preferred embodiment, no heat sink layer is provided in this preferred embodiment between the TFD and the substrate. Thus, this preferred embodiment is effectively applicable for use in a semiconductor device in which there is no need to provide any shielding film behind the TFD (such as an organic EL device).

First of all, as shown in FIG. 9(A), an undercoat film of silicon dioxide, silicon nitride or silicon oxynitride, for example, is deposited on the substrate 401 to prevent impurities from diffusing from the substrate 401. In this preferred embodiment, a silicon nitride film is deposited as the lower, first undercoat film 403 and then a second undercoat film 404 of silicon dioxide is deposited thereon. Subsequently, an amorphous silicon film (a-Si) 405 is deposited to a thickness of 50 nm by a known process such as a plasma CVD process or a sputtering process.

Thereafter, excessive portions of the amorphous silicon film 405 are removed, thereby electrically isolating two element regions from each other. In this process step, the amorphous silicon film 405 is patterned into an island of semiconductor region 406t to be the active region (including source/drain regions and a channel region) of a TFT and an island of semiconductor region 406d to be the active region (including $n^+$ and $p^+$ regions and an intrinsic region) of a TFD as shown in FIG. 9(B).

Next, as shown in FIG. 9(C), a gate insulating film 407 is formed so as to cover the center portion of the island of semiconductor region 406t to be the active region of a TFT among those islands of semiconductor regions 406t and 406d. This gate insulating film 407 will serve as an antireflective film against the laser beam during the laser irradiation process. In this preferred embodiment, silicon dioxide was deposited over the entire surface of the substrate and then patterned into the shape of the gate insulating film 407 shown in FIG. 9(C). To make the gate insulating film 407 work as an antireflective film, its thickness counts as already described for the third preferred embodiment. In this preferred embodiment, the gate insulating film 407 has a thickness of 70 nm on the supposition that an XeCl excimer laser beam with a wavelength of 308 nm is used as the laser beam. The silicon dioxide film may be deposited by a plasma CVD process using either TEOS and oxygen or $SiH_4$ and $N_2O$ as source gases. In this preferred embodiment, a silicon dioxide film is deposited to a thickness of 70 nm by a plasma CVD process using TEOS and oxygen as source gases.

Subsequently, as shown in FIG. 9(D), the islands of semiconductor regions 406t and 406d, which are still amorphous silicon, are irradiated with a laser beam 408 and crystallized. In this process step, an XeCl excimer laser beam (with a wavelength of 308 nm) may be used as the laser beam. Also, in this process step, the sizes of the laser beam spot are determined so that an elongated beam spot is formed on the surface of the substrate 401. And by sequentially scanning the surface of the substrate 401 perpendicularly to the direction in which the beam spot is elongated, the amorphous silicon film gets crystallized over the entire surface of the substrate. In this case, if the surface is scanned so that the beam spots partially overlap with each other, an arbitrary point on the amorphous silicon film will be irradiated with the laser beam multiple times, thus contributing to increasing the uniformity.

In this process step, in the portion of the islands of semiconductor regions 406t and 406d covered with the gate insulating film 407, the gate insulating film serves as an antireflective film. As a result, the effective laser energy applied increases compared to the other regions where there is no gate insulating film. Consequently, a crystalline silicon region 409 crystallized under the gate insulating film 407 and crystalline silicon regions 410 and 411 crystallized without being covered with the gate insulating film 407 will have mutually different degrees of crystallinity.

In this process step, the degrees of crystallinity of the respective crystalline silicon regions 409, 410 and 411 are controlled by adjusting the irradiation energy of the laser beam. If an irradiation energy density, at which the degree of crystallinity almost reaches a local maximum, or an even lower energy density, is set with respect to a region of the crystalline silicon film covered with the gate insulating film 407, the crystalline silicon regions 410 and 411 not covered with the gate insulating film 407 will have a lower degree of crystallinity than the crystalline silicon region 409 covered with the gate insulating film 407. In this preferred embodiment, the irradiation energy density of the laser beam is defined based on the data about the portion of the crystalline silicon film covered with the gate insulating film 407.

In this preferred embodiment, the average crystal grain size shown in FIG. 11 is used in this process step as a parameter representing the degree of crystallinity. The average crystal grain size initially goes on increasing as the irradiation energy density of the laser beam is increased, but reaches a local maximum at a certain point and then starts to decrease. The gate insulating film for use as an antireflective film in this preferred embodiment would shift the entire curve to the left on the paper so that their abscissas (irradiation energy densities) decrease with respect to the same average crystal grain sizes. That is to say, the variation in energy in the regions covered with no antireflective film (gate insulating film) is represented by the curve 902 shown in FIG. 11, while the variation in energy in the region covered with the antireflective film (gate insulating film) is represented by the curve 901. That is why if an irradiation energy density, at which the average crystal grain size (representing the degree of crystallinity) almost reaches a local maximum, or an even lower energy density, is set with respect to a region of the silicon film covered with the antireflective film (gate insulating film), the crystalline silicon regions 410 and 411 not covered with the antireflective film (gate insulating film) 407 will have a smaller average crystal grain size than the crystalline silicon region 409 covered with the antireflective film (gate insulating film) 407 and will have a lower degree of crystallinity in terms of any other crystal parameter, too. In this preferred embodiment, the irradiation energy density of the laser beam is set to be smaller by 0 to 50 mJ/cm$^2$ than the energy density at which the average crystal grain size represented by the curve 901 shown in FIG. 11 (associated with the region covered with the antireflective film (gate insulating film) 407 in this preferred embodiment) reaches the local maximum. For example, when the energy density at which the crystal grain size reached a local maximum was 340 mJ/cm$^2$, the amorphous silicon film was irradiated at an energy density of 330 mJ/cm$^2$, which is lower than the former value by 10 mJ/cm$^2$.

In the crystalline silicon film thus obtained, the crystalline silicon region 409 had an average crystal grain size of 200 nm to 300 nm and the crystalline silicon regions 410 and 411 had an average crystal grain size of 20 nm to 100 nm. Also, ridges were produced on the surface of the crystalline silicon film and had an average surface roughness Ra of 6 nm to 10 nm in the crystalline silicon region 409 and an Ra of 1 nm to 3 nm in the crystalline silicon regions 410 and 411. As for the TO phonon peak intensity of crystalline Si to be observed in the vicinity of 520 cm$^{-1}$ in a Raman microspectroscopy, the intensity in the crystalline silicon region 409 was approximately four to eight times as high as the intensity in the crystalline silicon regions 410 and 411.

Next, as shown in FIG. 9(E), a conductive film is deposited on the gate insulating film 407 by a sputtering process or a CVD process, for example, and then patterned into the shape of the gate electrode 412 of a TFT. In this process step, the conductive film is not deposited on the semiconductor region 411 to form part of a TFD. The conductive film to deposit in this process step may be a refractory metal such as tungsten (W) and may have a thickness of 450 nm, for example.

Thereafter, as shown in FIG. 9(F), a photoresist mask 413 is formed so as to partially cover the island of semiconductor region 411 to be the active region of a TFD, and ions 414 of an n-type dopant (such as phosphorus) are implanted into the entire surface of the substrate 401 from over it. As a result of this process step, the phosphorus ions 414 are implanted into a portion of the semiconductor layer 411 to form part of a TFD, which is not covered with the photoresist mask 413, and that portion will be the n$^+$ region 416 of the TFD. As for the crystalline silicon regions 409 and 410 to be the semiconductor layer of a TFT, on the other hand, the phosphorus ions 414 are implanted at a high dose into their portions that are not covered with the gate insulating film 407 and that will be the source/drain regions 415 of the TFT. In this case, as for the regions that are not covered with the gate electrode-to-be 412 but are covered with only the gate insulating film 407, the phosphorus ions 414 pass through the gate insulating film 407 and only some of those ions 414 are implanted lightly into those regions. Such regions will function as lightly doped drain (LDD) regions 417, which reduce not only the overconcentration of an electric field in the junctions between the channel region and the source/drain regions but also the amount of leakage current to flow while the TFT is in OFF state and can minimize deterioration to be caused by hot electrons. In this preferred embodiment, the heavily doped regions 415 and the lightly doped regions 417 are defined at the same time by performing a single doping process using the gate insulating film 407 as a sort of filter. However, the doping process may also be performed twice with the accelerating voltage and the dose optimized each time. Also, in this process step, the region covered with the gate electrode-to-be 412 and implanted with no phosphorus ions 414 will be the channel region of the TFT.

That is to say, the crystalline silicon region 409 with a relatively high degree of crystallinity will turn into the channel region 421 and LDD regions 417 as parts of the active region of a TFT, while the crystalline silicon region 410 with a relatively low degree of crystallinity will turn into the source/drain regions 415 as the other parts of the active region of the TFT. The ON-state characteristic of a TFT such as the field effect mobility thereof and the OFF-state characteristic thereof such as the OFF-state leakage current are both determined by the properties of the channel region and the LDD regions. That is why if these regions are made of a crystalline silicon film with a high degree of crystallinity, a TFT with good electrical characteristics can be obtained even when the source/drain regions thereof have a low degree of crystallinity.

Next, the photoresist 413 used as a mask in the previous process step is stripped and then another photoresist mask 418 is formed so as to cover a part of the island of semiconductor region 411 to be the active region of a TFD and entire island of semiconductor region to be the active region of a TFT (i.e., the crystalline silicon regions 409 and 410), and ions 420 of a p-type dopant (such as boron) are implanted into the entire surface of the substrate 401 from over it as shown in FIG. 9(G). As a result of this process step, the boron ions 420 are implanted into a portion of the semiconductor layer 411 to form part of a TFD, which is not covered with the photoresist mask 418. That is to say, no boron ions 420 are introduced into the regions covered with the mask 418. Consequently, that portion of the semiconductor layer 411 to form part of a TFD, implanted with the boron ions 420, will be the p$^+$ region 419 of the TFD, while the portion implanted with no phosphorus ions in the previous process step, either, will be the intrinsic region 422 thereof.

Subsequently, the photoresist mask 418 is stripped. This is a state as shown in FIG. 9(H). And then the substrate is thermally treated within an inert atmosphere (e.g., a nitrogen gas ambient). As a result of this heat treatment process, various doping damages such as crystal defects that have been caused during the ion implantation process steps in the portions to be the source/drain regions 415 and LDD regions 417 of a TFT and in the portions to be the n$^+$ and p$^+$ regions 416 and 419 of a TFD are repaired and the phosphorus and boron dopant atoms introduced there are activated.

Thereafter, as shown in FIG. 9(I), a silicon dioxide film and/or a silicon nitride film is/are deposited as an interlevel dielectric film. In this preferred embodiment, the interlevel dielectric film has a dual layer structure consisting of a silicon nitride film 423 and a silicon dioxide film 424. After that, contact holes are cut through the interlevel dielectric film and a metallic material is deposited thereon and patterned into electrodes and interconnects 425 and 426 to form parts of a TFT and a TFD.

Finally, this structure is annealed at a temperature of 350° C. to 450° C. within either a nitrogen gas ambient or a hydrogen gas mixed ambient at the atmospheric pressure, thereby completing a thin-film transistor 427 and a thin-film diode 428' as shown in FIG. 9(I). Optionally, to protect these devices, a passivation film of silicon nitride, for example, may be deposited over the thin-film transistor 427 and the thin-film diode 428'.

According to the preferred embodiment described above, the channel region of the TFT and the intrinsic region of the TFD can have their degrees of crystallinity optimized independently of each other. Then, the TFT will achieve a high field-effect mobility and a good switching characteristic, while the TFD will achieve a high photosensitivity. As a result, the device characteristics of the TFT and TFD can be optimized at the same time by using a single semiconductor layer obtained by crystallizing the same amorphous semiconductor film.

Also, according to this preferred embodiment, the antireflective film deposited over the portion to be the channel region of a TFT is used as it is as a gate insulating film to form part of a semiconductor element. That is why there is no need to perform an additional process step of forming the antireflective film unlike the third preferred embodiment. As a result, the manufacturing process can be simplified and the manufacturing cost of the semiconductor device can be cut down.

In this preferred embodiment, the amorphous semiconductor film is crystallized by the same method as the one already described for the fifth preferred embodiment. Alternatively, as in the second preferred embodiment described above, only a portion of the amorphous silicon film may be crystallized by a heat treatment process using a catalyst element and then irradiated with a laser beam to obtain a crystalline semiconductor film.

As described above, this preferred embodiment of the present invention is effectively applicable to an organic EL display device. For example, if a transparent electrode layer, an electroluminescence layer, and an upper electrode layer are stacked in this order over a substrate on which the thin-film transistor 427 and the thin-film diode 428' have been formed by the method described above, a bottom-emission type organic EL display device can be fabricated. Alternatively, a top-emission type organic EL display device may also be fabricated by forming a transparent electrode as the upper electrode layer. In that case, the substrate 401 does not have to be a light-transmitting one.

Embodiment 7

Figure 10:
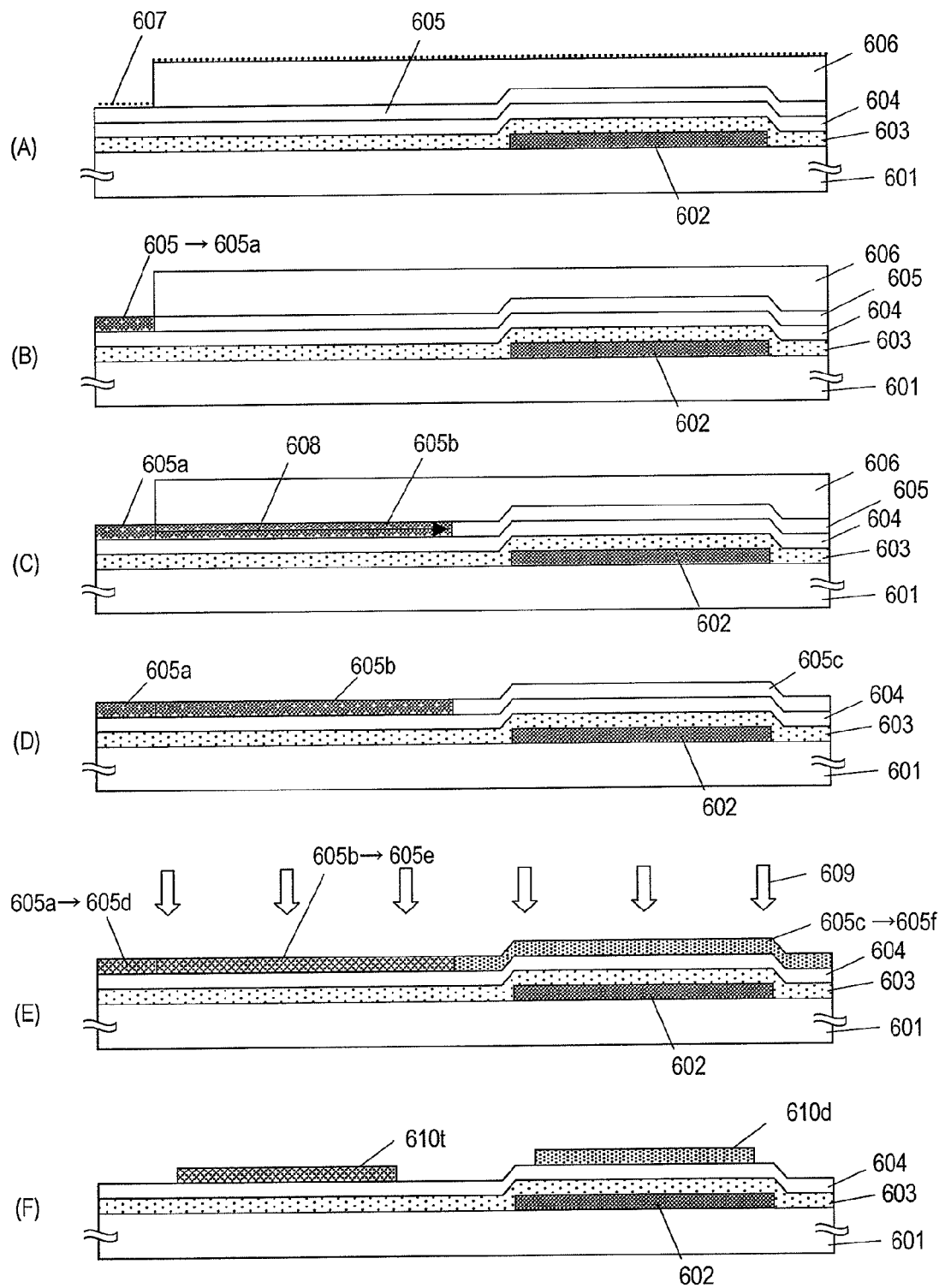
FIGS. 10(A) through 10(F) are schematic cross-sectional views illustrating respective manufacturing process steps to fabricate a semiconductor device as a seventh preferred embodiment of the present invention.

Hereinafter, it will be described with reference to FIG. 10 how to fabricate an n-channel TFT and a TFD on a glass substrate by yet another crystallization process that is different from any of the methods of the first through sixth preferred embodiments. FIG. 10 shows cross-sectional views illustrating the respective manufacturing process steps of this preferred embodiment. These process steps are carried out in the same order that these portions (A) through (F) of FIG. 10 are arranged.

First, a shielding layer 602 of Mo or any other suitable material is deposited on a substrate 601 (of glass in this preferred embodiment) by the same method as the one adopted in the first through sixth preferred embodiments of the present invention described above. Subsequently, a silicon nitride film is deposited as the lower, first undercoat film 603, and then a second undercoat film 604 of silicon dioxide is deposited thereon to prevent impurities from diffusing from the substrate. Next, an amorphous silicon film 605 is deposited thereon to a thickness of 30 nm to 80 nm, for example, by the same method as the one adopted in the first through sixth preferred embodiments. In this process step, the undercoat insulating films and the amorphous silicon film may be deposited continuously without exposing them to the air.

Next, a masking insulating film 606 of silicon dioxide is deposited to a thickness of approximately 200 nm. The masking insulating film has an opening to introduce a catalyst element into the semiconductor films as shown in FIG. 10(A).

Thereafter, the surface of the substrate is coated with an aqueous solution including approximately 100 ppm by weight of catalyst element (e.g., nickel in this preferred embodiment) such as an aqueous solution of nickel acetate by a spin coating process, thereby forming a catalyst element layer 607. In this case, the concentration of the catalyst element has been converted into weight. Then, the catalyst element in the catalyst element layer 607 locally contacts with the amorphous silicon film 605 inside the opening of the masking insulating film 606, thereby defining a catalyst element added region there. This is the state illustrated in FIG. 10(A).

In this preferred embodiment, nickel is supposed to be introduced by a spin coating process. However, a thin film of a catalyst element (e.g., a nickel film in this preferred embodiment) may be formed on the amorphous silicon film by an evaporation process or a sputtering process, for example.

Subsequently, the substrate is thermally treated at a temperature of 500° C. to 650° C. (preferably in the range of 550° C. to 600° C.) for any required length of time between 6 to hours (preferably 8-15 hours). In this preferred embodiment, the substrate is heat-treated at 590° C. for six hours. As a result, as shown in FIG. 10(B), crystal nuclei are generated in the catalyst element added region, thereby crystallizing that portion of the amorphous silicon film first into a crystalline silicon region 605a. After that, the crystallization further progresses substantially parallel to the substrate (i.e., in the direction indicated by the arrow 608) from the crystalline silicon region 605a that has already been crystallized, thereby defining a crystalline silicon region 605b, of which the crystal growing directions are substantially uniform macroscopically, as shown in FIG. 10(C). Meanwhile, the nickel atoms on the masking insulating film 606 are prevented by the masking insulating film 606 from reaching the underlying amorphous silicon film. Therefore, the amorphous silicon film 605 gets crystallized only by the nickel atoms introduced through the opening. Also, the region in which the lateral crystal growth has never occurred remains amorphous silicon region 605c. After that, the masking insulating film (of silicon dioxide) 606 is removed to realize the state shown in FIG. 10(D).

Next, the silicon film, including both the crystalline silicon regions 605a and 605b and the amorphous silicon region 605c, is irradiated with a laser beam 609 as shown in FIG. 10(E). In this process step, an XeCl excimer laser beam (with a wavelength of 308 nm) may be used as the laser beam as in the first through sixth preferred embodiments described above. And the surface is scanned so that the beam spots partially overlap with each other and that an arbitrary point on the silicon film will be irradiated with the laser beam multiple times, thus contributing to increasing the uniformity.

The crystalline silicon regions 605a and 605b that have been selectively crystallized with the addition of the catalyst element have their crystal defects reduced by going through a melting and solidification process caused by the irradiation with the laser beam 609 and also re-crystallize using some of them as nuclei of crystal growth. As a result, the crystalline silicon regions 605a and 605b turn into crystalline silicon regions 605d and 605e with an even higher degree of crystallinity. Among other things, the crystalline silicon region 605e, in which the lateral crystal growth has occurred, has its degree of crystallinity further improved to be a crystalline silicon film with even better crystallinity.

Meanwhile, the amorphous silicon region 605c is crystallized by going through the melting and solidification process caused by the irradiation with the laser beam 609 to turn into a crystalline silicon region 605f. In this process step, the laser beam was radiated at an energy density of 250 mJ/cm$^2$ to 450 mJ/cm$^2$ (e.g., 350 mJ/cm$^2$). In this case, the energy density of the laser beam should not be too high to avoid resetting the degree of crystallinity of the crystalline silicon region 605b in the previous process step.

In this case, the crystallographic plane orientations of the crystalline silicon region 605e thus obtained have already been almost determined in the solid-phase crystallization process step using the catalyst element. Specifically, the majority of the crystalline silicon region 605e is comprised of a <111> zone. Among other things, (110) and (211) planes account for 50% or more of all crystal planes. And the crystalline silicon region 605e consists of crystal domains that run in one direction (i.e., domains with substantially the same plane orientation) and is far from forming crystal grains. On the other hand, the crystalline silicon region 605f that has been crystallized from the amorphous state by being irradiated with the laser beam has random crystallographic plane orientations, which include a lot of (100) planes and (111) planes, in particular. Those (100) and (111) planes do not fall into the <111> zone. And the crystalline silicon region 605f has an average crystal grain size of 100 nm to 300 nm.

Thereafter, excessive portions of the crystalline silicon regions 605e and 605f are removed, thereby electrically isolating two element regions from each other. In this process step, the crystalline silicon region 605e with a high degree of crystallinity that has grown laterally is patterned into an island of semiconductor region 610t to be the active region (including source/drain regions and a channel region) of a TFT and the crystalline silicon region 605f is patterned into an island of semiconductor region 610d to be the active region (including $n^+$ and $p^+$ regions and an intrinsic region) of a TFD as shown in FIG. 10(F).

After that, a TFT and a TFD are completed by the same method as what has already been described for the fifth preferred embodiment by using these islands of semiconductor regions as the respective active regions of the TFT and TFD. According to this preferred embodiment, a crystalline silicon film that has grown laterally to have an even higher degree of crystallinity can be used as a semiconductor layer to form part of a TFT, thus realizing a TFT with even higher current drivability. And the respective semiconductor layers of the TFT and TFD and the channel region of the TFT and the intrinsic region of the TFD can have their degrees of crystallinity optimized independently of each other. As a result, the device characteristics of the TFT and TFD can be optimized at the same time by using a single semiconductor layer obtained by crystallizing the same amorphous semiconductor film.

Embodiment 8

Hereinafter, a display device with a sensor function will be described as an eighth specific preferred embodiment of the present invention. Such a display device uses a substrate on which a TFT and a TFD have been fabricated by the method of any of the preferred embodiments of the present invention described above.

The display device with a sensor function according to this preferred embodiment may be a liquid crystal display device with a touchscreen sensor, and includes a display area and a frame area surrounding the display area. The display area includes a number of display sections (i.e., pixels) and a plurality of photosensor sections. Each display section includes a pixel electrode and a pixel switching TFT, while each photosensor section includes a TFD. In the frame area, a display driver is arranged to drive the respective display sections and uses driver TFTs. The pixel switching TFTs, the driver TFTs and the TFDs of the photosensor sections are integrated together on the same substrate by any of the methods already described for the first through seventh preferred embodiments of the present invention. It should be noted that among the TFTs for use in the display device of the present invention, at least the pixel switching TFTs need to be fabricated on the same substrate as the TFDs of the photosensor sections by the method described above. Thus, the driver, for example, may be arranged on another substrate.

In this preferred embodiment, each photosensor section is arranged adjacent to its associated display section (e.g., a pixel representing a primary color). Either one or multiple photosensor sections may be arranged with respect to one display section. Alternatively, a single photosensor section may be provided for a set of display sections. For example, one photosensor section may be provided for a set of color display pixels for the three primary colors (RGB). In this manner, the number (or the density) of photosensor sections with respect to that of display sections may be determined adaptively according to the resolution.

It is preferred that no color filters be provided on the photosensor section so as to face the viewer. This is because if a color filter were arranged on the photosensor section so as to face the viewer, the TFD in the photosensor section might have decreased sensitivity.

It should be noted that the display device of this preferred embodiment does not have to have such a configuration. Alternatively, the display device may also be designed such that a photosensor TFD, arranged in the frame area, functions as an ambient sensor for controlling the brightness on the monitor screen according to the illumination of external light. Still alternatively, if a color filter is arranged on the photosensor section so as to face the viewer (i.e., so that the incoming light is passed through the color filter and then received at the photosensor section), then the photosensor section can function as a color image sensor.

Hereinafter, an exemplary configuration for a display device according to this preferred embodiment will be described with reference to the accompanying drawings. In this preferred embodiment, the display device is implemented as a liquid crystal display device with a touchscreen sensor.

Figure 12:
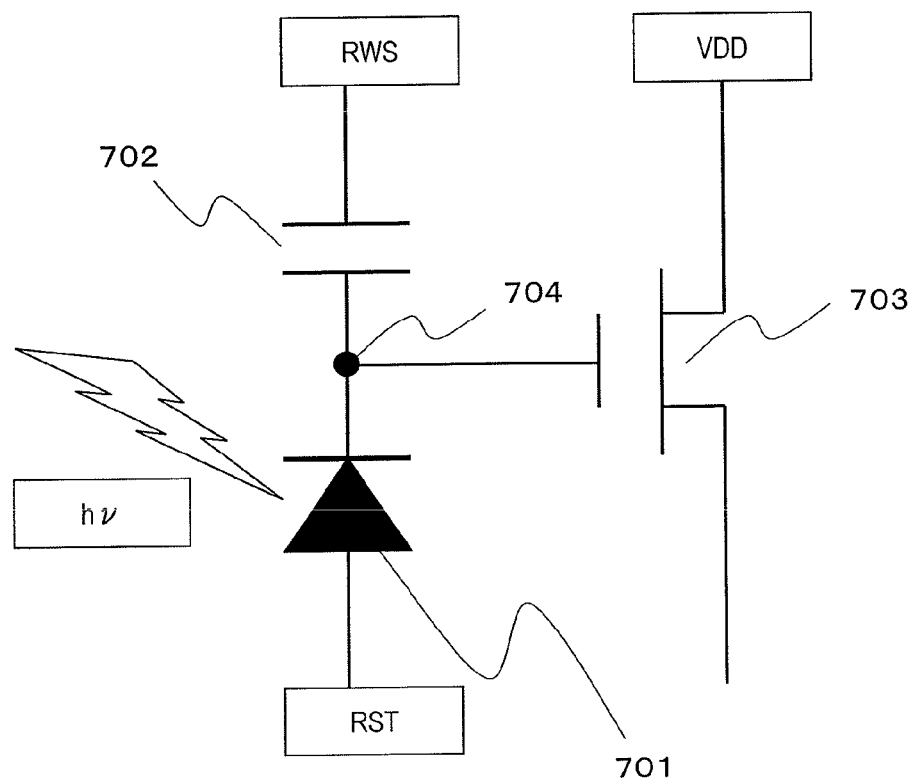
FIG. 12 is a circuit diagram of a photosensor TFD.

FIG. 12 is a circuit diagram illustrating an exemplary configuration for a photosensor section to be arranged in a display area. The photosensor section includes a photosensor thin-film diode 701, a signal storage capacitor 702, and a thin-film transistor 703 for retrieving the signal stored in the capacitor 702. When a potential at a node 704 decreases due to a leakage current produced by the incoming light after an RST potential has been written on the node 704 in response to an input RST signal, the gate potential of the thin-film transistor 703 varies to open or close the gate of the TFT. As a result, the signal VDD can be retrieved.

Figure 13:
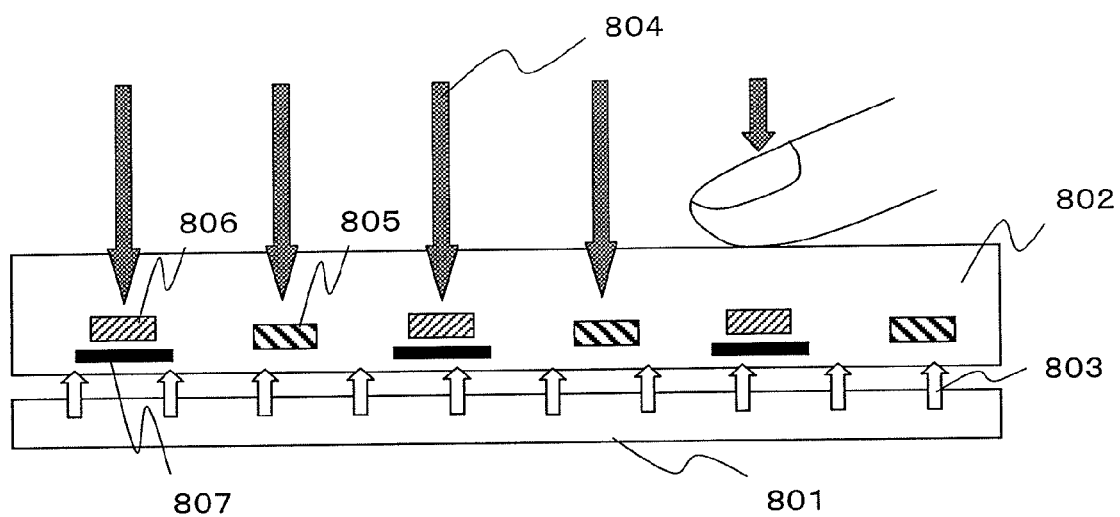
FIG. 13 illustrates a configuration for a touchscreen panel of a photosensing type.

FIG. 13 is a schematic cross-sectional view illustrating an exemplary active-matrix-addressed liquid crystal display device with a touchscreen panel. In this example, a photosensor section is provided for each pixel.

The liquid crystal display device shown in FIG. 13 includes a liquid crystal module 802 and a backlight 801 that is arranged behind the liquid crystal module 802. Although not shown in FIG. 13, the liquid crystal module 802 may include a light-transmitting rear substrate, a front substrate that is arranged so as to face the rear substrate, and a liquid crystal layer interposed between these two substrates. The liquid crystal module 802 has a number of display sections (i.e., pixels representing primary colors), each of which includes a pixel electrode (not shown) and a pixel switching thin-film transistor 805 that is connected to the pixel electrode. In addition, a photosensor section including a thin-film diode 806 is arranged adjacent to each display section. Although not shown in FIG. 13, color filters are arranged on respective display sections so as to face the viewer, but no color filters are arranged on photosensor sections so as to face the viewer. A shielding layer 807 is arranged between the thin-film diodes 806 and the backlight 801. Thus, the light coming from the backlight 801 is prevented by the shielding layer 807 from entering the thin-film diodes 806 but only the external light 804 is incident on the thin-film diodes 806. By getting the incidence of the external light 804 sensed by the thin-film diodes 806, a touchscreen panel of a photosensing type is realized.

It should be noted that the shielding layer 807 just needs to be arranged so as to prevent the light coming from the backlight 801 from entering at least the intrinsic region of the thin-film diodes 806. The shielding layer 807 of this preferred embodiment may be a heat sink layer obtained by crystallizing an amorphous semiconductor film with a laser beam during the manufacturing process.

Figure 14:
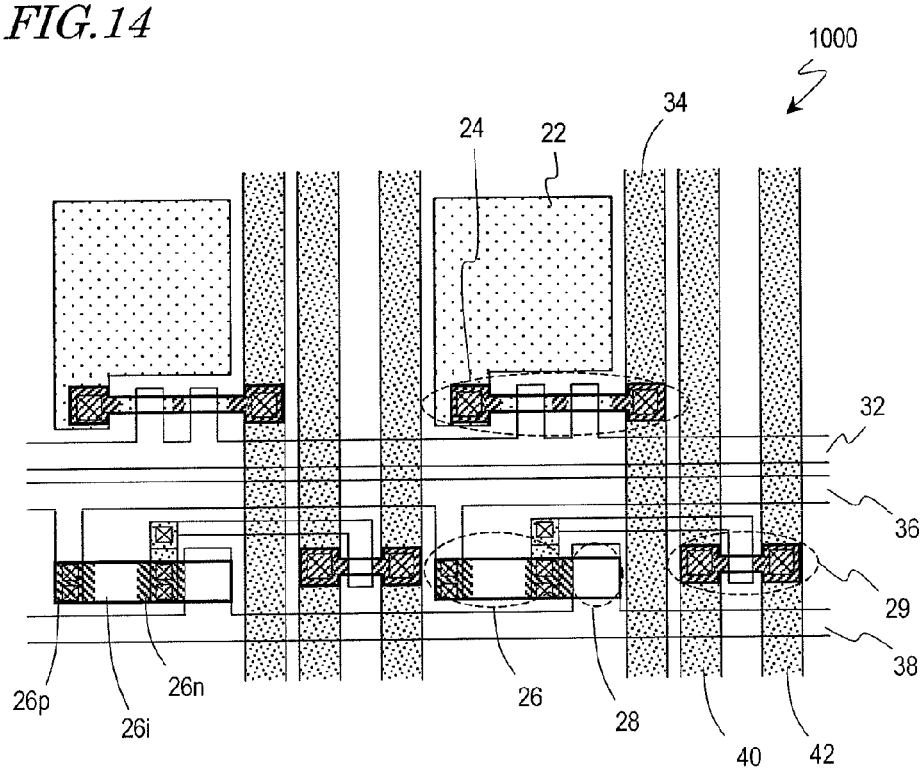
FIG. 14 is a schematic plan view illustrating the rear substrate of a liquid crystal display device with a touchscreen panel as an eighth preferred embodiment of the present invention.

FIG. 14 is a schematic plan view illustrating an example of a rear substrate for an active-matrix-addressed liquid crystal display device with a touchscreen panel. Although the liquid crystal display device of this preferred embodiment actually includes a lot of pixels (i.e., R, G and B pixels), only two of those pixels are illustrated in FIG. 14 for the sake of simplicity.

The rear substrate 1000 includes: a number of display sections (pixels), each of which includes a pixel electrode 22 and a pixel switching thin-film transistor 24; and photosensor sections, each of which is arranged adjacent to its associated display section and includes a photosensor photodiode 26, a signal storage capacitor 28 and a photosensor follower thin-film transistor 29.

The thin-film transistor 24 may have the same configuration as the TFT of the second preferred embodiment described above, i.e., a dual-gate LDD structure with two gate electrodes and LDD regions. The source and drain regions of the thin-film transistor 24 are connected to a pixel source bus line 34 and the pixel electrode 22, respectively. The thin-film transistor 24 is turned ON and OFF in response to a signal supplied through a pixel gate bus line 32. Using such a configuration, the pixel electrode 22 and a counter electrode on the front substrate, which is arranged so as to face the rear substrate 1000, apply a voltage to the liquid crystal layer and vary the alignment state of the liquid crystal layer, thereby getting a display operation done.

On the other hand, the photosensor photodiode 26 may have the same configuration as the TFD of the second preferred embodiment described above, and includes a $p^+$ region 26$p$, an $n^+$ region 26$n$, and an intrinsic region 26$i$ located between these two regions 26$p$ and 26$n$. The signal storage capacitor 28 includes a gate electrode layer and an Si layer as electrodes and produces capacitance in its gate insulating film. The $p^+$ region 26$p$ of the photosensor diode 26 is connected to a photosensor RST signal line 36, while the $n^+$ region 26$n$ thereof is connected to the lower electrode (i.e., Si layer) of the signal storage capacitor 28 and then to a photosensor RWS signal line 38 by way of this capacitor 28. The $n^+$ region 26$n$ is further connected to the gate electrode layer of the photosensor follower thin-film transistor 29. And the source and drain regions of the photosensor follower thin-film transistor 29 are connected to a photosensor VDD signal line 40 and a photosensor COL signal line 42, respectively.

As can be seen easily, the photosensor photodiode 26, the signal storage capacitor 28 and the photosensor follower thin-film transistor 29 respectively correspond to the thin-film diode 701, the capacitor 702 and the thin-film transistor 703 of the driver shown in FIG. 12, thus forming a photosensor driver. Hereinafter, it will be described how this driver operates during photosensing.

(1) First of all, an RWS signal is written on the signal storage capacitor 28 through the RWS signal line 38. As a result, a positive electric field is generated in the $n^+$ region 26$n$ of the photosensor photodiode 26 and a reverse bias is applied to the photosensor photodiode 26. (2) In the photosensor photodiode 26 located in a surface region of the substrate that is irradiated with the light, leakage current is produced in response to the incoming light and the electrical charge goes toward the RST signal line 36. (3) As a result, the potential at the $n^+$ region 26$n$ decreases and that variation in potential varies the gate voltage applied to the photosensor follower thin-film transistor 29. (4) A VDD signal is supplied through the VDD signal line 40 to the source of the photosensor follower thin-film transistor 29. If the gate voltage varies as described above, then the amount of current flowing toward the COL signal line 42 that is connected to the drain changes, and therefore, that electrical signal can be output through the COL signal line 42. (5) The RST signal is written on the photosensor photodiode 26 through the COL signal line 42, thereby resetting the potential at the signal storage capacitor 28. By repeatedly performing these operations (1) through (5) a number of times while scanning the surface, photosensing can get done.

In the liquid crystal display device with the touchscreen panel according to this preferred embodiment, the rear substrate does not have to have the configuration shown in FIG. 14. For example, a storage capacitor CS may be provided for each pixel switching TFT. Also, although a photosensor section is arranged adjacent to each of the R, G and B pixels in the example described above, a single photosensor section may also be provided for each set of three color display pixels (i.e., R, G and B pixels) as described above.

Now take a look at FIG. 13 again. In the example described above, the thin-film diodes 806 are arranged inside of the display area and used as touchscreen sensors as can be seen from the cross-sectional view of FIG. 13. However, the thin-film diodes 806 may also be arranged outside of the display area and may be used as ambient sensors for controlling the luminance of the backlight 801 according to the illumination of the external light 804.

Figure 15:
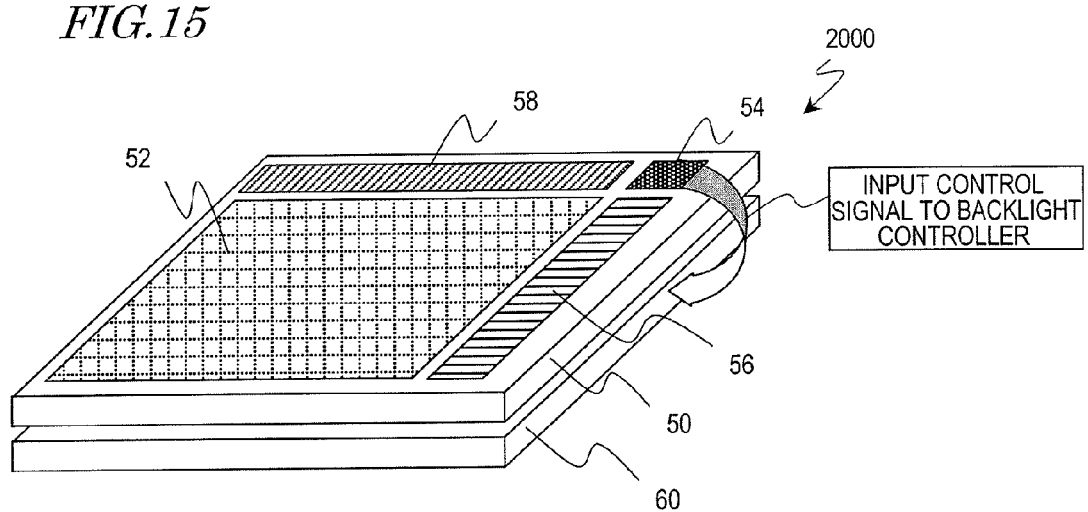
FIG. 15 is a perspective view illustrating a liquid crystal display device with an ambient light sensor according to the eighth preferred embodiment of the present invention.

FIG. 15 is a perspective view illustrating a liquid crystal display device with an ambient light sensor. The liquid crystal display device 2000 includes an LCD substrate 50 with a display area 52, a gate driver 56, a source driver 58, and a photosensor section 54, and a backlight 60 that is arranged behind the LCD substrate 50. A peripheral region of the LCD substrate 50 that surrounds the display area 52 and that includes the drivers 56 and 58 and the photosensor section 54 will be referred to herein as a "frame area".

The luminance of the backlight 60 is controlled by a backlight controller (not shown). Also, although not shown in FIG. 15, TFTs are used in the display area 52 and the drivers 56 and 58, while TFDs are used in the photosensor section 54. The photosensor section 54 generates an illumination signal representing the illumination of the external light and supplies it to the backlight controller using a flexible substrate connection. In response to this illumination signal, the backlight controller generates a backlight control signal and outputs it to the backlight 60.

Optionally, by applying the present invention, an organic EL display device with an ambient light sensor can also be fabricated. Such an organic EL display device may have a configuration in which the display sections and photosensor section are arranged on the same substrate just like the liquid crystal display device shown in FIG. 15. However, there is no need to provide any backlight 60 behind the substrate. In that case, the photosensor section 54 is connected to the source driver 58 by way of an interconnect on the substrate 50 so that the illumination signal is supplied from the photosensor section 54 to the source driver 58. In response to the illumination signal, the source driver 58 adjusts the luminance of the display area 52.

Although the present invention has been described by way of illustrative preferred embodiments, the present invention is in no way limited to those specific preferred embodiments but various modifications can be readily made within the spirit and scope of the present invention. For instance, both a circuit that performs an analog drive operation and a circuit that performs a digital drive operation can be formed at the same time on a glass substrate by using the TFTs of the present invention. Such a circuit that performs an analog drive operation includes a source driver, a pixel section and a gate driver. The source driver includes a shift register, a buffer and a sampling circuit (transfer gate), while the gate driver includes a shift register, a level shifter and a buffer. Also, if necessary, a level shifter may be arranged between the sampling circuit and the shift register. Furthermore, according to the manufacturing process of the present invention, a memory or a microprocessor could also be fabricated.

According to the present invention, a semiconductor device, which has a crystalline semiconductor film that can optimize the degrees of crystallinity for a TFT and a TFD (which are semiconductor elements to be fabricated on the same substrate) and which includes a TFT and a TFD with good characteristics, can be provided. As a result, as TFTs for use in a driver and TFTs for switching pixel electrodes, TFTs with high field effect mobility and high ON/OFF ratios and TFDs that have high sensitivity to external light and a high SNR with respect to light (i.e., the ratio of values of currents flowing in bright and dark states) when used as photosensors can be fabricated by the same manufacturing process using a semiconductor layer, obtained by crystallizing the same amorphous semiconductor film, as their respective active regions. Among other things, in that semiconductor layer, by optimizing the degrees of crystallinity in the channel region that will have a significant impact on the field effect mobility of the TFTs and in the intrinsic region that will have a decisive influence on the photosensitivity of the TFDs, best device characteristics can be achieved for the respective semiconductor elements. On top of that, such high-performance semiconductor elements are obtained by a simple manufacturing process and the size and cost of the products can be reduced with their performance enhanced.

INDUSTRIAL APPLICABILITY

The present invention can find a very broad range of applications and is applicable to any type of semiconductor device including a TFT and a TFD and any electronic device in every field of technology including such a semiconductor device. For instance, a CMOS circuit and a pixel section fabricated by carrying out the present invention can be used in an active-matrix-addressed liquid crystal display device and an organic EL display device. And such a display device could be used as the monitor screen of a cellphone, a portable game console or a digital camera. Consequently, the present invention is applicable to every electronic device with an LCD or an organic EL display.

Among other things, the present invention can be used particularly effectively in an active-matrix-addressed liquid crystal display device, an organic EL display device, an image sensor, a photosensor or an electronic device including any of these devices in combination. It will be particularly advantageous to apply the present invention to a display device that realizes a photosensor function by using TFDs or an electronic device including such a display device. Alternatively, the present invention is also applicable to an image sensor with a photosensor that uses TFDs and a driver that used TFTs.

The invention claimed is:

1. A display device comprising:
a display area with a number of display sections; and
a frame area surrounding the display area,
wherein the display device further includes at least one photosensor section with a thin-film diode, and
wherein each said display section includes an electrode and a thin-film transistor connected to the electrode, and
wherein the thin-film transistor and the thin-film diode are arranged on the same light-transmitting substrate, and
wherein the thin-film transistor includes: a semiconductor layer with a channel region, a source region and a drain region; a gate electrode that controls the conductivity of the channel region; and a gate insulating film arranged between the semiconductor layer and the gate electrode, and
wherein the thin-film diode includes a semiconductor layer with an n-type region, a p-type region and an intrinsic region interposed between the n- and p-type regions, and
wherein the respective semiconductor layers of the thin-film transistor and the thin-film diode are portions of a single crystalline semiconductor layer that has been crystallized or re-crystallized by irradiating the same amorphous semiconductor film with a laser beam, and
wherein the channel region of the semiconductor layer of the thin-film transistor and the intrinsic region of the semiconductor layer of the thin-film diode have been crystallized to mutually different degrees, and
wherein the channel region of the semiconductor layer of the thin-film transistor has a greater average surface roughness Ra than the intrinsic region of the semiconductor layer of the thin-film diode, and
wherein the thin-film diode further includes a heat sink layer that is located between the semiconductor layer of the thin-film diode and the substrate, made of an opaque material, and arranged so as to overlap with at least the intrinsic region of the semiconductor layer of the thin-film diode when viewed from under the back surface of the substrate.

2. The display device of claim 1, further comprising a backlight.

3. The display device of claim 2, wherein the at least one photosensor section includes a number of photosensor sections, each of which is arranged in the display area with respect to either its associated display section or its associated set of at least two of the display sections.

4. The display device of claim 2, wherein the backlight includes a backlight controller that adjusts the intensity of the light emitted from the backlight, and
wherein the photosensor section is arranged in the frame area and generates an illumination signal representing the illumination of external light and outputs the signal to the backlight controller.

* * * * *